United States Patent
Kaeriyama et al.

(10) Patent No.: US 7,893,711 B2
(45) Date of Patent: Feb. 22, 2011

(54) PROGRAM CIRCUIT, SEMICONDUCTOR INTEGRATED CIRCUIT, VOLTAGE APPLICATION METHOD, CURRENT APPLICATION METHOD, AND COMPARISON METHOD

(75) Inventors: Shunichi Kaeriyama, Minato-ku (JP); Masayuki Mizuno, Minato-ku (JP)

(73) Assignee: NEC Corporation, Tokyo (JP)

(*) Notice: Subject to any disclaimer, the term of this patent is extended or adjusted under 35 U.S.C. 154(b) by 323 days.

(21) Appl. No.: 12/095,267

(22) PCT Filed: Oct. 24, 2006

(86) PCT No.: PCT/JP2006/321105

§ 371 (c)(1),
(2), (4) Date: May 28, 2008

(87) PCT Pub. No.: WO2007/063655

PCT Pub. Date: Jun. 7, 2007

(65) Prior Publication Data

US 2010/0134140 A1    Jun. 3, 2010

(30) Foreign Application Priority Data

Nov. 29, 2005 (JP) .............................. 2005-344458

(51) Int. Cl.
    *H03K 19/173* (2006.01)
    *G06F 7/38* (2006.01)
(52) U.S. Cl. ............................ 326/38; 326/41; 257/211
(58) Field of Classification Search .............. 326/38, 326/40, 41, 47; 257/4, 211
See application file for complete search history.

(56) References Cited

U.S. PATENT DOCUMENTS

| 7,425,720 B2 * | 9/2008 | Kaeriyama et al. ............. 257/4 |
| 2005/0045919 A1 * | 3/2005 | Kaeriyama et al. .......... 257/211 |

FOREIGN PATENT DOCUMENTS

| JP | 6-28841 A | 2/1994 |
| JP | 9-260514 A | 10/1997 |
| JP | 10-228786 A | 8/1998 |
| JP | 2005-101535 A | 4/2005 |
| WO | 03/028124 A1 | 4/2003 |
| WO | WO 2007063655 A1 * | 6/2007 |

OTHER PUBLICATIONS

Kaeriyama, et al., "A Nonvolatile Programmable Solid-Electrolyte Nanometer Switch", IEEE Journal of Solid-State Circuits, Jan. 2005, vol. 40, No. 1, pp. 168-176, Fig. 17.

* cited by examiner

*Primary Examiner*—Daniel D Chang
(74) *Attorney, Agent, or Firm*—Sughrue Mion, PLLC

(57) ABSTRACT

In a program circuit that can reduce exhaustion of a switching element that uses oxidation-reduction reactions of an electrolyte material, a voltage source (106) applies voltage to a switching element (100), a measurement circuit (107) measures a parameter that changes in accordance with the resistance value of the switching element (100), and a control circuit (104) causes the voltage source (106) to apply voltage to the switching element (100) while progressively increasing the voltage. The control circuit (104) further causes the voltage source (106) to halt the application of voltage when the parameter measured by the measurement circuit (107) reaches a prescribed value.

34 Claims, 25 Drawing Sheets

PROGRAM CIRCUIT, SEMICONDUCTOR INTEGRATED CIRCUIT, VOLTAGE APPLICATION METHOD, CURRENT APPLICATION METHOD, AND COMPARISON METHOD

TECHNICAL FIELD

The present invention relates to a program circuit for programming a switch element, a semiconductor integrated circuit, a voltage application method, a current application method, and a comparison method.

BACKGROUND ART

In a semiconductor integrated circuit, elements (for example, transistors) that make up logic circuits and arithmetic circuits and the interconnects for connecting these elements are formed on a semiconductor substrate.

In a programmable semiconductor integrated circuit such as an FPGA (Field Programmable Gate Array), the wiring or the logic can be altered after having assembled the semiconductor integrated circuit. In a programmable semiconductor integrated circuit, the operation information and connection information of logic circuits and arithmetic circuits are stored in memory elements, and the wiring or logic is altered based on the stored operation information and connection information. Elements such as SRAM cells and floating-gate MOS transistors are known as this type of memory element. Fuses or anti-fuses are also known as switching elements for altering wiring connections. However, fuses or anti-fuses are not capable of multiple alterations of wiring.

Patent Document 1 (JP-A-2005-101535) discloses a semiconductor integrated circuit having electrolytic switching elements that are capable of multiple alterations of wiring by using oxidation-reduction reactions of the electrolyte. In this electrolytic switching element, a first electrode is formed of a metal that is difficult to ionize, such as platinum, and a second electrode is formed of a metal that is easy to ionize, such as copper. In addition, a solid electrolyte such as copper oxide is interposed between the electrodes.

When voltage is applied to the first electrode that is lower than voltage applied to the second electrode, electrons from the second electrode are supplied to the electrolyte, and a metal dendrite (metal precipitate) is deposited on the first electrode.

When the application of voltage is then continued, the metal dendrite deposited at the first electrode gradually becomes larger and contacts the second electrode. In other words, the first electrode and the second electrode are connected by way of a metal dendrite. In this way, an electrical connection is established between the first electrode and the second electrode.

When voltage is applied to the first electrode that is greater than the voltage to the second electrode when the first electrode and second electrode are in a connected state, electrons are released from the metal dendrite that connected the first electrode and second electrode and the metal dendrite becomes smaller. When the application of voltage is then continued, the first electrode and second electrode are disconnected. The first electrode and second electrode are thus isolated.

In this electrolytic switching element, the conductive state and isolated state can be altered a plurality of times by altering the direction of the voltage applied across the electrodes.

Patent Document 1: JP-A-2005-101535

DISCLOSURE OF THE INVENTION

Problem to be Solved by the Invention

The electrolytic switching element belonging to the semiconductor integrated circuit of Patent Document 1 is gradually exhausted when voltage is applied across the electrodes. To program (connect or disconnect) an electrolytic switching element that has been exhausted, the voltage applied across the electrodes must be increased or the time interval of application of voltage that is applied across the electrodes must be lengthened.

However, when the voltage applied across the electrodes is increased or the time interval of application of the voltage that is applied across the electrodes is lengthened, the electrolytic switching element is rapidly exhausted. When the electrolytic switching element is exhausted, the number of times that the electrolytic switching element can be programmed decreases.

On the other hand, if the voltage applied to the electrolytic switching element is excessive, the electrolytic switching element will be quickly destroyed.

It is an object of the present invention to provide a program circuit that can reduce exhaustion of a switching element that uses the oxidation-reduction reaction of an electrolyte, a semiconductor integrated circuit, a voltage application method, a current application method, and a comparison method.

Means for Solving the Problem

To achieve the above-described object, the program circuit of the present invention is a program circuit for applying voltage to a switching element formed of a first electrode and a second electrode formed of metals having mutually different ionization tendencies and an electrolyte interposed between the first electrode and the second electrode to thereby control a resistance value of the switching element; the program circuit including: a power-supply unit for applying voltage across the first electrode and the second electrode; a measurement unit for measuring a parameter that changes in accordance with the resistance value of the switching element; and a control unit for causing increase of the voltage applied by the power-supply unit across the first electrode and second electrode until the parameter measured by the measurement unit reaches a prescribed value and halting the application of voltage by the power-supply unit when the parameter reaches the prescribed value.

The voltage application method of the present invention is a voltage application method carried out by a program circuit for applying voltage to a switching element formed of a first electrode and a second electrode formed of metals having different ionization tendencies and an electrolyte interposed between the first electrode and the second electrode to thereby control a resistance value of the switching element; the voltage application method comprising: an application step of applying voltage across the first eledtrode and second electrode; an increase measurement step of measuring a parameter that changes in accordance with the resistance value of the switching element; an increase step of increasing the voltage that is applied across the first electrode and the second electrode until the measured parameter reaches a prescribed value; and an increase halt step of halting the application of voltage when the parameter reaches the prescribed value.

According to the above-described invention, voltage is applied across the first electrode and second electrode of a switching element while increasing the voltage. When the parameter reaches a prescribed value, the application of voltage is halted.

Accordingly, in a switching element that is not exhausted, the resistance of the switching element can be controlled by a low voltage. In a switching element that is exhausted, however, the resistance of the switching element can be controlled by a high voltage.

As a result, the application of voltage to a switching element that is greater than the voltage necessary for controlling the resistance of the switching element can be limited, and exhaustion of the switching element can therefore be mitigated.

In addition, the program circuit of the present invention is a program circuit for applying voltage to a switching element formed of a first electrode and second electrode formed of metals having mutually different ionization tendencies and an electrolyte interposed between the first electrode and second electrode to thereby control a resistance value of the switching element, the program circuit including: a power-supply unit for applying voltage across the first electrode and the second electrode; a measurement unit for measuring a parameter that changes in accordance with the resistance value of the switching element; and a control unit for causing the power-supply unit to intermittently apply voltage across the first electrode and second electrode until the parameter measured by the measurement unit reaches a prescribed value and for halting the application of voltage by the power-supply unit when the parameter reaches the prescribed value.

The voltage application method of the present invention is a voltage application method carried out by a program circuit for applying voltage to a switching element formed of a first electrode and a second electrode formed of metals having mutually different ionization tendencies and an electrolyte interposed between the first electrode and second electrode to thereby control a resistance value of the switching element; the voltage application method including: a voltage application step of applying voltage across the first electrode and second electrode; an intermittent measurement step of measuring a parameter that changes in accordance with the resistance value of the switching element; an intermittent step of intermittently applying voltage across the first electrode and second electrode until the measured parameter reaches a prescribed value; and a halt step of halting the application of voltage when the parameter reaches the prescribed value.

When voltage is applied to the switching element, the switching element generates heat due to Joule heat. When the switching element generates heat, the switching element becomes exhausted.

According to the invention as described above, voltage is intermittently applied across a first electrode and second electrode of a switching element. As a result, the generation of heat of the switching element resulting from Joule heat can be reduced, whereby the exhaustion of the switching element can be mitigated.

The voltage across the first electrode and second electrode is preferably applied intermittently while being increased.

According to the above-described invention, the application of voltage to a switching element that is greater than the voltage necessary for controlling the resistance of the switching element can be reduced, and moreover, the generated heat of the switching element resulting from Joule heat can be reduced. As a result, the exhaustion of the switching element can be mitigated. The metal for forming the first electrode preferably has a lower ionization tendency than the metal for forming the second electrode, the prescribed value is preferably a value indicating that the switching element has entered a prescribed conductive state, and a voltage whereby the potential of the first electrode is lower than the potential of the second electrode is preferably applied across the first electrode and second electrode.

According to the above-described invention, the switching element can be placed in a prescribed conductive state.

In addition, a reference time is preferably stored, the prescribed value is preferably a value indicating that the switching element is in the isolated state, a voltage whereby the potential of the first electrode is higher than the potential of the second electrode is preferably applied across the first electrode and second electrode, and the application of the voltage is preferably halted after the passage of a reference time that has been stored in the reference time memory unit after the parameter reaches the prescribed value.

A switching element immediately following isolation can be placed in the conductive state when the metal dendrite deposited between the electrodes is even slightly reduced.

According to the above-described invention, the application of voltage is halted upon the passage of the reference time after the switching element has been isolated. As a result, the metal dendrite can be reduced to the degree that the switching element does not enter the conductive state despite a slight reduction of the metal dendrite deposited between the first electrode and second electrode.

Further, the switching element preferably includes a third electrode formed from a metal having a higher ionization tendency than the metal for forming the first electrode; the metal for forming the first electrode preferably has a lower ionization tendency than the metal for forming the second electrode; the prescribed value preferably includes a first prescribed value indicating that the switching element has entered a first conductive state and a second prescribed value indicating that the switching element has entered a second conductive state in which the resistance is lower than the first conductive state; a voltage by which the potential of the first electrode is lower than the potential of the second electrode is preferably applied across the first electrode and the second electrode; the voltage applied across the first electrode and the second electrode is preferably lowered when the parameter reaches the first prescribed value, and moreover, a voltage by which the potential of the third electrode is higher than the potential of the first electrode and the second electrode is preferably applied across the third electrode and the first electrode or second electrode, following which the application of the voltage is halted when the parameter reaches the second prescribed value.

When voltage is applied across the first electrode and second electrode after the first electrode and second electrode have been placed in electrical contact, a large current flows to the switching element. The switching element is exhausted when a large current flows to the switching element.

To prevent flow of a large current to the switching element, the voltage applied across the first electrode and second electrode must be lowered. However, decreasing the voltage applied across the first electrode and second electrode raises the possibility that the metal dendrite that connects the first electrode and second electrode will not grow.

According to the above-described invention, when the switching element enters the first conductive state, the voltage applied across the first electrode and second electrode is lowered, and a voltage whereby the potential of the third electrode is higher than the potential of the first electrode and second electrode is applied across the third electrode and first electrode or second electrode.

As a result, the current that flows between the first electrode and second electrode is decreased, and the metal dendrite that connects the first electrode and second electrode can be made large, whereby the switching element can be placed in a prescribed conductive state while reducing exhaustion of the switching element.

In addition, the switching element preferably includes a third electrode formed of a metal having a higher ionization tendency than the metal for forming the first electrode; the metal for forming the first electrode preferably has a lower ionization tendency than the metal for forming the second electrode; the prescribed value is preferably a value indicating that the switching element has entered the isolated state; and a voltage such that the potential of the third electrode is lower than the potential of the first electrode and the second electrode is preferably applied across the third electrode and the first electrode or the second electrode, following which the application of the voltage is preferably halted upon passage of a reference time that is stored in the reference time memory unit after the parameter has reached the prescribed value.

According the invention as described above, voltage is applied across the third electrode and first electrode or second electrode to cause isolation of the switching element. As a result, the current that flows in the switching element can be decreased, and the exhaustion of the switching element can therefore be mitigated.

The current value of the current that flows in the switching element is preferably limited to no greater than a prescribed current value.

According to the invention as described above, the flow of a large current to the switching element can be reduced, and as a result, the exhaustion of the switching element can be mitigated.

In addition, the application of voltage is preferably halted upon the passage of a completion time that is stored in the completion memory unit from the start of the application of voltage.

If a switching element does not attain a prescribed state despite the passage of a long time interval from the start of application of voltage to the switching element, the possibility arises that the switching element is damaged.

According to the invention described above, the application of voltage is halted if the resistance value of the switching element does not attain the prescribed value despite the passage of the completion time. As a result, the trouble required for checking whether the switching element is damaged or not can be reduced.

The program circuit of the present invention is a program circuit for causing current to flow to a switching element formed from a first electrode and second electrode formed from metals having different ionization tendencies and an electrolyte interposed between the first electrode and the second electrode to thereby control a resistance value of the switching element; the program circuit including: a power-supply unit for supplying current across the first electrode and the second electrode; a measurement unit for measuring a parameter that changes in accordance with the resistance value of the switching element; and a control unit for progressively increasing the current that the power-supply unit supplies across the first electrode and the second electrode until the parameter measured by the measurement unit reaches a prescribed value, and halting the current from the power-supply unit when the parameter reaches a prescribed value.

The current application method of the present invention is a current application method carried out by a program circuit that applies a current to a switching element formed from a first electrode and a second electrode formed of metals having different ionization tendencies and an electrolyte interposed between the first electrode and the second electrode to thereby control a resistance value of a switching element; the current application method including: a current application step of applying a current across the first electrode and the second electrode; a parameter measurement step of measuring a parameter that changes in accordance with the resistance of the switching element; a current increase step of progressively increasing the current applied across the first electrode and the second electrode until the measured parameter reaches a prescribed value; and a current halt step of halting application of current when the parameter reaches a prescribed value.

When the resistance of the switching element is controlled by the application of voltage, the potential exists that an extremely high current will be supplied (for example, a current large enough to damage the switching element).

According to the invention as described above, current is applied across the first electrode and second electrode of the switching element while increasing the current. When the parameter reaches a prescribed value, the application of the current is halted.

As a result, the possibility of supplying an extremely high current to the switching element can be reduced. In addition, the resistance of the switching element can be controlled by a low current in a switching element that is not exhausted, but in a switching element that is exhausted, the resistance of the switching element can be controlled by a high current. As a result, the exhaustion of the switching element can be mitigated.

In addition, the program circuit of the present invention is a program circuit for applying current to a switching element formed of a first electrode and second electrode formed of metals having different ionization tendencies and an electrolyte interposed between the first electrode and second electrode to thereby control a resistance value of the switching element; the program circuit including: a power-supply unit for applying current across the first electrode and second electrode; a measurement unit for measuring a parameter that changes in accordance with the resistance value of the switching element; and a control unit for causing the power-supply unit to intermittently apply a current across the first electrode and second electrode until the parameter measured by the measurement unit reaches a prescribed value and halting the current from the power-supply unit when the parameter reaches a prescribed value.

Still further, the current application method of the present invention is a current application method carried out by a program circuit for applying a current to a switching element formed of a first electrode and second electrode formed of metals having different ionization tendencies and an electrolyte interposed between the first electrode and second electrode to thereby control a resistance value of the switching element; the current application method including: a current supply step of applying a current across the first electrode and second electrode; an intermittent parameter measurement step of measuring a parameter that changes in accordance with the resistance value of the switching element; a current intermittent step of intermittently applying a current across the first electrode and second electrode until the parameter measured by the measurement unit reaches a prescribed value; and a intermittent current halting step for halting the application of current when the parameter reaches a prescribed value.

According to the invention as described above, a current is intermittently applied across the first electrode and second electrode of a switching element whereby the possibility of supplying an extremely large current to the switching element can be reduced, and moreover, the generation of heat of the switching element due to Joule heat can be reduced. Accordingly, exhaustion of the switching element can be mitigated.

Still further, regarding the semiconductor integrated circuit of the present invention, in a semiconductor integrated circuit that includes: a plurality of first interconnects; a plurality of second interconnects that intersect with each of the first interconnects; switching elements each arranged at the intersection of each first interconnect and each second interconnect formed of a first electrode connected to the first interconnect and a second electrode formed of a metal having a different ionization tendency than the metal for forming the first interconnect and connected to the second interconnect and an electrolyte interposed between the first electrode and the second electrode; and a program circuit for controlling a resistance value of the switching elements; the program circuit including: a power-supply unit for applying voltage to each first interconnect and each second interconnect; and a measurement unit for comparing the voltage applied to a switching element with a reference voltage that is to be applied to the switching element when the switching element has reached a prescribed state to supply a determination signal indicating whether the voltage is equal to or greater than the reference voltage.

The comparison method of the present invention is a comparison method carried out by a semiconductor integrated circuit that includes: a plurality of first interconnects; a plurality of second interconnects that intersect with each first interconnect; switching elements each arranged at the intersection of each first interconnect and each second interconnect and formed of a first electrode connected to the first interconnect, a second electrode connected to the second interconnect and formed of a metal having a different ionization tendency than the metal for forming the first interconnect, and an electrolyte interposed between the first electrode and the second electrode; and a program circuit for controlling the resistance value of the switching elements; the comparison method including: a voltage application step of applying a voltage to each first interconnect and each second interconnect; a comparison step of comparing the voltage applied to the switching elements and a reference voltage that is to be applied to the switching elements when the switching element has reached a prescribed state; and an output step of supplying a determination signal indicating whether the voltage is equal to or greater than the reference voltage. Conventionally, a method is not known for measuring a parameter that changes in accordance with the resistance value of a switching element in a semiconductor integrated circuit in which a switching element is arranged at the intersection of each of a plurality of intersecting first interconnects and second interconnects.

As a result, the possibility exists that, for example, voltage will be applied to a switching element even after the resistance of the switching element has reached a prescribed value, or voltage will be applied to a switching element for a time interval longer than the time interval required for controlling the resistance value of a switching element. When voltage is applied to a switching element for a long time interval, the switching element is exhausted.

According to the invention as described above, a switching element is arranged at each intersection of each of a plurality of intersecting first interconnects and second interconnects. In addition, the voltage applied to a switching element is compared with a reference voltage, and a determination signal is supplied as output that indicates whether the voltage applied to a switching element is greater than a reference voltage.

It can thus be determined based on the determination signal whether a switching element arranged at an intersection has attained a prescribed state.

As a result, the application of voltage to a switching element for a time interval longer than the time interval required for controlling the resistance value of the switching element can be reduced, whereby the exhaustion of the switching element can be mitigated.

In addition, voltage is preferably applied while progressively increasing the voltage to a first interconnect and a second interconnect connected to a switching element for which a resistance value is to be controlled until the supplied determination signal indicates that the switching element has reached the prescribed state, and the application of voltage is preferably halted when the switching element has attained a prescribed state.

According to the invention as described above, voltage is applied while increasing the voltage to a first interconnect and second interconnect connected to a switching element for which a resistance value is to be controlled. The application of voltage is halted when the switching element has attained a prescribed state. As a result, the exhaustion of a switching element for which a resistance value is to be controlled can be mitigated.

In addition, voltage is preferably intermittently applied to a first interconnect and second interconnect connected to a switching element for which a resistance value is to be controlled until the determination signal indicates that the switching element has attained a prescribed state, and the application of voltage is then preferably halted when the switching element has attained a prescribed state.

According to the invention as described above, voltage is intermittently applied to a first interconnect and second interconnect connected to a switching element for which the resistance value is to be controlled. As a result, exhaustion caused by Joule heat of a switching element for which resistance is to be controlled can be mitigated.

In addition, each first interconnect preferably includes a first electrode interconnect and a second electrode interconnect connected to the program circuit; each second interconnect preferably includes a third electrode interconnect and fourth electrode interconnect connected to the program circuit; an interconnect-separation switching element formed of a third electrode connected to the first electrode interconnect, a fourth electrode connected to the second electrode interconnect and formed of a metal having a different ionization tendency than the metal that forms the third electrode, and an electrolyte interposed between the third electrode and the fourth electrode; and an interconnect-separation switching element formed of a fifth electrode connected to the third electrode interconnect, a sixth electrode connected to the fourth electrode interconnect and formed of a metal having a different ionization tendency than the metal that forms the fifth electrode, and an electrolyte interposed between the fifth electrode and the sixth electrode are preferably included; voltage is preferably intermittently applied to the interconnect-separation switching element, the voltage applied to the interconnect-separation switching element is preferably compared with a reference voltage that is to be applied to an interconnect-separation switching element of a prescribed state, and a determination signal indicating whether the voltage is equal to or greater than the reference voltage is preferably supplied as output.

According to the invention as described hereinabove, each first interconnect and each second interconnect is either connected or disconnected at an interconnect-separation switching element. In addition, a determination signal is supplied as output that indicates whether the voltage applied to an interconnect-separation switching element is greater than the reference voltage. As a result, if the voltage applied to an interconnect-separation switching element is controlled in accordance with the determination signal, the exhaustion of a switching element that connects or disconnects the first interconnect or the second interconnect can be mitigated.

In addition, voltage is preferably applied to an interconnect-separation switching element for which a resistance value is to be controlled while increasing the voltage until the determination signal that is supplied as output indicates that the interconnect-separation switching element has attained a prescribed state, and the application of voltage is preferably halted when the interconnect-separation switching element attains a prescribed state.

The invention as described above can mitigate the exhaustion of an interconnect-separation switching element for which a resistance value is to be controlled.

In addition, voltage is preferably intermittently applied to an interconnect-separation switching element for which a resistance value is to be controlled until the determination signal that is supplied as output indicates that the interconnect-separation switching element has attained a prescribed state, and the application of voltage is preferably halted when the interconnect-separation switching element has attained the prescribed state.

The above-described invention can mitigate the exhaustion caused by Joule heat of an interconnect-separation switching element for which the resistance value is to be controlled.

EFFECT OF THE INVENTION

The present invention can mitigate the exhaustion of a switching element that uses the oxidation-reduction reaction of an electrolyte.

EXPLANATION OF REFERENCE NUMBERS

Figure 1A:
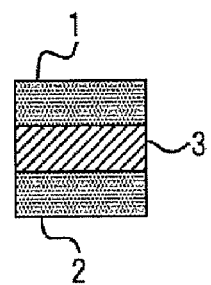
FIG. 1A is a sectional view showing a two-terminal switching element in an isolated state.

1 electrode
2 electrode
3 electrolyte
4 metal dendrite
5 metal dendrite
100 switching element
101 program circuit
102 drive circuit
103 internal resistance
104 control circuit
105 memory circuit
106 voltage source
107 measurement circuit
108 current-limiting circuit
110 voltage measurement circuit
111 current measurement circuit
203 comparator
204 resistance element
211 current-mirror circuit
214 current source
215 transistor
1001 electrode
1002 electrode
1003 gate electrode
1004 electrolyte
1100 three-terminal switching element
1101 first voltage source
1102 second voltage source
1900 control circuit
1901 interconnect group
1902 interconnect group
1903 drive circuit
1904 drive circuit
1905 cross-bus switch
1906 segment-separation switch
1951 CLB
2201 interconnect group
2202 interconnect group
2203 drive circuit
2204 drive circuit
2205 cross-bus switch
2206 segment-separation switch
2301 drive circuit
2302 switching element
2401 drive circuit
2402 drive circuit
2403 switching element
2404 power-supply terminal
2501 drive circuit
2502 drive circuit
2503 switching element
2504 power-supply terminal
2601 interconnect
2602 interconnect
2603 cross-bus switch
2604 switching element
2605 switching element
2606 drive circuit
2607 drive circuit

BEST MODE FOR CARRYING OUT THE INVENTION

Explanation next regards embodiments of the present invention with reference to the accompanying figures.

Explanation first regards a switching element that uses the oxidation-reduction reaction of an electrolyte. Switching elements include two-terminal switching elements that have two electrodes and three-terminal switching elements that have three terminals. In the following explanation, explanation will first relate to a two-terminal switching element, following which explanation will relate to a three-terminal switching element.

Figure 1B:
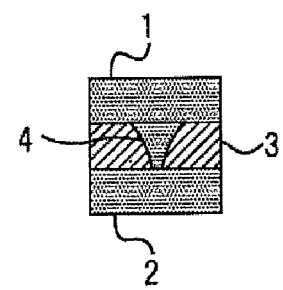
FIG. 1B is a sectional view showing a two-terminal switching element in an unstable conductive state.
Figure 1C:
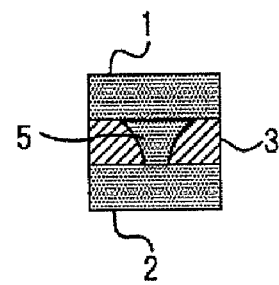
FIG. 1C is a sectional view showing a two-terminal switching element in a stable conductive state.

FIGS. 1A to 1C are sectional views showing a two-terminal switching element.

In FIGS. 1A to 1C, identical components are given the same reference numbers. FIG. 1A is a sectional view showing a two-terminal switching element in a state in which the electrodes are electrically isolated (hereinbelow referred to as the "isolated state"). In FIG. 1A, the two-terminal switching element includes electrodes 1 and 2 and electrolyte 3.

Electrodes 1 and 2 are formed of metals having mutually different ionization tendencies. In the following explanation, the metal that forms electrode 1 has a lower ionization tendency than the metal that forms electrode 2.

As an example, electrode 1 is formed of a metal that is difficult to oxidize such as titanium or platinum, and electrode 2 is formed of a metal that is easy to oxidize, such as copper, silver, or tantalum.

Electrolyte 3 is formed of a solid electrolyte such as copper sulfide, silver sulfide, or tantalum oxide.

Electrodes 1 and 2 are electrically isolated. For example, if the thickness of electrolyte 3 is several tens of nm, the resistance between electrodes 1 and 2 is at least 1 MΩ.

When the connection voltage is applied to the two-terminal switching element, the two-terminal switching element is connected. The connection voltage is a voltage such that the potential of electrode 1 is lower than the potential of electrode 2, and the value of the connection voltage is at least a threshold voltage. The threshold voltage value is the minimum voltage value that allows programming of the switching element. The value of the connection voltage is preferably on the order of several tens of mV to 10V.

Explanation next regards the actual connection of a two-terminal switching element in which electrode 1 is titanium, electrode 2 is copper, and electrolyte 3 is copper sulfide.

When the connection voltage is applied to the two-terminal switching element, electrode 2 emits electrons to the voltage source (not shown) that applies potential to electrode 2. When electrode 2 emits electrons, the copper that makes up electrode 2 is oxidized and is discharged as copper ions to electrolyte 3.

In addition, electrons are supplied to electrolyte 3 from the voltage source (not shown) that applies voltage to electrode 1 by way of electrode 1. When electrons are supplied to electrolyte 3, the copper ions contained in electrolyte 3 are reduced, and the reduced copper ions are deposited in the vicinity of electrode 1 as a metal dendrite (copper dendrite).

The continued application of the connection voltage to the two-terminal switching element results in increase of the metal dendrite that is deposited in the vicinity of electrode 1, and electrodes 1 and 2 are connected by way of the metal dendrite.

FIG. 1B is a sectional view showing the two-terminal switching element in a state immediately following connection between the electrodes by way of the metal dendrite (hereinbelow referred to as an "unstable conductive state"). In FIG. 1B, the two-terminal switching element includes electrodes 1 and 2, electrolyte 3, and metal dendrite 4.

Immediately after the connection of electrodes 1 and 2 by way of metal dendrite 4, the resistance across electrodes 1 and 2 is high. For example, the resistance between electrodes 1 and 2 is on the order of 10 kΩ.

When metal dendrite 4 is even slightly oxidized, electrodes 1 and 2 are electrically isolated. Because the cross-sectional area of metal dendrite 4 is small, the potential exists for electromigration in the metal atoms contained in metal dendrite 4 and damage to the two-terminal switching element.

The continued application of the connection voltage to the two-terminal switching element after electrodes 1 and 2 attain a conductive state causes metal dendrite 4 that connects electrodes 1 and 2 to grow (alternatively, a plurality of metal dendrite are deposited, and this plurality of metal dendrites connects with electrodes 1 and 2).

When the metal dendrite gets larger, the connection of electrodes 1 and 2 stabilizes. More specifically, when the metal dendrite becomes larger, electrodes 1 and 2 are not electrically isolated even if metal dendrite 4 is slightly oxidized.

FIG. 1C is a sectional view showing a two-terminal switching element in a state in which the connection between the electrodes has stabilized (hereinbelow referred to as a "stable conductive state). In FIG. 1C, the two-terminal switching element includes electrodes 1 and 2, electrolyte 3, and metal dendrite 5.

Metal dendrite 5 is larger than metal dendrite 4 shown in FIG. 1B. As a result, electrodes 1 and 2 are not electrically isolated despite slight oxidation of metal dendrite 5.

In addition, electromigration tends not to occur in the metal atoms that form metal dendrite 5 because the cross-sectional area of metal dendrite 5 is large. Still further, the resistance between electrodes 1 and 2 is low.

If electrode 1 is copper, electrode 2 is titanium, and electrolyte 3 is copper sulfide, the resistance of the two-terminal switching element is from several hundred Ω to several tens of kΩ in an unstable conductive state and from several tens of Ω to several kΩ in a stable conductive state.

Continuing the application of the connection voltage to the two-terminal switching element in the stable conductive state causes metal dendrite 5 to further increase in size and further reduces the resistance between electrodes 1 and 2.

However, the two-terminal switching element is exhausted in the process by which the connection voltage is applied to the two-terminal switching element and metal dendrite deposited, and as a result, the application of voltage to the two-terminal switching element is preferably halted when the resistance of a two-terminal switching element attains a prescribed value.

Figure 2A:
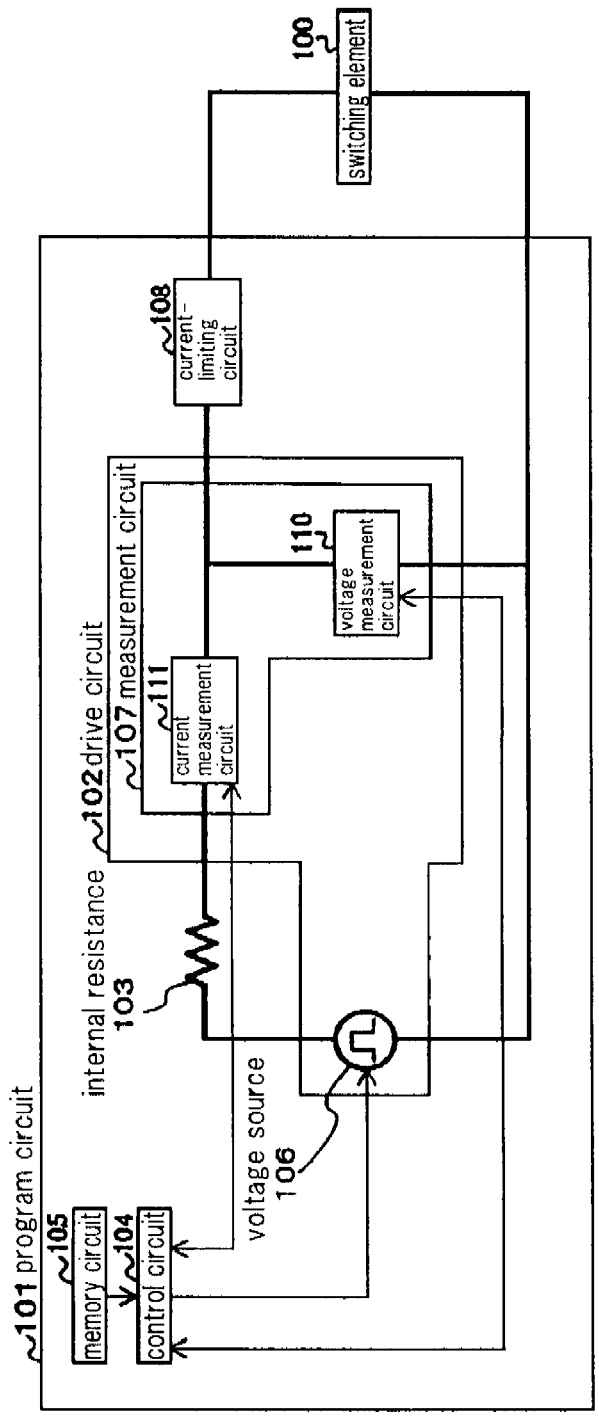
FIG. 2A is a circuit diagram showing a program circuit of the first embodiment of the present invention.

FIG. 2A is a circuit diagram showing an example of a program circuit that can connect a two-terminal switching element. In FIG. 2A, the semiconductor integrated circuit includes switching element 100 and program circuit 101. Switching element 100 has the same functions as the two-terminal switching element shown in FIGS. 1A to 1C.

Program circuit 101 is connected to switching element 100 and controls the resistance of switching element 100. In FIG. 2A, program circuit 101 is connected to one switching element but may actually be connected to a plurality of switching elements.

Program circuit 101 includes drive circuit 102, internal resistance 103, control circuit 104, and memory circuit 105. Drive circuit 102 includes voltage source 106, measurement circuit 107, and current-limiting circuit 108.

Voltage source 106 is controlled by control circuit 104 and applies a voltage to electrodes 1 and 2 of switching element 100. More specifically, voltage source 106 applies a voltage to a switch-regulating circuit formed of switching element 100, current-limiting circuit 108, measurement circuit 107, and internal resistance 103.

Measurement circuit 107 measures a parameter that changes in accordance with the resistance of switching element 100.

Current-limiting circuit 108 limits the maximum value of the current that flows to switching element 100 to the level of from several tens of μA to several tens of mA.

Internal resistance 103 is the resistance of program circuit 101.

Control circuit 104 causes voltage source 106 to apply voltage to switching element 100.

Memory circuit 105 stores information for controlling the resistance of switching element 100.

Figure 2B:
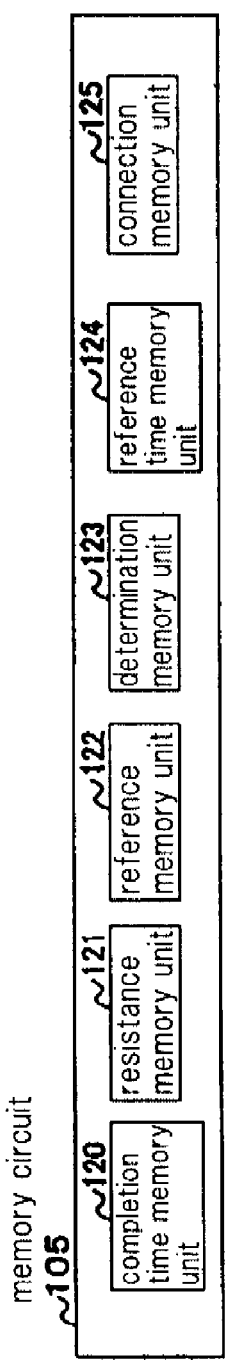
FIG. 2B shows an example of a memory circuit.

FIG. 2B shows an example of memory circuit 105. In FIG. 2B, memory circuit 105 includes completion time memory unit 120, resistance memory unit 121, reference memory unit 122, determination memory unit 123, reference time memory unit 124, and connection memory unit 125.

Completion time memory unit 120 stores the completion time. Resistance memory unit 121 stores the internal resistance values of internal resistance 103. Reference memory unit 122 stores reference voltage values, reference current values, and reference resistance values for determining whether the switching element is in a stable conductive state or not. The reference voltage values are on the order of from several mV to several V, the reference current values are on the order of from several μA to several tens of mA, and the reference resistance values are on the order of from several tens of Ω to 100 kΩ.

In the following explanation, switching element 100 prior to the application of voltage is assumed to be in an isolated state.

Control circuit 104 causes voltage source 106 to apply voltage to the switch-regulating circuit such that the connection voltage is applied to switching element 100. In addition, the voltage that voltage source 106 applies to the switch-regulating circuit is preferably on the order of from several mV to 10V.

In addition, connection methods by which control circuit 104 causes voltage source 106 to apply voltage to connect switching element 100 include: a method of causing the application of voltage of a first voltage value, a method of causing application of voltage while increasing the voltage, a method of causing intermittent application of voltage of a second voltage value, and a method of causing intermittent application of voltage while increasing the voltage.

Control circuit 104, upon causing voltage source 106 to begin applying voltage, checks the completion time stored in completion time memory unit 120. Measurement circuit 107, when subjected to the application of voltage, measures a parameter that changes in accordance with the resistance of switching element 100 and supplies this parameter as output to control circuit 104. The parameter is at least one of: the value of voltage applied to switching element 100 (hereinbelow referred to as the "switch voltage value") and the value of the current that flows to switching element 100 (hereinbelow referred to as the "switch current value").

Measurement circuit 107 includes voltage measurement circuit 110 and current measurement circuit 111.

Voltage measurement circuit 110 measures the switch voltage value and supplies this switch voltage value as output to control circuit 104.

Current measurement circuit 111 measures the switch current value and supplies this switch current value as output to control circuit 104.

Control circuit 104, upon receiving a parameter from measurement circuit 107, determines whether switching element 100 is in a stable conductive state based on this parameter.

When switching element 100 attains a stable conductive state, control circuit 104 causes voltage source 106 to halt the application of voltage.

In addition, control circuit 104 determines that switching element 100 is damaged if switching element 100 does not attain a stable conductive state despite the passage of the completion time after voltage source 106 was caused to begin applying voltage. If switching element 100 is damaged, control circuit 104 causes voltage source 106 to halt the application of voltage.

The following specific explanation regards the determination methods for determining whether switching element 100 has attained a stable conductive state.

In the first determination method, upon receiving the switch current value from current measurement circuit 111, control circuit 104 checks the reference current value stored in reference memory unit 122 and determines whether the switch current value is the reference current value or not.

More specifically, control circuit 104 determines that switching element 100 is in a stable conductive state when the switch current value is the reference current value. On the other hand, if the switch current value is not the reference current value, control circuit 104 determines that switching element 100 is not in a stable conductive state.

In the second determination method, upon receiving the switch voltage value from voltage measurement circuit 110, control circuit 104 checks the reference voltage value stored in reference memory unit 122 and determines whether the switch voltage value is the reference voltage value.

More specifically, if the switch voltage value is the reference voltage value, control circuit 104 determines that switching element 100 is in a stable conductive state. On the other hand, if the switch voltage value is not the reference voltage value, control circuit 104 determines that switching element 100 is not in a stable conductive state.

In the third determination method, control circuit 104, upon receiving the switch voltage value from voltage measurement circuit 110, checks the internal resistance value stored in resistance memory unit 121.

Upon checking the internal resistance value, control circuit 104 calculates the resistance value of switching element 100 based on the value of the voltage that voltage source 106 was caused to apply to the switch adjustment circuit (hereinbelow referred to as "power-supply voltage value"), the switch voltage value, and the internal resistance value.

Upon calculating the resistance value of switching element 100, control circuit 104 checks the reference resistance value stored in reference memory unit 122 and determines whether the calculated resistance value is the reference resistance value.

If the resistance value is the reference resistance value, control circuit 104 determines that switching element 100 is in a stable conductive state. On the other hand, if the resistance value is not the reference resistance value, control circuit 104 determines that switching element 100 is not in a stable conductive state.

Measurement circuit 107 may further compare the switch voltage value and reference voltage value to supply control circuit 104 with a determination signal indicating whether the switch voltage value is greater than the reference voltage value as the parameter of switching element 100.

Figure 3A:
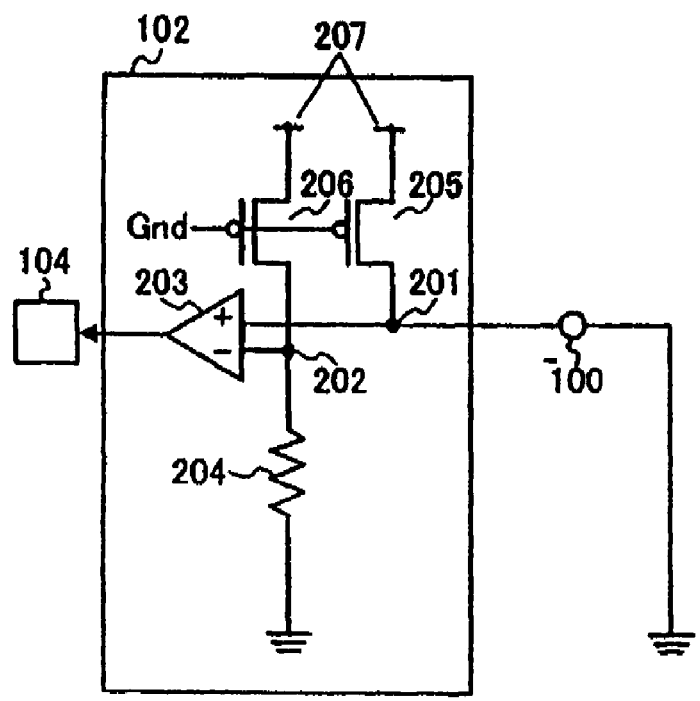
FIG. 3A is a circuit diagram showing an example of a drive circuit.

FIG. 3A is a circuit diagram showing an example of a measurement circuit for supplying a determination signal. In FIG. 3A, items that are identical to FIG. 2A are given the same reference numbers.

In FIG. 3A, a semiconductor integrated circuit includes switching element 100, drive circuit 102, and control circuit 104. Drive circuit 102 includes output terminals 201 and 202, comparator 203, resistance element 204, transistors 205 and 206, and power-supply terminal 207.

The resistance values of transistors 205 and 206 are controlled in control circuit 104. More specifically, control circuit 104 applies a control voltage to the gate electrodes of transistors 205 and 206 to control the resistance values of transistors 205 and 206.

Power-supply terminal 207 is connected to the power supply (not shown) that generates a constant voltage. In addition, transistor 205 and power-supply terminal 207 make up voltage source 106. For example, control circuit 104 can intermittently apply a control voltage to the gate electrode of transistor 205 to cause voltage source 106 to intermittently apply voltage to switching element 100.

The voltage of output terminal 201 (hereinbelow referred to as the "comparison voltage") is prescribed by the resistance value of transistor 205 and the resistance value of switching element 100. In addition, the voltage of output terminal 202 (hereinbelow referred to as the "reference voltage") is prescribed by the resistance value of transistor 206 and the resistance value of resistance element 204.

Resistance element 204 is, for example, the variable resistance of a component such as a transistor. The resistance value of resistance element 204 is controlled in control circuit 104.

The resistance values of transistors 205 and 206 are controlled in control circuit 104.

Comparator 203 includes a plus input terminal, a minus input terminal, and a control output terminal. The plus input terminal of comparator 203 is connected to output terminal 201, and the minus input terminal is connected to output terminal 202. The control output terminal of comparator 203 is connected to control circuit 104.

Comparator 203 compares a comparison voltage and the reference voltage, and supplies a determination signal indicating whether the comparison voltage is greater than the reference voltage as output to control circuit 104 by way of the control output terminal.

More specifically, if the comparison voltage is greater than the reference voltage, or in other words, if the resistance value of switching element 100 is greater than the resistance value of resistance element 204, comparator 203 supplies an H-level signal as output to control circuit 104. On the other hand, if the comparison voltage is smaller than the reference voltage, or in other words, if the resistance value of switching element 100 is smaller than the resistance value of resistance element 204, comparator 203 supplies an L-level signal as output to control circuit 104.

When determining whether switching element 100 is in a stable conductive state, control circuit 104 takes the resistance value of resistance element 204 as the reference resistance value.

When the resistance value of resistance element 204 is the reference resistance value, the comparison voltage is greater than the reference voltage when the resistance value of switching element 100 is greater than the reference resistance value, and comparator 203 therefore supplies an H-level signal to control circuit 104 by way of the control output terminal. On the other hand, the comparison voltage is smaller than the reference voltage when the resistance value of switching element 100 is smaller than the reference resistance value, and comparator 203 therefore supplies an L-level signal to control circuit 104 by way of the control output terminal.

Upon receiving an L-level signal, control circuit 104 determines that switching element 100 is in a stable conductive state, and upon receiving an H-level signal, control circuit 104 determines that switching element 100 is not in a stable conductive state.

Figure 3B:
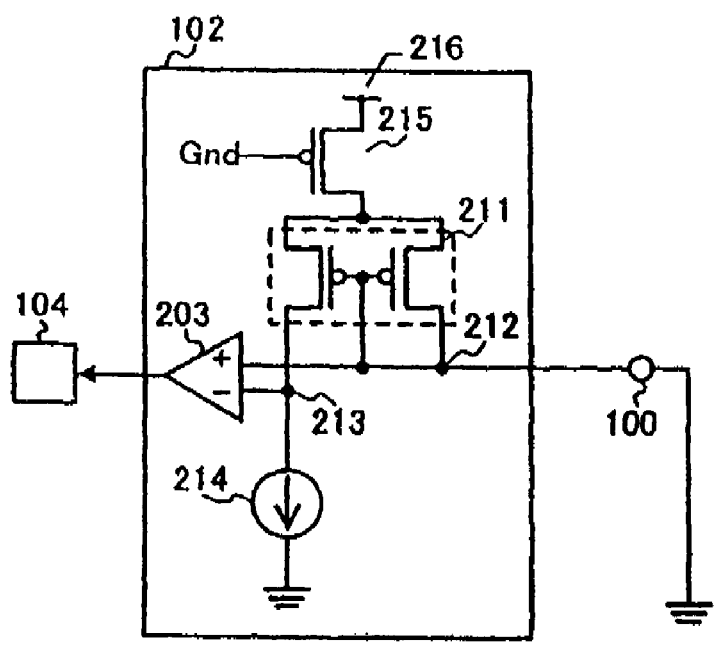
FIG. 3B is a circuit diagram showing an example of a drive circuit.

FIG. 3B is a circuit diagram showing another example of a measurement circuit for supplying a determination signal as output. In FIG. 3B, items identical to FIG. 2A or FIG. 3A are given the same reference numbers.

In FIG. 3B, a semiconductor integrated circuit includes switching element 100, drive circuit 102, and control circuit 104. Drive circuit 102 includes comparator 203, current-mirror circuit 211, output terminals 212 and 213, current source 214, transistor 215, and power-supply terminal 216.

The resistance value of transistor 215 is controlled in control circuit 104. Power-supply terminal 216 is connected to a power supply (not shown) that generates a constant voltage. In addition, transistor 215 and power-supply terminal 216 make up voltage source 106.

Current source 214 supplies a constant current.

The plus input terminal of comparator 203 is connected to output terminal 212, and the minus input terminal is connected to output terminal 213. In addition, the control output terminal of comparator 203 is connected to control circuit 104. The voltage of output terminal 212 is taken as the comparison voltage, and the voltage of output terminal 213 is taken as the reference voltage.

When the current flowing in switching element 100 is lower than the current flowing in current source 214, the comparison voltage becomes greater than the reference voltage, whereby comparator 203 supplies an H-level signal as output to control circuit 104 by way of the control output terminal. On the other hand, when the current flowing in switching element 100 is higher than the current flowing in current source 214, the comparison voltage is lower than the reference voltage, whereby comparator 203 supplies an L-level signal as output to control circuit 104 by way of the control output terminal.

This configuration allows measurement to determine whether the current flowing in switching element 100 is greater than a prescribed value.

When control circuit 104 determines whether switching element 100 is in a stable conductive state, the value of the current flowing in current source 214 is taken as the reference current value. In this case, control circuit 104 determines that switching element 100 has attained a stable conductive state upon receiving an L-level signal, and on the other hand, determines that switching element 100 has not attained a stable conductive state upon receiving an H-level signal.

Replacing current source 214 by resistance element 204 shown in FIG. 3A enables the measurement of whether the resistance value of switching element 100 is greater than the resistance value of resistance element 204.

Explanation next regards the operations for each of the connection methods of the program circuit for connecting a two-terminal switching element.

FIGS. 4 to 7 are timing charts for explaining the operation of a program circuit that can connect a two-terminal switching element. In FIGS. 4 to 7, switching element 100 before voltage is applied is in an isolated state. In addition, the voltage applied to switching element 100 is the connection voltage.

Figure 4:
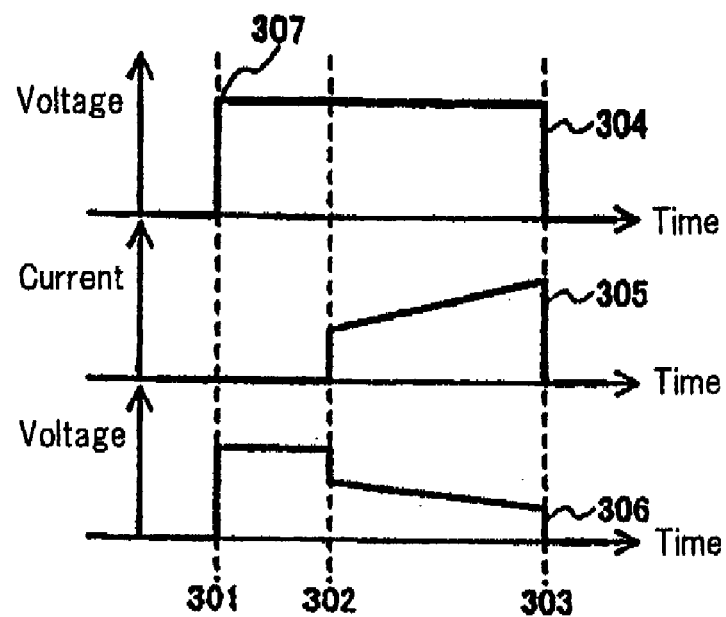
FIG. 4 is a timing chart for explaining an example of the operation of a program circuit.

FIG. 4 is a timing chart showing the change over time of the power-supply voltage value, switch current value, and switch voltage value when control circuit 104 causes voltage source 106 to generate voltage of a first voltage value.

Start time 301 is the time at which control circuit 104 causes voltage source 106 to begin applying voltage. Connection time 302 is the time that switching element 100 attains an unstable conductive state. Stabilization time 303 is the time that switching element 100 attains a stable conductive state.

Power-supply voltage 304 shows the change over time of the power-supply voltage value. Switch current 305 shows the change over time of the switch current value. Switch voltage 306 shows the change over time of the switch voltage value. Voltage value 307 is the power-supply voltage value at start time 301 and shows the first voltage value.

At start time 301, control circuit 104 causes voltage source 106 to apply voltage of voltage value 307. Control circuit 104 then continues to cause voltage source 106 to apply voltage of voltage value 307.

When voltage is applied, measurement circuit 107 measures a parameter and supplies this parameter as output to control circuit 104.

Upon receiving the parameter, control circuit 104 determines whether switching element 100 is in a stable conductive state based on the parameter.

At stabilization time 303, control circuit 104 determines that switching element 100 has attained a stable conductive state. When switching element 100 has attained a stable conductive state, control circuit 104 causes voltage source 106 to halt the application of voltage.

Figure 5:
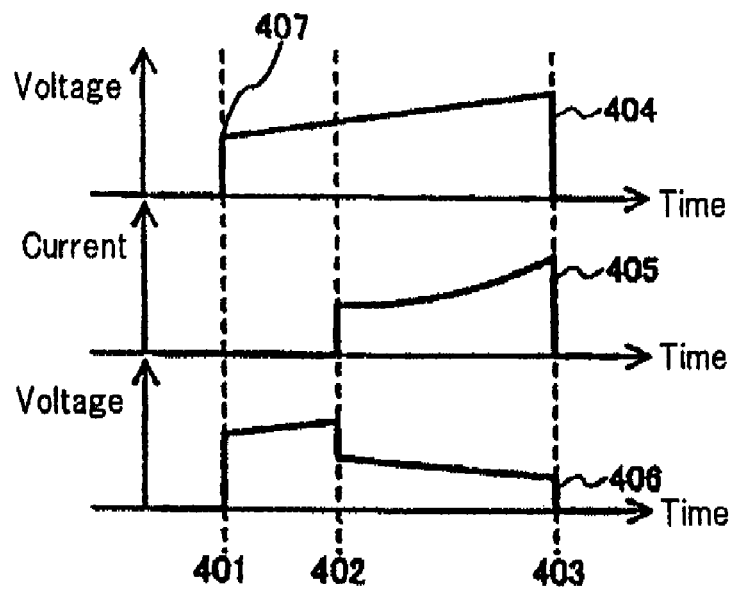
FIG. 5 is a timing chart for explaining another example of the operation of a program circuit.

FIG. 5 is a timing chart showing the change over time of the power-supply voltage value, the switch current value, and the switch voltage value when control circuit 104 causes voltage source 106 to generate voltage while increasing the voltage.

Start time 401 is the time that control circuit 104 causes voltage source 106 to begin applying voltage. Connection time 402 is the time that switching element 100 enters an unstable conductive state. Stabilization time 403 is the time that switching element 100 attains a stable conductive state.

Power-supply voltage 404 indicates the change over time of the power-supply voltage value. The power-supply voltage value increases together with time. Switch current 405 indicates the change over time of the switch current value. Switch voltage 406 indicates the change over time of the switch voltage value. Voltage value 407 is the power-supply voltage value at start time 401. Voltage value 407 is on the order of from several tens of mV to 10V.

At start time 401, control circuit 104 causes voltage source 106 to apply voltage of voltage value 407. Control circuit 104 then causes voltage source 106 to progressively increase the voltage.

When voltage is applied, measurement circuit 107 measures a parameter and supplies this parameter as output to control circuit 104.

Upon receiving the parameter, control circuit 104 determines whether switching element 100 is in a stable conductive state or not based on the parameter.

At stabilization time 303, control circuit 104 determines that switching element 100 is in a stable conductive state.

When switching element 100 attains a stable conductive state, control circuit 104 causes voltage source 106 to halt the application of voltage.

Figure 6:
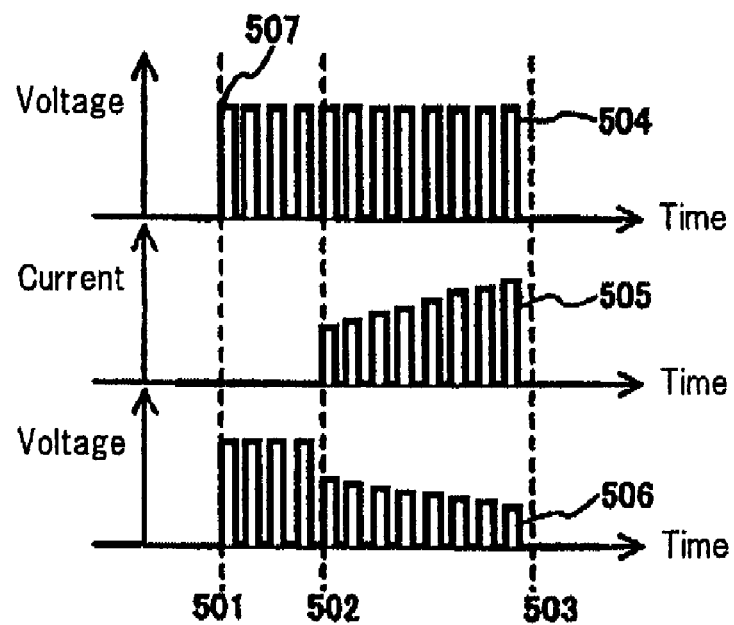
FIG. 6 is a timing chart for explaining another example of the operation of a program circuit.

FIG. 6 is a timing chart showing the change over time of the power-supply voltage value, the switch current value, and the switch voltage value when control circuit 104 causes the voltage source to intermittently generate a voltage of the second voltage value.

Start time 501 is the time at which control circuit 104 causes voltage source 106 to begin the application of voltage. Connection time 502 is the time that switching element 100 enters an unstable conductive state. Stabilization time 503 is the time that switching element 100 attains a stable conductive state. Power-supply voltage 504 indicates the change over time of the power-supply voltage value. Switch current 505 shows the change over time of the switch current value. Switch voltage 506 shows the change over time of the switch voltage value. Voltage value 507 is the power-supply voltage value at start time 501 and indicates the second voltage value. Voltage value 507 is on the order of from several tens of mV to 10V.

At start time 501, control circuit 104 causes voltage source 106 to apply voltage of voltage value 507. Control circuit 104 then causes voltage source 106 to intermittently apply voltage of voltage value 507. The time interval over which control circuit 104 applies voltage is preferably on the order of from several ns to several tens of ms.

When voltage is applied, measurement circuit 107 measures a parameter and supplies this parameter as output to control circuit 104.

Upon receiving the parameter, control circuit 104 determines whether switching element 100 is in a stable conductive state or not based on the parameter.

At stabilization time 503, control circuit 104 determines that switching element 100 has attained a stable conductive state. When switching element 100 attains a stable conductive state, control circuit 104 causes voltage source 106 to halt the application of voltage to program circuit 101.

Figure 7:
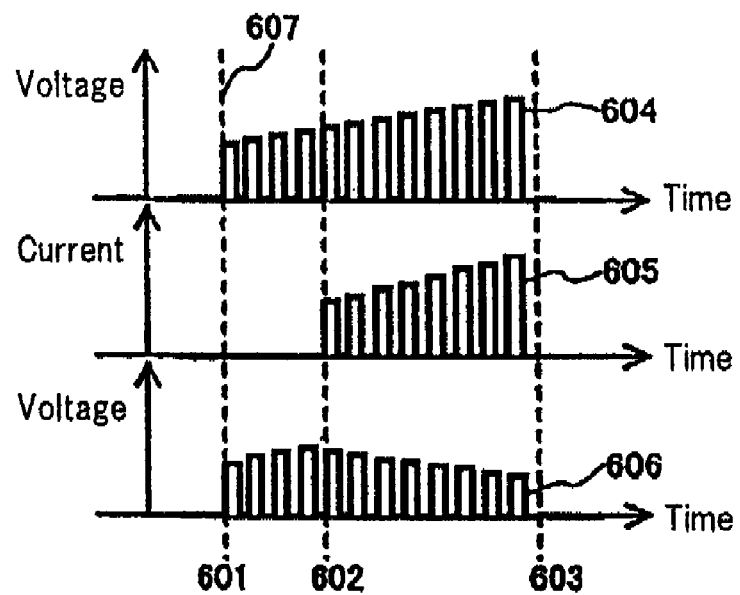
FIG. 7 is a timing chart for explaining another example of the operation of a program circuit.

FIG. 7 is a timing chart showing the change over time of the power-supply voltage value, the switch current value, and the switch voltage value when control circuit 104 causes voltage source 106 to intermittently generate voltage while increasing the voltage.

Start time 601 is the time that control circuit 104 causes voltage source 106 to begin applying voltage. Connection time 602 is the time that switching element 100 enters an unstable conductive state. Stabilization time 603 is the time that switching element 100 attains a stable conductive state. Power-supply voltage 604 shows the change over time of the power-supply voltage value.

Switch current 605 shows the change over time of the switch current value. Switch voltage 606 shows the change over time of the switch voltage value. Voltage value 607 is the power-supply voltage value at start time 601. Voltage value 607 is on the order of several tens of mV to 10V.

At start time 601, control circuit 104 causes voltage source 106 to apply voltage of voltage value 607, following which control circuit 104 causes voltage source 106 to intermittently apply voltage while increasing the voltage.

When voltage is applied, measurement circuit 107 measures a parameter and supplies this parameter as output to control circuit 104.

Upon receiving the parameter, control circuit 104 determines whether switching element 100 is in a stable conductive state or not based on the parameter.

At stabilization time 603, control circuit 104 determines that switching element 100 is in a stable conductive state. When switching element 100 attains a stable conductive state, control circuit 104 causes voltage source 106 to halt the application of voltage.

Figure 8A:
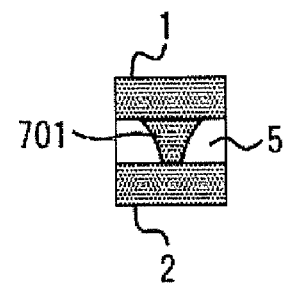
FIG. 8A is a sectional view showing a two-terminal switching element in a stable conductive state.
Figure 8B:
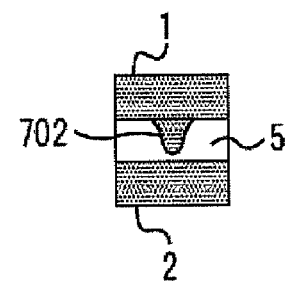
FIG. 8B is a sectional view showing a two-terminal switching element in an unstable isolated state.
Figure 8C:
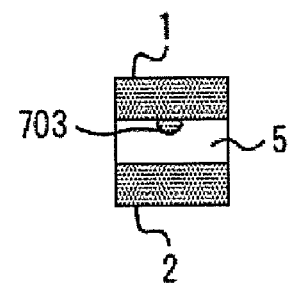
FIG. 8C is a sectional view showing a two-terminal switching element in a stable isolated state.

Explanation next regards the disconnection of a two-terminal switching element. FIGS. 8A to 8C are sectional views showing a two-terminal switching element.

In FIGS. 8A to 8C, items identical to FIGS. 1A to 1C are given the same reference numbers.

FIG. 8A is a sectional view showing a two-terminal switching element in a stable conductive state.

In FIG. 8A, the two-terminal switching element includes electrodes 1 and 2, electrolyte 3, and metal dendrite 701.

As with the two-terminal switching element shown in FIG. 1C, electrodes 1 and 2 in the two-terminal switching element shown in FIG. 8A are stably connected by metal dendrite 701. In other words, electrodes 1 and 2 are not electrically isolated despite slight oxidation of metal dendrite 701.

When a disconnection voltage for disconnecting the two-terminal switching element is applied to the two-terminal switching element, the two-terminal switching element is disconnected. The disconnection voltage is a voltage whereby the potential of electrode 1 is higher than the potential of electrode 2, and the value of the disconnection voltage is at least a threshold-value voltage. A more concrete explanation regarding the disconnection of a two-terminal switching element follows below.

When the disconnection voltage is applied across electrodes 1 and 2, electrons are emitted from electrode 1 to the voltage source (not shown) that applied potential to electrode 1.

When electrons are emitted from electrode 1 to the voltage source, electrons are emitted from metal dendrite 701 that connects electrodes 1 and 2. When electrons are emitted from metal dendrite 401, metal dendrite 701 becomes metal ions and dissolves into electrolyte 3.

With continuation of the application of the disconnection voltage across electrodes 1 and 2, metal dendrite 701 gradually dissolves and electrodes 1 and 2 are electrically isolated.

FIG. 8B is a sectional view showing a two-terminal switching element in a state immediately following inter-electrode electrical isolation (hereinbelow referred to as an "unstable isolated state").

In FIG. 8B, the two-terminal switching element includes electrodes 1 and 2, electrolyte 3, and metal dendrite 702.

Metal dendrite 702 is connected to electrode 1 but is not connected to electrode 2. In other words, electrodes 1 and 2 are electrically isolated. However, metal dendrite 702 connects with electrode 2 if metal dendrite 702 is even slightly reduced in the state immediately following isolation of electrodes 1 and 2.

If the application of the disconnection voltage is continued after the two-terminal switching element has attained an unstable isolated state, metal dendrite 702 becomes smaller and electrodes 1 and 2 attain a stabilized isolated state. More specifically, conductivity between electrodes 1 and 2 does not occur despite a slight reduction of metal dendrite 702.

FIG. 8C is a sectional view showing a two-terminal switching element in which electrodes 1 and 2 are in a stable isolated state (hereinbelow referred to as a "stabilized isolated state"). In FIG. 8C, the two-terminal switching element includes electrodes 1 and 2, electrolyte 3, and metal dendrite 703. Metal dendrite 703 is small, and as a result, electrical conduction between electrodes 1 and 2 does not occur despite slight reduction of metal dendrite 703.

Explanation next regards a program circuit capable of disconnecting a two-terminal switching element. The program circuit that can disconnect a two-terminal switching element is identical to program circuit 101 shown in FIG. 2A. In the following explanation, explanation chiefly regards operations that differ from the operations that have been explained regarding program circuit 101 when connecting a two-terminal switching element.

In FIG. 2A, when disconnecting switching element 100, control circuit 104 causes voltage source 106 to apply a voltage such that the disconnection voltage is applied to switching element 100. Switching element 100 before the application of voltage is assumed to be in a stable conductive state.

Disconnection methods by which control circuit 104 causes voltage source 106 to apply a voltage to disconnect switching element 100 include: a method of applying a voltage of a third voltage value, a method of applying a voltage while increasing the voltage, a method of intermittently applying a voltage of a fourth voltage value, and a method of intermittently applying a voltage while increasing the voltage.

Determination memory unit 123 stores determination resistance values for determining whether a switching element is in an unstable isolated state. A determination resistance value is on the order of 10 kΩ.

Reference time memory unit 124 stores a reference time.

Upon receiving a parameter from measurement circuit 107, control circuit 104 determines whether switching element 100 is in an unstable isolated state or not based on the parameter.

For example, upon receiving a switch voltage value from voltage measurement circuit 110, control circuit 104 checks the internal resistance value stored in memory unit 109.

Control circuit 104 next, upon checking the internal resistance value, calculates the resistance value of switching element 100 based on the internal resistance value, the power-supply voltage value, and the switch voltage value.

Control circuit 104 further, upon calculating the resistance value of switching element 100, checks the determination resistance value stored in resistance memory unit 121.

Control circuit 104 further, upon checking the determination resistance value, determines whether the calculated resistance value of switching element 100 is the determination resistance value.

If the resistance value is the determination resistance value, control circuit 104 determines that switching element 100 is in an unstable isolated state. On the other hand, if this resistance value is not the determination resistance value, control circuit 104 determines that switching element 100 is not in an unstable isolated state.

In addition, measurement circuit 107 may also compare the voltage applied to switching element 100 with the voltage that should be applied to switching element 100 that is in an unstable isolated state.

For example, in FIG. 3A, control circuit 104 controls resistance element 204 and sets the resistance value of resistance element 204 to the determination resistance value. Alternatively, in FIG. 3B, control circuit 104 controls current source 214 and sets the current flowing in current source 214 to the current flowing in switching element 100 that is in an unstable isolated state.

In these cases, control circuit 104 determines that switching element 100 is in an unstable isolated state upon receiving an H-level signal from comparator 203. On the other hand, control circuit 104 determines that switching element 100 is not in an unstable isolated state upon receiving an L-level signal from comparator 203.

If switching element 100 is in an unstable isolated state, control circuit 104 checks the reference time that is stored in reference time memory unit 124. Having checked the reference time, control circuit 104 continues to cause voltage source 106 to apply voltage until the passage of the reference time. When the reference time has elapsed, control circuit 104 causes voltage source 106 to halt application of voltage.

On the other hand, when switching element 100 is not in an unstable isolated state, control circuit 104 continues to cause voltage source 106 to apply voltage. Explanation next regards operations for each of the disconnection methods of the program circuit for disconnecting a two-terminal switching element.

FIGS. 9A to 10B are timing charts for explaining the operations of program circuit that is capable of disconnecting a two-terminal switching element. In FIGS. 9A to 10B, switching element 100 prior to the application of voltage is in a stable conductive state. The voltage applied to switching element 100 is the disconnection voltage.

Figure 9A:
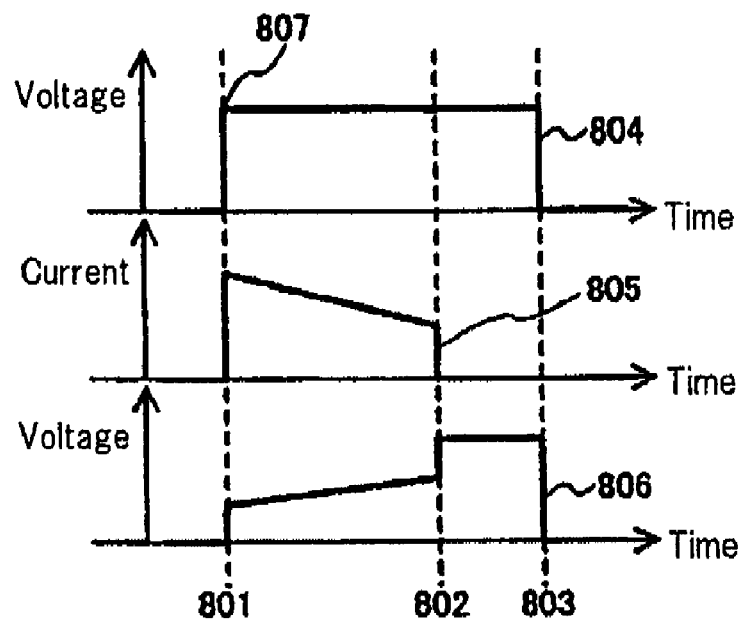
FIG. 9A is a timing chart for explaining an example of the operation of a program circuit for disconnecting a switching element.

FIG. 9A is a timing chart showing the change over time of the power-supply voltage value, the switch current value, and the switch voltage value when control circuit 104 causes voltage source 106 to generate a voltage of a third voltage value to disconnect switching element 100.

Start time 801 is the time that control circuit 104 causes voltage source 106 to start applying voltage. Disconnection time 802 is the time that switching element 100 enters an unstable isolated state. Stabilization time 803 is the time that switching element 100 attains a stable isolated state.

Power-supply voltage 804 shows the change over time of the power-supply voltage value. Switch current 805 shows the change over time of the switch current value. Switch voltage 806 shows the change over time of the switch voltage value. Voltage value 807 is the power-supply voltage value at start time 801 and shows the third voltage value.

At start time 801, control circuit 104 causes voltage source 106 to apply a voltage of the third voltage value. Control circuit 104 then continues to cause voltage source 106 to apply a voltage of voltage value 807.

When voltage is applied, measurement circuit 107 measures a parameter of switching element 100 and supplies this parameter as output to control circuit 104.

Upon receiving the parameter, control circuit 104 determines whether switching element 100 has attained an unstable isolated state or not based on the parameter.

At disconnection time 802, control circuit 104 determines that switching element 100 has attained an unstable isolated state.

When switching element 100 attains an unstable isolated state, control circuit 104 checks the reference time stored in reference time memory unit 124. Control circuit 104, having checked the reference time, continues to cause voltage source 106 to apply a voltage of voltage value 807 until the passage of the reference time.

When the reference time has elapsed, or in other words, when stabilization time 803 arrives, control circuit 104 causes voltage source 106 to halt the application of voltage.

Figure 9B:
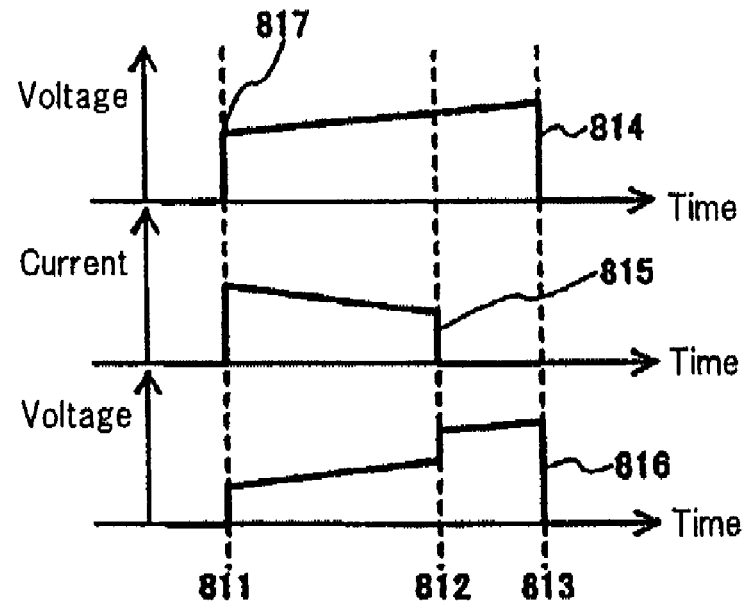
FIG. 9B is a timing chart for explaining another example of the operation of a program circuit for disconnecting a switching element.

FIG. 9B is a timing chart showing the change over time of the power-supply voltage value, the switch current value, and the switch voltage value when control circuit 104 causes voltage source 106 to apply a voltage while increasing the voltage to disconnect switching element 100.

Start time 811 is the time that control circuit 104 causes voltage source 106 to start applying voltage. Disconnection time 812 is the time that switching element 100 enters an unstable isolated state. Stabilization time 813 is the time that switching element 100 attains a stable isolated state.

Power-supply voltage 814 shows the change over time of the power-supply voltage value. The power-supply voltage increases together with time. Switch current 815 shows the change over time of the switch current value. Switch voltage 816 shows the change over time of the switch voltage value. Voltage value 817 is the power-supply voltage value at start time 811.

At start time 811, control circuit 104 causes voltage source 106 to apply a voltage of voltage value 817. Control circuit 104 then continues to cause the voltage source to apply voltage while increasing the voltage.

When voltage is applied, measurement circuit 107 measures a parameter and supplies this parameter as output to control circuit 104.

Upon receiving this parameter, control circuit 104 determines whether switching element 100 has attained an unstable isolated state or not based on this parameter.

At disconnection time 802, control circuit 104 determines that switching element 100 has attained an unstable isolated state.

When switching element 100 attains an unstable isolated state, control circuit 104 checks the reference time that is stored in reference time memory unit 124. Control circuit 104, having checked the reference time, causes voltage source 106 to apply voltage while increasing the voltage until passage of the reference time.

Then, upon passage of the reference time, or in other words, at stabilization time 803, control circuit 104 causes voltage source 106 to halt the application of voltage.

Figure 10A:
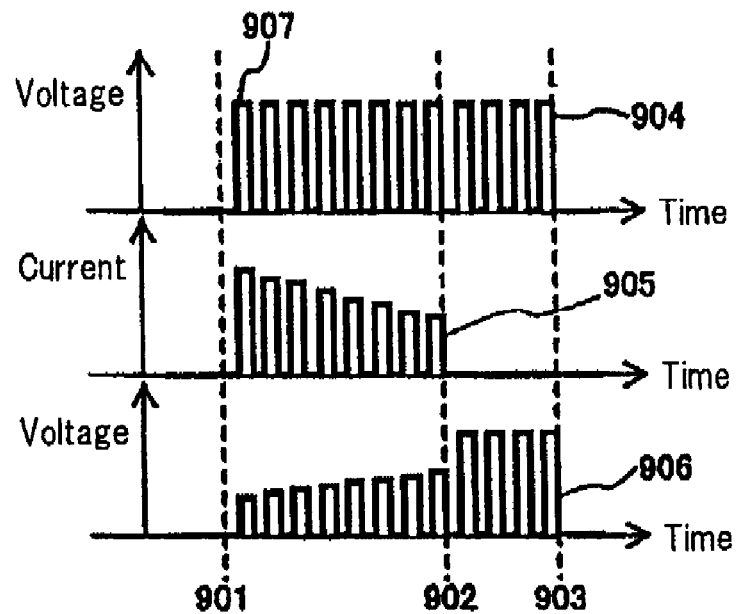
FIG. 10A is a timing chart for explaining another example of the operation of a program circuit for disconnecting a switching element.

FIG. 10A is a timing chart showing the change over time of the power-supply voltage value, the switch current value, and the switch voltage value when control circuit 104 causes voltage source 106 to intermittently generate a voltage of the fourth voltage value to disconnect switching element 100.

Start time 901 is the time that control circuit 104 causes voltage source 106 to start applying voltage. Disconnection time 902 is the time that switching element 100 enters an unstable isolated state. Stabilization time 903 is the time that switching element 100 attains a stable isolated state.

Power-supply voltage 904 shows the change over time of the power-supply voltage value. Switch current 905 shows the change over time of the switch current value. Switch voltage 906 shows the change over time of the switch voltage value. Voltage value 907 is the power-supply voltage value at start time 901 and indicates the fourth voltage value.

At start time 901, control circuit 104 causes voltage source 106 to apply voltage of voltage value 907. Control circuit 104 then causes voltage source 106 to intermittently apply voltage of voltage value 907.

When voltage is applied to program circuit 101, measurement circuit 107 measures a parameter and supplies this parameter as output to control circuit 104.

Upon receiving the parameter, control circuit 104 determines whether switching element 100 has attained an unstable isolated state or not based on the parameter.

At disconnection time 802, control circuit 104 determines that switching element 100 has entered an unstable isolated state.

When switching element 100 enters an unstable isolated state, control circuit 104 checks the reference time stored in reference time memory unit 124. Having checked the reference time, control circuit 104 continues to cause voltage source 106 to intermittently apply a voltage of voltage value 907 until the passage of the reference time.

Upon the passage of the reference time, or in other words, when stabilization time 803 arrives, control circuit 104 causes voltage source 106 to halt the application of voltage.

Figure 10B:
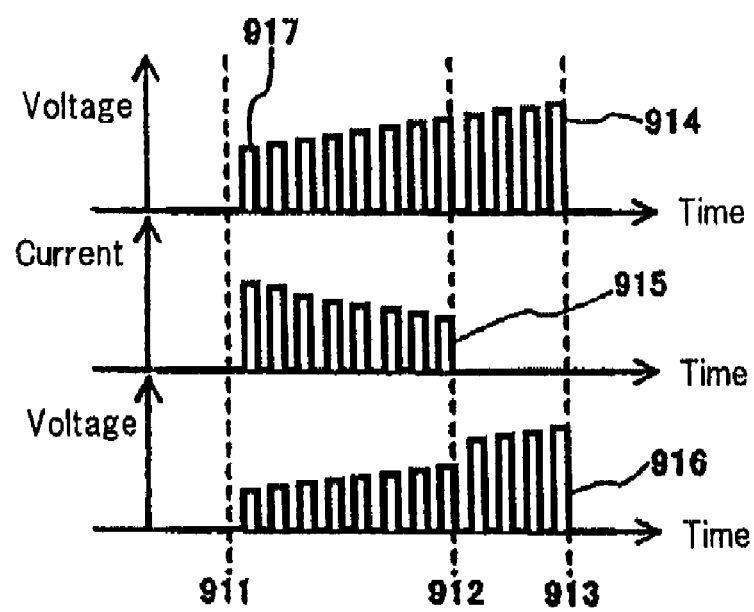
FIG. 10B is a timing chart for explaining another example of the operation of a program circuit for disconnecting a switching element.

FIG. 10B is a timing chart showing the change over time of the power-supply voltage, the switch current, and the switch voltage when control circuit 101 causes voltage source 106 to intermittently generate voltage while increasing the voltage to program circuit 101 to disconnect the switching element.

Start time 911 is the time at which control circuit 104 causes voltage source 106 to begin application of voltage. Disconnection time 912 is the time that switching element 100 enters an unstable isolated state. Stabilization time 913 is the time that switching element 100 attains a stable isolated state.

Power-supply voltage 914 shows the change over time of the power-supply voltage value. Switch current 915 shows the change over time of the switch current value. Switch voltage 916 shows the change over time of the switch voltage value. Voltage value 917 is the power-supply voltage value at start time 911.

At start time 911, control circuit 104 causes voltage source 106 to apply voltage of voltage value 917. Control circuit 104 then causes voltage source 106 to intermittently apply voltage while increasing the voltage.

When voltage is applied, measurement circuit 107 measures a parameter of switching element 100 and supplies this parameter as output to control circuit 104.

Upon receiving the parameter, control circuit 104 determines if switching element 100 has entered an unstable isolated state or not based on the parameter.

At disconnection time 902, control circuit 104 determines that switching element 100 has entered an unstable isolated state.

When switching element 100 enters an unstable isolated state, control circuit 104 checks the reference time stored in reference time memory unit 124. Control circuit 104, having checked the reference time, causes voltage source 106 to intermittently apply voltage while increasing the voltage until the passage of the reference time.

Then, upon passage of the reference time, or in other words, when stabilization time 803 has arrived, control circuit 104 causes voltage source 106 to halt the application of voltage.

According to the present embodiment, voltage source 106 applies voltage to electrodes 1 and 2 of switching element 100. Measurement circuit 107 measures a parameter of switching element 100. Control circuit 104 causes voltage source 106 to progressively increase the voltage applied across electrodes 1 and 2 of switching element 100 until the prescribed value of the parameter measured by measurement circuit 107 is reached. When the prescribed value of the parameter measured by measurement circuit 107 is reached, control circuit 104 causes voltage source 106 to halt the application of voltage.

In this case, voltage is applied while being increased across electrodes 1 and 2 of switching element 100. In addition, the application of voltage is halted when a prescribed value of a parameter is reached.

As a result, the resistance value of switching element 100 can be controlled by a low voltage when switching element 100 is not exhausted and the resistance value of switching element 100 can be controlled by a high voltage when switching element 100 is exhausted.

The application to switching element 100 of a voltage that is larger than the voltage value required for controlling the resistance value of switching element 100 can therefore be reduced, enabling a mitigation of the exhaustion of switching element 100.

In the present embodiment, voltage source 106 applies a voltage to electrodes 1 and 2 of switching element 100. Measurement circuit 107 measures a parameter of switching element 100. Control circuit 104 causes voltage source 106 to intermittently apply voltage across electrodes 1 and 2 of switching element 100 until a prescribed value of the parameter measured by measurement circuit 107 is reached. Further, when the parameter measured by measurement circuit 107 reaches a prescribed value, control circuit 104 causes voltage source 106 to halt application of voltage.

In this case, voltage is applied intermittently across electrodes 1 and 2 of switching element 100. As a result, the heat of the switching element that results from Joule heat can be reduced, enabling a mitigation of the exhaustion of the switching element.

In the present embodiment, control circuit 104 causes voltage source 106 to intermittently apply voltage while increasing the voltage across electrodes 1 and 2 of switching element 100.

In this case, it is possible to reduce the application to switching element 100 of voltage that is greater than the voltage necessary for controlling the resistance value of switching element 100, and moreover, to reduce the heat of switching element 100 that results from Joule heat, whereby the exhaustion of switching element 100 can be mitigated.

In the present embodiment, the metal for forming electrode 1 has a lower ionization tendency than the metal for forming electrode 2. Control circuit 104 causes voltage source 106 to apply a voltage across electrodes 1 and 2 such that the potential of electrode 1 of switching element 100 becomes lower than the potential of electrode 2 of switching element 100 until a stable conductive state is attained.

In this case, switching element 100 can be placed in a stable conductive state. In the present embodiment, moreover, control circuit 104 causes voltage source 106 to apply a voltage to a switching element such that the potential of electrode 1 of switching element 100 is higher than the potential of electrode 2 of switching element 100. Then, after the passage of the reference time after switching element 100 enters an isolated state, control circuit 104 causes voltage source 106 to halt application of voltage.

In this case, the application of voltage is halted upon the passage of the reference time after switching element 100 has become isolated. As a result, the metal dendrite deposited between electrodes 1 and 2 of switching element 100 can be made smaller to the degree that switching element 100 does not enter a conductive state despite slight reduction of the metal dendrite.

In the present embodiment, current-limiting circuit 108 limits the current value of the current that flows in switching element 100 to no greater than a prescribed current value. In this case, the flow of a large current in switching element 100 can be reduced to enable a mitigation of the exhaustion of switching element 100.

In the present embodiment, control circuit 104 causes voltage source 106 to halt application of voltage when switching element 100 does not attain a prescribed resistance value despite the passage of the completion time after the start of the application of voltage.

In this case, the application of voltage is halted when the switching element does not attain a desired state despite the passage of the completion time, thus enabling a reduction of the trouble of checking whether the switching element is damaged or not.

Explanation next regards a three-terminal switching element. The following explanation chiefly regards the construction and operations that differ from a two-terminal switching element.

Figure 11A:
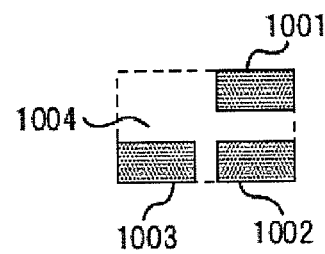
FIG. 11A is a sectional view showing a three-terminal switching element in an isolated state.
Figure 11B:
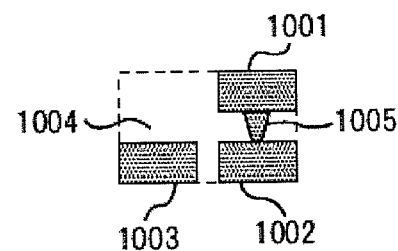
FIG. 11B is a sectional view showing a three-terminal switching element in an unstable conductive state.
Figure 11C:
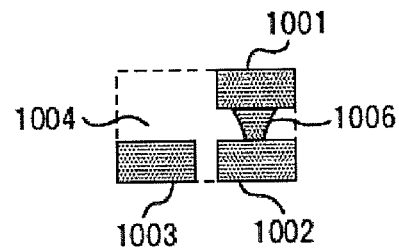
FIG. 11C is a sectional view of a three-terminal switching element in a stable conductive state.

FIGS. 11A to 11C are sectional views showing a three-terminal switching element.

FIG. 11A is a sectional view showing three-terminal switching element in an isolated state. In FIG. 11A, the three-terminal switching element includes electrodes 1001 and 1002, gate electrode 1003, and electrolyte 1004. Electrodes 1001 and 1002 are formed of metals having different ionization tendencies. In the following explanation, the metal for forming electrode 1001 has a lower ionization tendency than the metal for forming electrode 1002 and gate electrode 1003.

The metal for forming gate electrode 1003 is preferably the same as the metal for forming electrode 1002.

For example, electrode 1001 is formed of a metal that is difficult to oxidize, such as titanium or platinum, and electrode 1002 and gate electrode 1003 are formed of a metal that ionizes readily, such as copper, silver, or tantalum. Electrolyte 1004 is formed of a solid electrolyte, such as copper sulfide, silver sulfide, or tantalum oxide.

Electrodes 1001 and 1002 are electrically isolated.

When the first connection voltage for connecting the three-terminal switching element is applied across electrodes 1001 and 1002, the three-terminal switching element is connected. The first connection voltage is a voltage such that the potential of electrode 1001 becomes lower than the potential of electrode 1002. The value of the first connection voltage is at least a threshold value voltage.

Explanation next regards the specifics of connecting a three-terminal switching element.

When the first connection voltage is applied across electrodes 1001 and 1002, electrode 1002 emits electrons to the voltage source (not shown) that applied potential to electrode 1002.

When electrode 1002 emits electrons, the metal that forms electrode 1002 is oxidized and is discharged into electrolyte 1004 as metal ions.

In addition, electrons are supplied by way of electrode 1001 to electrolyte 1004 from the voltage source (not shown) that applies voltage to electrode 1001.

When electrons are supplied to electrolyte 1004, the metal ions contained in electrolyte 1004 are reduced, and the reduced metal ions are deposited in the vicinity of electrode 1001 as a metal dendrite.

Continuation of the application of the first connection voltage across electrodes 1001 and 1002 causes the metal dendrite deposited in the vicinity of electrode 1001 to increase in size, and electrodes 1001 and 1002 are connected by way of the metal dendrite.

FIG. 11B is a sectional view showing a three-terminal switching element in an unstable conductive state. In FIG. 11B, the three-terminal switching element includes electrodes 1001 and 1002, gate electrode 1003, electrolyte 1004, and metal dendrite 1005.

When electrodes 1001 and 1002 are connected by way of metal dendrite 1005, electrical contact is established between electrodes 1001 and 1002.

However, the resistance value between electrodes 1001 and 1002 is high immediately after electrodes 1001 and 1002 are connected by way of metal dendrite 1005.

In addition, even a small amount of oxidation of metal dendrite 1005 results in electrical isolation of electrodes 1001 and 1002. In addition, the cross-sectional area of metal dendrite 1005 is small, and the potential therefore exists for destruction of the three-terminal switching element in the event of electromigration in the metal atoms contained in metal dendrite 1005.

When voltage is applied across electrodes 1001 and 1002 after electrodes 1001 and 1002 have been placed in electrical contact, a high current flows between electrodes 1001 and 1002. The flow of high current between electrodes 1001 and 1002 results in exhaustion of electrodes 1001 and 1002. As a result, when conductivity is established between electrodes 1001 and 1002, the voltage applied to electrodes 1001 and 1002 is preferably lowered, and moreover, a second connection voltage is preferably applied across electrode 1002 and gate electrode 1003.

The second connection voltage is a voltage such that the potential of gate electrode 1003 becomes higher than the potential of electrodes 1001 and 1002, and the value of second connection voltage is at least a threshold value voltage.

In addition, the value of the second connection voltage is higher than the value of voltage that is applied to electrodes 1001 and 1002 after the voltage has been lowered.

After the voltage has been lowered, the value of the voltage applied to electrodes 1001 and 1002 is preferably lower than the threshold value voltage.

In addition, when a conductive state is established between electrodes 1001 and 1002, the voltage applied to electrodes 1001 and 1002 is preferably halted. When the second connection voltage is applied to electrode 1002 and gate electrode 1003, electrode 1002 emits electrons to the voltage source (not shown) that applies potential to electrode 1002.

When electrode 1002 emits electrons, the metal that forms electrode 1002 is oxidized and is released into electrolyte 1004 as metal ions.

In addition, electrons are supplied by way of gate electrode 1003 from the voltage source (not shown) that applies potential to gate electrode 1003.

When electrons are supplied to electrolyte 1004, the metal ions contained in electrolyte 1004 are reduced, and the metal ions are deposited as a metal dendrite in the vicinity of electrode 1001.

Continuation of the application of the second connection voltage to electrode 1002 and gate electrode 1003 causes metal dendrite 1005 to increase in size, whereby the three-terminal switching element enters a stable conductive state. FIG. 11C is a sectional view showing a three-terminal switching element in a stable conductive state. In FIG. 11C, the three-terminal switching element includes electrodes 1001 and 1002, gate electrode 1003, electrolyte 1004, and metal dendrite 1006.

Metal dendrite 1006 is larger than metal dendrite 1005 shown in FIG. 11B. As a result, electrodes 1001 and 1002 are not electrically isolated even if metal dendrite 1006 undergoes slight oxidation.

In addition, the cross-sectional area of metal dendrite 1006 is large, and the electromigration of metal atoms that form metal dendrite 1006 therefore tends not to occur. Still further, the resistance value between electrodes 1001 and 1002 is low.

Figure 12:
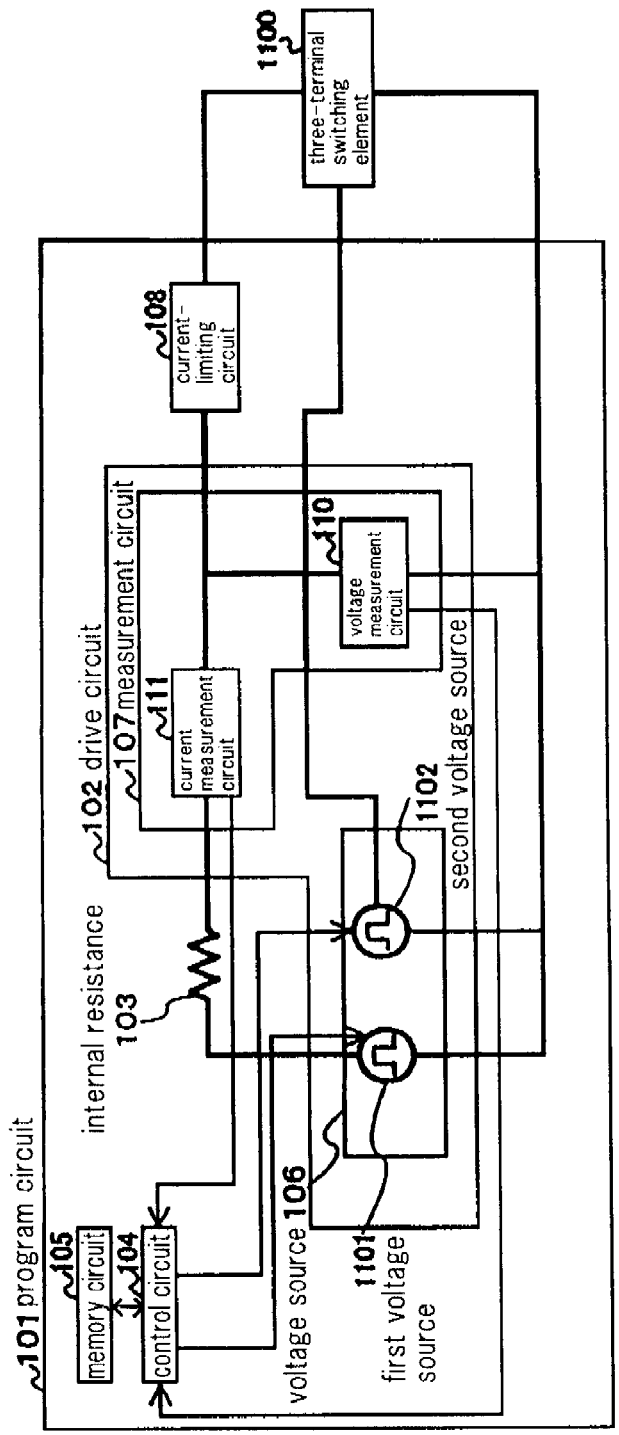
FIG. 12 is a timing chart showing an example of a program circuit for programming a three-terminal switching element.

FIG. 12 is a circuit diagram showing an example of a program circuit capable of connecting a three-terminal switching element. In FIG. 12, items identical to FIG. 2A are given the same reference numbers. The following explanation chiefly regards construction or operations that differ from the program circuit that is capable of connecting a two-terminal switching element.

In FIG. 12, a semiconductor integrated circuit includes three-terminal switching element 1100 and program circuit 101.

Three-terminal switching element 1100 has functions equivalent to the three-terminal switching element shown in FIGS. 11A to 11C.

Voltage source 106 includes first voltage 1101 and second voltage source 1102. First voltage source 1101 applies voltage across electrodes 1001 and 1002 of three-terminal switching element 1100.

Second voltage source 1102 applies voltage across electrode 1002 and gate electrode 1003 of three-terminal switching element 1100. In addition, second voltage source 1102 may apply voltage across electrode 1001 and gate electrode 1003 of three-terminal switching element 1100.

Control circuit 104 causes first voltage source 1101 to apply a first power-supply voltage such that first connection voltage is applied to three-terminal switching element 1100.

In the following explanation, three-terminal switching element 1100 before the application of voltage is assumed to be in an isolated state.

In addition, the three-terminal connection methods by which control circuit 104 causes voltage source 106 to apply a voltage to connect three-terminal switching element 1100 include: a method of causing the application of a voltage of a fifth voltage value, a method of causing the application of voltage while increasing the voltage, a method of causing the intermittent application of voltage of a sixth voltage value, and a method of causing the intermittent application of voltage while increasing the voltage.

Connection memory unit 125 stores connection current values, connection voltage values, and connection resistance values for determining whether a switching element is in an unstable conductive state or not. In addition, the connection resistance values are preferably on the order of from several tens of $\Omega$ several hundred k$\Omega$.

Upon receiving the parameter from measurement circuit 107, control circuit 104 determines whether three-terminal switching element 1100 is in an unstable conductive state or not based on the parameter.

The following detailed explanation regards the connection determination methods for determining whether three-terminal switching element 1100 is in an unstable conductive state.

In the first connection determination method, control circuit 104, upon receiving a switch current value from current measurement circuit 111, checks the connection current value stored in connection memory unit 125 and determines whether the switch current value is the connection current value.

If the switch current value is the connection current value, control circuit 104 determines that three-terminal switching element 1100 is in an unstable conductive state. On the other hand, if the switch current value is not the connection current value, control circuit 104 determines that three-terminal switching element 1100 is not in an unstable conductive state.

In the second connection determination method, control circuit 104, upon receiving the switch voltage value from voltage measurement circuit 110, checks the connection voltage value stored in connection memory unit 125 and determines whether the switch voltage value is the connection voltage value or not.

If the switch voltage value is the connection voltage value, control circuit 104 determines that three-terminal switching element 1100 is in an unstable conductive state. On the other hand, if the switch voltage value is not the connection voltage value, control circuit 104 determines that three-terminal switching element 1100 is not in an unstable conductive state.

In the third connection determination method, control circuit 104, upon receiving the switch voltage value from voltage measurement circuit 110, checks the internal resistance value stored in resistance memory unit 121. Control circuit 104, having checked the internal resistance value, calculates the resistance value of three-terminal switching element 1100 based on the value of first power-supply voltage that first voltage source 1101 was caused to apply (hereinbelow referred to as the "first power-supply voltage value"), the switch voltage value, and the internal resistance value.

Control circuit 104, having calculated the resistance value of three-terminal switching element 1100, checks the connection resistance value stored in connection memory unit 125 and determines whether this calculated resistance value is the connection resistance value or not.

If the resistance value is the connection resistance value, control circuit 104 determines that three-terminal switching element 1100 is in an unstable conductive state. On the other hand, if this resistance value is not the connection resistance value, control circuit 104 determines that three-terminal switching element 1100 is not in an unstable conductive state.

Alternatively, measurement circuit 107 may compare the switch voltage value and connection voltage value and supply control circuit 104 with a determination signal indicating whether the switch voltage value is greater than the connection voltage value as the parameter of three-terminal switching element 1100.

For example, in FIG. 3A, control circuit 104 controls resistance element 204 to set the resistance value of the resistance element to the connection resistance value. Alternatively, in FIG. 3B, control circuit 104 sets the current value of the current that flows in current source 214 to the connection current value.

In these cases, control circuit 104, upon receiving an L-level signal from measurement circuit 107, determines that three-terminal switching element 1100 is in an unstable conductive state. On the other hand, control circuit 104, upon receiving an H-level signal from measurement circuit 107, determines that three-terminal switching element 1100 is not in an unstable conductive state.

If three-terminal switching element 1100 is not in an unstable conductive state, control circuit 104 continues to cause first voltage source 1101 to apply a voltage to electrodes 1001 and 1002 of three-terminal switching element 1100. On the other hand, if three-terminal switching element 1100 is in an unstable conductive state, control circuit 104 causes first voltage source 1101 to lower the voltage being applied to electrodes 1001 and 1002 of three-terminal switching element 1100. Control circuit 104 may also cause first voltage source 1101 to halt the application of voltage to electrodes 1001 and 1002 of three-terminal switching element 1100.

Upon causing first voltage source 1101 to lower the voltage, control circuit 104 causes second voltage source 1102 to apply a voltage across electrode 1002 and gate electrode 1003 such that a second connection voltage is applied to three-terminal switching element 1100.

Upon receiving a parameter from measurement circuit 107 after having caused second voltage source 1102 to apply voltage, control circuit 104 determines whether three-terminal switching element 1100 is in a stable conductive state or not based on the parameter.

If three-terminal switching element 1100 is in a stable conductive state, control circuit 104 causes voltage source 1101 and 1102 to halt the application of voltage.

On the other hand, if the three-terminal switching element is not in a stable conductive state, control circuit 104 continues to cause voltage source 1101 and 1102 to apply voltage.

Explanation next regards the operations of a program circuit capable of connecting a three-terminal switching element for each of the three-terminal connection methods.

FIGS. 13 to 16 are timing charts for explaining the operations of a program circuit that can connect a three-terminal switching element. In FIGS. 13 to 16, three-terminal switching element 1100 prior to the application of voltage is assumed to be in an isolated state. In addition, the voltage applied to three-terminal switching element 1100 is a first connection voltage or a second connection voltage.

Figure 13:
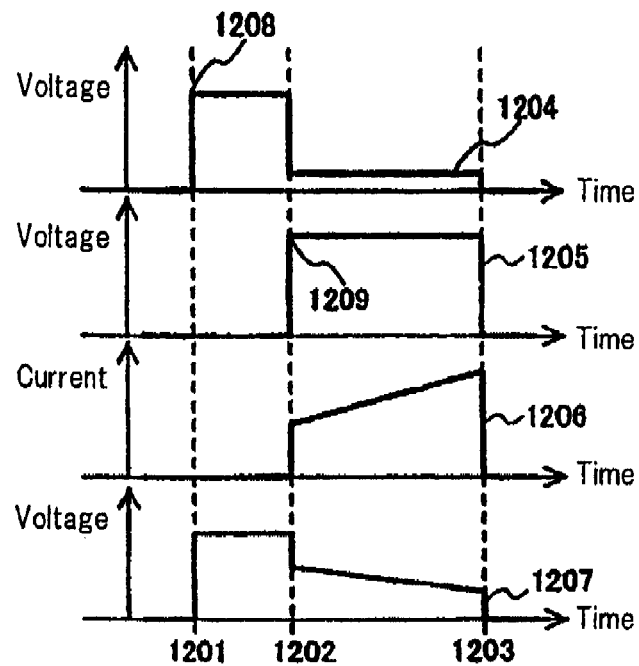
FIG. 13 is a timing chart for explaining an example of the operation of a program circuit for connecting a three-terminal switching element.

FIG. 13 is a timing chart showing the change over time of the first power-supply voltage value, the second power-supply voltage value, the switch current value, and the switch voltage value when control circuit 104 causes voltage source 106 to apply a voltage of a fifth voltage value to connect three-terminal switching element 1100. The second power-supply voltage value is the value of voltage generated by second voltage source 1102.

Start time 1201 is the time at which control circuit 104 causes voltage source 106 to begin applying voltage. Connection time 1202 is the time at which three-terminal switching element 1100 enters an unstable conductive state. Stabilization time 1203 is the time that three-terminal switching element 1100 attains a stable conductive state.

Power-supply voltage 1204 shows the change over time of the first power-supply voltage value. Power-supply voltage 1205 shows the change over time of the second power-supply voltage value. Switch current 1206 shows the change over time of the switch current value. Switch voltage 1207 shows the change over time of the switch voltage value. Voltage value 1208 is the first power-supply voltage value at the start time and shows the fifth voltage value. At start time 1201, control circuit 104 causes first voltage source 1101 to apply a first power-supply voltage of voltage value 1208.

Upon application of voltage, measurement circuit 107 measures a parameter and supplies this parameter as output to control circuit 104.

Upon receiving the parameter, control circuit 104 determines whether three-terminal switching element 1100 is in an unstable conductive state or not based on the parameter.

At connection time 1202, control circuit 104 determines that three-terminal switching element 1100 has entered an unstable conductive state.

When three-terminal switching element 1100 has entered an unstable conductive state, control circuit 104 causes first voltage source 1101 to lower the first power-supply voltage value.

Control circuit 104, having caused first power-supply voltage value to decrease, causes second voltage source 1102 to apply the second power-supply voltage. The second power-supply voltage value is voltage value 1209.

Subsequently, upon receiving the parameter from measurement circuit 107, control circuit 104 determines whether three-terminal switching element 1100 is in a stable conductive state or not based on the parameter.

Figure 14:
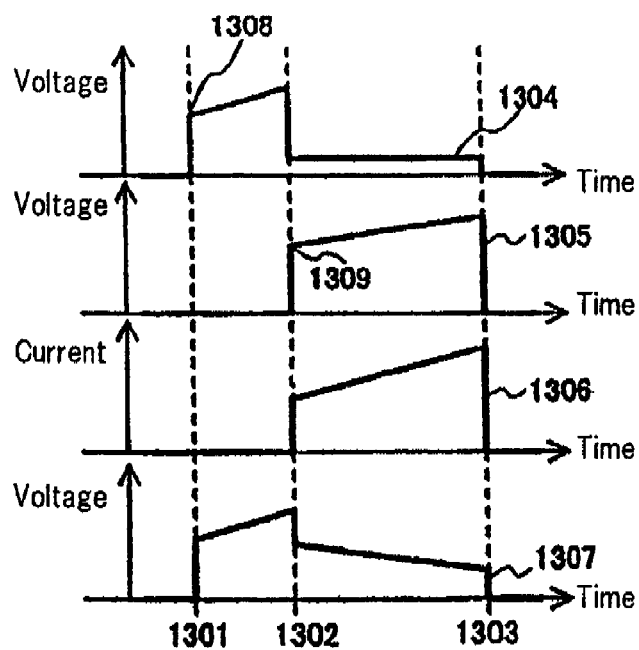
FIG. 14 is a timing chart for explaining another example of the operation of a program circuit for connecting a three-terminal switching element.

At stabilization time 1203, control circuit 104 determines that three-terminal switching element 1100 has attained a stable conductive state. When three-terminal switching element 1100 has attained a stable conductive state, control circuit 104 causes voltage source 1101 and 1102 to halt application of voltage. FIG. 14 is a timing chart showing the change over time of the first power-supply voltage value, the second power-supply voltage value, the switch current value, and the switch voltage value when control circuit 104 causes voltage source 106 to generate voltage while increasing the voltage to connect three-terminal switching element 1100.

Start time 1301 is the time that control circuit 104 causes voltage source 106 to begin applying voltage. Connection time 1302 is the time that three-terminal switching element 1100 enters an unstable conductive state. Stabilization time 1303 is the time that three-terminal switching element 1100 attains a stable conductive state.

Power-supply voltage 1304 shows the change over time of the first power-supply voltage value. Power-supply voltage 1305 shows the change over time of the second power-supply voltage value. Switch current 1306 shows the change over time of the switch current value. Switch voltage 1307 shows the change over time of the switch voltage value. Voltage value 1308 is the first power-supply voltage value at start time 1301. Voltage value 1309 is the second power-supply voltage value at connection time 1302.

At start time 1301, control circuit 104 causes first voltage source 1101 to apply a first power-supply voltage of voltage value 1308. Control circuit 104 then causes first voltage source 1101 to apply the first power-supply voltage while increasing the voltage.

When the first power-supply voltage is applied, measurement circuit 107 measures a parameter and supplies this parameter as output to control circuit 104.

Upon receiving this parameter, control circuit 104 determines whether three-terminal switching element 1100 is in an unstable conductive state or not based on the parameter.

At connection time 1302, control circuit 104 determines that three-terminal switching element 1100 has entered an unstable conductive state.

When electrodes 1001 and 1002 of three-terminal switching element 1100 have entered an unstable conductive state, control circuit 104 causes first voltage source 1101 to lower the first power-supply voltage. After having caused lowering of the first power-supply voltage, control circuit 104 fixes the first power-supply voltage with respect to change over time.

After having lowered the first power-supply voltage, control circuit 104 causes second voltage source 1102 to apply a second power-supply voltage of voltage value 1209.

Control circuit 104 then causes second voltage source 1102 to apply voltage while increasing the voltage as shown by power-supply voltage 1305.

Upon receiving the parameter from measurement circuit 107 after connection time 1302, control circuit 104 determines whether three-terminal switching element 1100 is in a stable conductive state or not based on the parameter. At stabilization time 1303, control circuit 104 determines that three-terminal switching element 1100 has attained a stable conductive state. When three-terminal switching element 1100 has attained a stable conductive state, control circuit 104 causes first voltage source 1101 and second voltage source 1102 to halt application of voltage.

Figure 15:
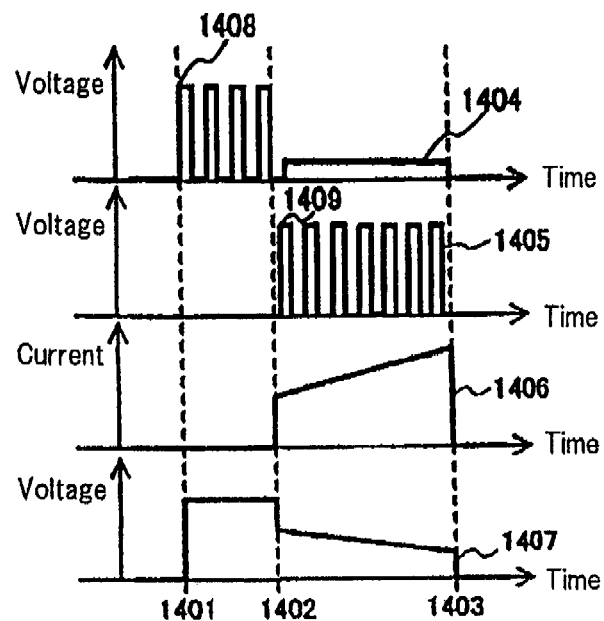
FIG. 15 is a timing chart for explaining another example of the operation of a program circuit for connecting a three-terminal switching element.

FIG. 15 is a timing chart showing the change over time of the first power-supply voltage value, the second power-supply voltage value, the switch current value, and the switch voltage value when control circuit 104 causes voltage source 106 to intermittently generate voltage of a sixth voltage value to program circuit 101 to connect three-terminal switching element 1100.

Start time 1401 is the time that control circuit 104 causes voltage source 106 to begin applying voltage. Connection time 1402 is the time that three-terminal switching element 1100 enters an unstable conductive state. Stabilization time 1403 is the time that three-terminal switching element 1100 attains a stable conductive state.

Power-supply voltage 1404 shows the change over time of the first power-supply voltage value. Power-supply voltage 1405 shows the change over time of second power-supply voltage value. Switch current 1406 shows the change over time of the switch current value. Switch voltage 1407 shows the change over time of the switch voltage value. Voltage value 1408 is the first power-supply voltage value at start time 1401 and shows the sixth voltage value. Voltage value 1409 is the second power-supply voltage value at connection time 1402.

At start time 1401, control circuit 104 causes first voltage source 1101 to apply voltage of voltage value 1408. Control circuit 104 then causes first voltage source 1101 to intermittently apply voltage of voltage value 1408 as shown by voltage value 1404.

Upon application of voltage, measurement circuit 107 measures a parameter and supplies this parameter as output to control circuit 104.

Upon receiving this parameter, control circuit 104 determines whether three-terminal switching element 1100 is in an unstable conductive state or not based on the parameter.

At connection time 1402, control circuit 104 determines that three-terminal switching element 1100 has entered an unstable conductive state.

When three-terminal switching element 1100 has entered an unstable conductive state, control circuit 104 causes first voltage source 1101 to lower the first power-supply voltage. Control circuit 104 further, having caused lowering of the first power-supply voltage, fixes the first power-supply voltage with respect to change over time.

Having lowered the first power-supply voltage, control circuit 104 causes second voltage source 1102 to apply voltage of voltage value 1409.

Control circuit 104 then continues to cause second voltage source 1102 to intermittently apply voltage of voltage value 1409 to program circuit 101 as shown by power-supply voltage 1405.

Upon receiving the parameter from measurement circuit 107 after connection time 1402, control circuit 104 determines whether three-terminal switching element 1100 is in a stable conductive state or not based on the parameter.

At stabilization time 1403, control circuit 104 determines that three-terminal switching element 1100 has attained a stable conductive state. When three-terminal switching element 1100 has attained a stable conductive state, control circuit 104 causes first voltage source 1101 and second voltage source 1102 to halt the application of voltage.

Figure 16:
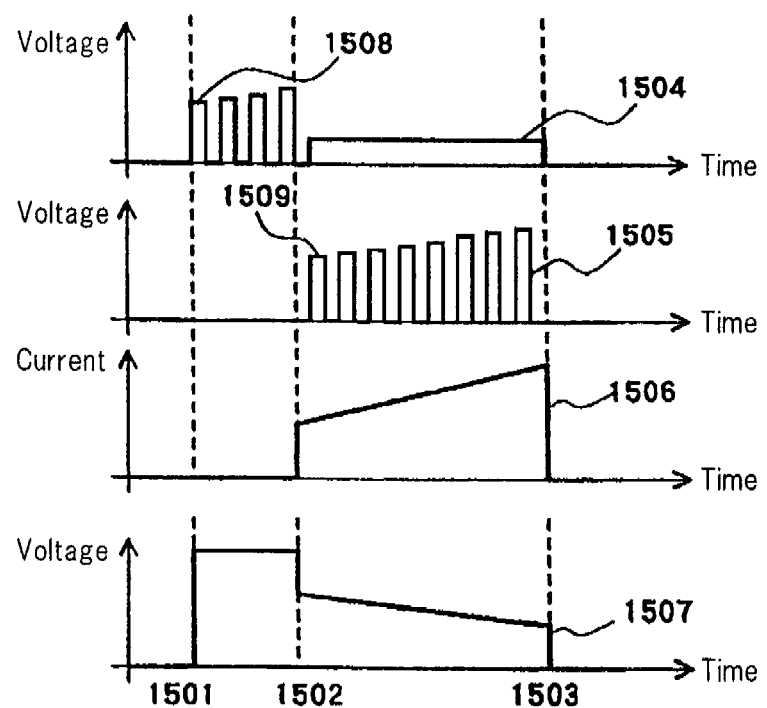
FIG. 16 is a timing chart for explaining another example of the operation of the program circuit for connecting a three-terminal switching element.

FIG. 16 is a timing chart showing the change over time of the first power-supply voltage value, the second power-supply voltage value, the switch current value, and the switch voltage value when control circuit 104 causes voltage source 106 to intermittently generate voltage while increasing the voltage to connect three-terminal switching element 1100.

Start time 1501 is the time that control circuit 104 causes voltage source 106 to start applying voltage. Connection time 1502 is the time that three-terminal switching element 1100 enters an unstable conductive state. Stabilization time 1503 is the time that three-terminal switching element 1100 attains a stable conductive state.

Power-supply voltage 1504 shows the change over time of the first power-supply voltage value. Power-supply voltage 1505 shows the change over time of the second power-supply voltage value. Switch current 1506 shows the change over time of the switch current value. Switch voltage 1507 shows the change over time of the switch voltage value. Voltage value 1508 is the first power-supply voltage value at start time 1501. Voltage value 1509 is the second power-supply voltage value at connection time 1502.

At start time 1501, control circuit 104 causes first voltage source 1101 to apply voltage of voltage value 1508. Control circuit 104 then causes first voltage source 1101 to intermittently apply voltage while increasing the voltage as shown by power-supply voltage 1504.

When voltage is applied, measurement circuit 107 measures a parameter and supplies this parameter as output to control circuit 104.

Upon receiving this parameter, control circuit 104 determines whether three-terminal switching element 1100 has entered an unstable conductive state or not based on the parameter.

At connection time 1502, control circuit 104 determines that three-terminal switching element 1100 has entered an unstable conductive state.

When three-terminal switching element 1100 enters an unstable conductive state, control circuit 104 causes first voltage source 1101 to lower the first power-supply voltage value. After having lowered the first power-supply voltage value, control circuit 104 fixes the first power-supply voltage value with respect to change over time.

Having lowered the first power-supply voltage value, control circuit 104 causes second voltage source 1102 to apply voltage of voltage value 1509.

Control circuit 104 then causes second voltage source 1102 to intermittently apply voltage while increasing the voltage as shown by power-supply voltage 1505.

Upon receiving the parameter from measurement circuit 107 after connection time 1502, control circuit 104 determines whether electrodes 1001 and 1002 of three-terminal switching element 1100 are in a stable conductive state or not based on the parameter.

At stabilization time 1503, control circuit 104 determines that three-terminal switching element 1100 has attained a stable conductive state. When three-terminal switching element 1100 has attained a stable conductive state, control circuit 104 causes first voltage source 1101 and second voltage source 1102 to halt the application of voltage.

In the present embodiment, three-terminal switching element 1100 includes electrode 1001, electrode 1002 formed of a metal with a lower ionization tendency than electrode 1001, and gate electrode 1003. Control circuit 104 causes voltage source 106 to apply voltage such that the potential of electrode 1001 becomes lower than the potential of electrode 1002, and when three-terminal switching element 1100 becomes conductive, control circuit 104 causes voltage source 106 to lower the voltage applied across electrodes 1001 and 1002, and moreover, causes voltage source 106 to apply a voltage such that the potential of gate electrode 1003 is higher than the potential of electrodes 1001 and 1002 across gate electrode 1003 and electrode 1001 or 1002. When the three-terminal switching element attains a stable conductive state, control circuit 104 then causes voltage source 1001 to halt the application of voltage.

When voltage is applied across electrodes 1001 and 1002 after electrical conduction is established between electrodes 1001 and 1002, a high current flows in three-terminal switching element 1100. The flow of high current flows in three-terminal switching element 1100 causes exhaustion of three-terminal switching element 1100.

To prevent the flow of a high current in switching element 1100, the voltage that is applied across electrodes 1001 and 1002 must be lowered. However, lowering the voltage applied across electrodes 1001 and 1002 raises the possibility that the metal dendrite that connects electrodes 1001 and 1002 will not increase in size.

In the case of the present embodiment, the voltage applied to electrodes 1001 and 1002 is lowered when three-terminal switching element 1100 attains a conductive state and a voltage such that the potential of the gate electrode is higher than the potential of electrode 1001 and electrode 1002 is applied across gate electrode 1003 and electrode 1001 or electrode 1002.

Figure 17A:
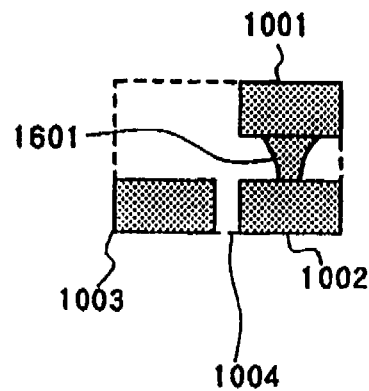
FIG. 17A is a sectional view showing a three-terminal switching element in a stable conductive state.
Figure 17B:
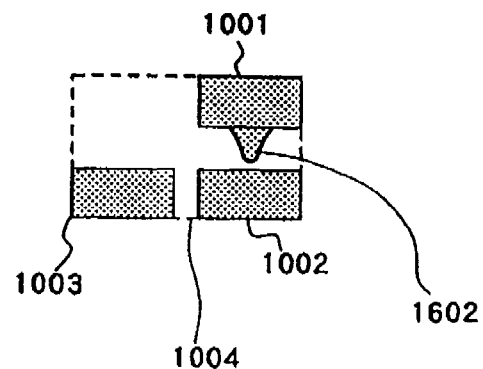
FIG. 17B is a sectional view showing a three-terminal switching element in an unstable isolated state.
Figure 17C:
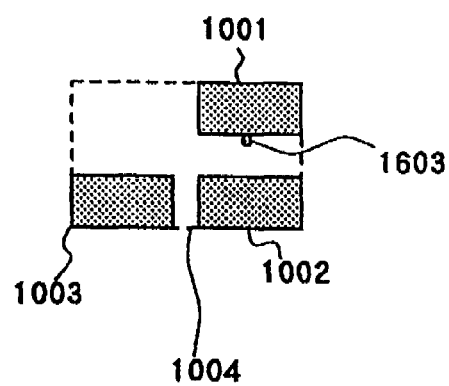
FIG. 17C is a sectional view showing a three-terminal switching element in a stable isolated state.

As a result, the current that flows between electrodes 1001 and 1002 is reduced, and moreover, the metal dendrite that connects electrode 1001 and electrode 1002 can be made larger. The current that flows in three-terminal switching element 1100 can thus be reduced and three-terminal switching element 1100 can be placed in a stable conductive state, thereby enabling a mitigation of the exhaustion of three-terminal switching element 1100. Explanation next regards disconnection of a three-terminal switching element. FIGS. 17A to 17C are sectional views showing a three-terminal switching element. Items in FIGS. 17A to 17C that are identical to FIGS. 11A to 11C are given the same reference numbers.

FIG. 17A is a sectional view showing the three-terminal switching element in a stable conductive state. In FIG. 17A, the three-terminal switching element includes electrodes 1001 and 1002, gate electrode 1003, electrolytic material 1004, and metal dendrite 1601.

In the three-terminal switching element shown in FIG. 17A, electrodes 1001 and 1002 are stably connected by metal dendrite 1601, similar to the three-terminal switching element shown in FIG. 13C. In other words, electrodes 1001 and 1002 are not electrically isolated despite slight oxidation of metal dendrite 1601.

When the first disconnection voltage for disconnecting the three-terminal switching element is applied across gate electrode 1003 and electrode 1001 or 1002, the three-terminal switching element is disconnected. The first disconnection voltage is a voltage such that the potential of gate electrode 1003 becomes lower than the potential of electrodes 1001 and 1002, the value of the first disconnection voltage being at least a threshold value voltage.

The following explanation presents the specifics of the disconnection of a three-terminal switching element. In the following explanation, the first disconnection voltage is assumed to be applied to electrode 1002 and gate electrode 1003.

When the first disconnection voltage is applied across electrode 1002 and gate electrode 1003, electrons are emitted from electrodes 1001 and 1002 to each of the voltage source (not shown) that applies potential to electrode 1001 and the voltage source (not shown) that applies potential to electrode 1002.

When electrons are released from electrodes 1001 and 1002, electrons are released from metal dendrite 1601 that connects electrodes 1001 and 1002.

When electrons are released from metal dendrite 1601, metal dendrite 1601 becomes metal ions and thus dissolves into electrolytic material 3.

With the continued application of the disconnection voltage across electrodes 1002 and gate electrode 1003, metal dendrite 701 is gradually dissolved, and electrodes 1001 and 1002 are electrically isolated.

FIG. 17B is a sectional view showing the three-terminal switching element in an unstable isolated state. In FIG. 17B, the three-terminal switching element includes electrodes 1001 and 1002, gate electrode 1003, electrolytic material 1004, and metal dendrite 1602.

Metal dendrite 1602 is not connected to electrode 1002. In other words, electrodes 1001 and 1002 are electrically isolated.

However, when metal dendrite 1602 is even slightly reduced in the state immediately following the isolation of electrodes 1001 and 1002, the three-terminal switching element enters a conductive state.

When the first disconnection voltage is applied across electrode 1002 and gate electrode 1003 after the three-terminal switching element has entered an unstable isolated state, metal dendrite 1602 becomes smaller and electrodes 1001 and 1002 enter a stable isolated state.

After a three-terminal switching element has entered an unstable isolated state, electrodes 1001 and 1002 are electrically isolated, and a large current therefore does not flow in the three-terminal switching element despite the application of voltage to electrodes 1001 and 1002. As a result, the first disconnection voltage may be applied across electrodes 1001 and 1002 after the three-terminal switching element has entered an unstable isolated state.

When voltage is applied across electrodes 1001 and 1002 after the three-terminal switching element has entered an unstable isolated state, metal dendrite 1602 becomes smaller and electrodes 1001 and 1002 therefore attain a stabilized isolated state.

FIG. 17C is a sectional view showing the three-terminal switching element in a stable isolated state. In FIG. 17C, the three-terminal switching element includes electrodes 1001 and 1002, gate electrode 1003, electrolytic material 1004, and metal dendrite 1603.

Metal dendrite 1603 is small, and electrodes 1001 and 1002 therefore do not enter a conductive state despite slight reduction of metal dendrite 1603.

The following explanation regards a program circuit capable of disconnecting a three-terminal switching element. The program circuit capable of disconnecting a three-terminal switching element is identical to program circuit 101 shown in FIG. 12. The following explanation chiefly regards operations that differ from the operations of program circuit 101 that was explained when connecting a three-terminal switching element.

In FIG. 12, when disconnecting three-terminal switching element 1100, control circuit 104 causes first voltage source 1101 to apply a measurement voltage for measuring a parameter to three-terminal switching element 1100. The value of the measurement voltage is preferably lower than the value of the threshold value voltage.

Control circuit 104 further causes second voltage source 1102 to apply a second power-supply voltage such that the first disconnection voltage is applied across electrode 1002 and gate electrode 1003 of three-terminal switching element 1100.

The three-terminal disconnection methods by which control circuit 104 causes voltage source 106 to apply voltage to disconnect three-terminal switching element 1100 include: a method for causing the application of voltage of a seventh voltage value, a method of causing the application of voltage while increasing the voltage, a method of causing the intermittent application of voltage of an eighth voltage value, and a method of causing the intermittent application of voltage while increasing the voltage.

Upon receiving a parameter from measurement circuit 107, control circuit 104 determines whether three-terminal switching element 1100 has entered an unstable isolated state or not based on the parameter.

When three-terminal switching element 1100 is in an unstable isolated state, control circuit 104 checks the reference time stored in reference time memory unit 124.

On the other hand, when three-terminal switching element 1100 is not in an unstable isolated state, control circuit 104 continues to cause second voltage source 1102 to apply voltage to program circuit 101.

Control circuit 104, having checked the reference time, both causes second voltage source 1102 to halt the application of voltage to program circuit 101 and causes first voltage source 1101 to apply the first power-supply voltage to program circuit 101 such that the first disconnection voltage is applied across electrodes 1001 and 1002 of three-terminal switching element 1100.

When causing first voltage source 1101 to apply the first power-supply voltage, control circuit 104 continues to cause first voltage source 1101 to apply the first power-supply voltage until the passage of the reference time.

When the reference time has elapsed, control circuit 104 causes first voltage source 1101 to halt the application of voltage to program circuit 101.

Explanation next regards the operations of the program circuit for disconnecting a three-terminal switching element for each of the three-terminal disconnection methods.

FIGS. 18A to 19B are timing charts for explaining the operations of the program circuit for disconnecting a three-terminal switching element. In FIGS. 18A to 19B, three-terminal switching element 1100 prior to the application is in a stable conductive state. The voltage applied to three-terminal switching element 1100 is the first disconnection voltage.

Figure 18A:
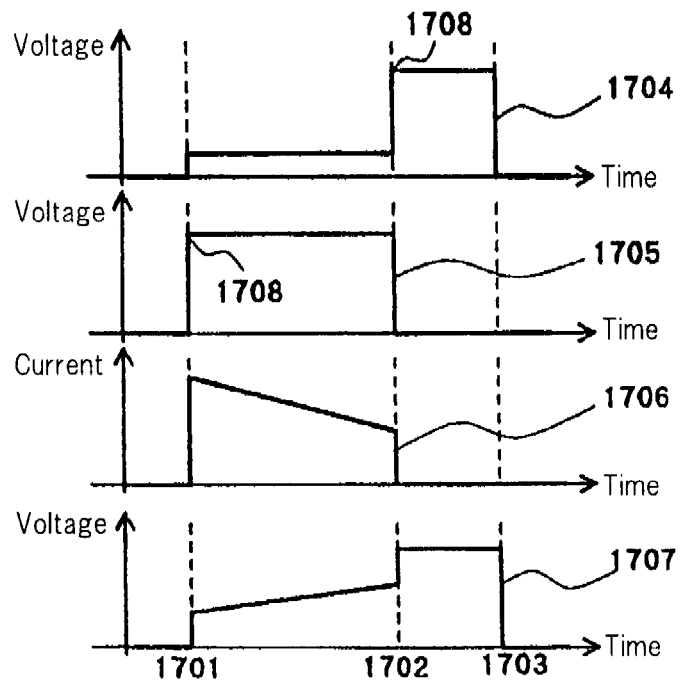
FIG. 18A is a timing chart for explaining an example of the operation of a program circuit for disconnecting a three-terminal switching element.

FIG. 18A is a timing chart showing the change over time of the first power-supply voltage value, the second power-supply voltage value, the switch current value, and the switch voltage value when control circuit 104 causes voltage source 106 to generate voltage of the seventh voltage value to disconnect three-terminal switching element 1100.

Start time 1701 is the time at which control circuit 104 causes the voltage source to begin application of voltage. Disconnection time 1702 is the time that three-terminal switching element 1100 enters an unstable isolated state. Stabilization time 1703 is the time that three-terminal switching element 1100 attains a stable isolated state.

Power-supply voltage 1704 shows the change over time of the first power-supply voltage value. Power-supply voltage 1705 shows the change over time of the second power-supply voltage value. Switch current 1706 shows the change over time of the switch current value. Switch voltage 1707 shows the change over time of the switch voltage value. Voltage value 1708 is the second power-supply voltage value at start time 1701, and shows the seventh voltage value.

At start time 1701, control circuit 104 causes second voltage source 1102 to apply voltage of voltage value 1708. Control circuit 104 further causes first voltage source 1101 to apply the measurement voltage.

When voltage is applied, measurement circuit 107 measures a parameter and supplies this parameter as output to control circuit 104.

Upon receiving the parameter, control circuit 104 determines whether three-terminal switching element 1100 has entered an unstable isolated state or not based on the parameter.

At disconnection time 1702, control circuit 104 determines that three-terminal switching element 1100 is in an unstable isolated state. When three-terminal switching element 1100 enters an unstable isolated state, control circuit 104 checks the reference time stored in reference time memory unit 124.

Having checked the reference time, control circuit 104 both causes second voltage source 1102 to halt the application of voltage and causes first voltage source 1101 to apply voltage of voltage value 1708 such that the first disconnection voltage is applied across electrodes 1001 and 1002 of three-terminal switching element 1100.

After the passage of the reference time, or in other words, upon reaching stabilization time 1703, control circuit 104 causes first voltage source 1101 to halt the application of voltage.

Figure 18B:
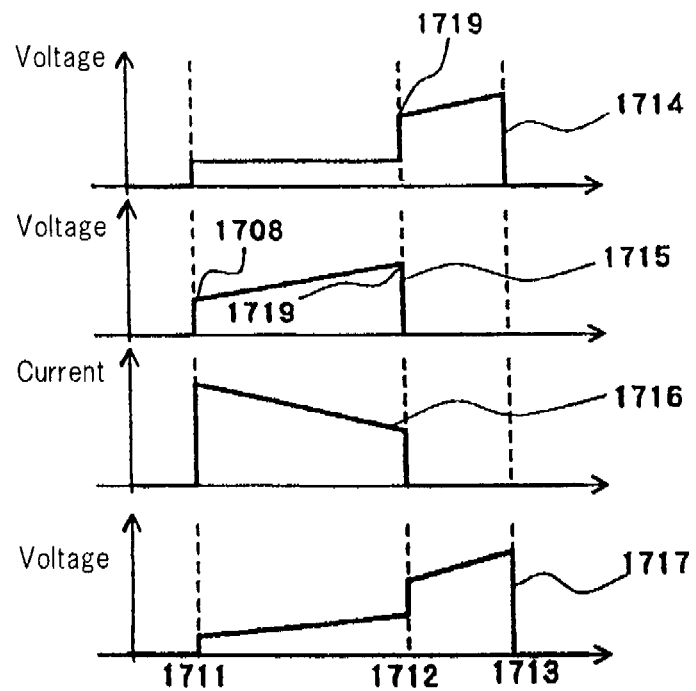
FIG. 18B is a timing chart for explaining another example of the operation of a program circuit for disconnecting a three-terminal switching element.

FIG. 18B is a timing chart showing the change over time of the first power-supply voltage value, the second power-supply voltage value, the switch current value, and the switch voltage value when control circuit 104 causes voltage source 106 to generate voltage while increasing the voltage to disconnect three-terminal switching element 1100.

Start time 1711 is the time that control circuit 104 starts the application of voltage. Disconnection time 1712 is the time that three-terminal switching element 1100 enters an unstable isolated state. Stabilization time 1713 is the time that three-terminal switching element 1100 attains a stable isolated state. Power-supply voltage 1714 shows the change over time of the first power-supply voltage value. Power-supply voltage 1715 shows the change over time of the second power-supply voltage value. Switch current 1716 shows the change over time of the switch current value. Switch voltage 1717 shows the change over time of the switch voltage value. Voltage value 1718 is the second power-supply voltage value at start time 1711. Power-supply voltage 1719 is the first power-supply voltage value at disconnection time 1712.

At start time 1711, control circuit 104 causes second voltage source 1102 to apply voltage of voltage value 1708. In addition, control circuit 104 causes first voltage source 1101 to apply the measurement voltage.

Control circuit 104 then causes second voltage source 1102 to apply voltage to program circuit 101 while increasing the voltage.

When voltage is applied, measurement circuit 107 measures a parameter and supplies this parameter as output to control circuit 104.

Upon receiving the parameter, control circuit 104 determines whether three-terminal switching element 1100 has entered an unstable isolated state or not based on the parameter.

At disconnection time 1712, control circuit 104 determines that three-terminal switching element 1100 has entered an unstable isolated state. When three-terminal switching element 1100 has entered an unstable isolated state, control circuit 104 checks the reference time stored in reference time memory unit 124. Having checked the reference time, control circuit 104 both causes second voltage source 1102 to halt the application of voltage and causes first voltage source 1101 to apply voltage of voltage value 1718 such that the first disconnection voltage is applied to the three-terminal switching element.

Upon passage of the reference time interval, or in other words, upon reaching stabilization time 1713, control circuit 104 causes first voltage source 1101 to halt the application of voltage.

Figure 19A:
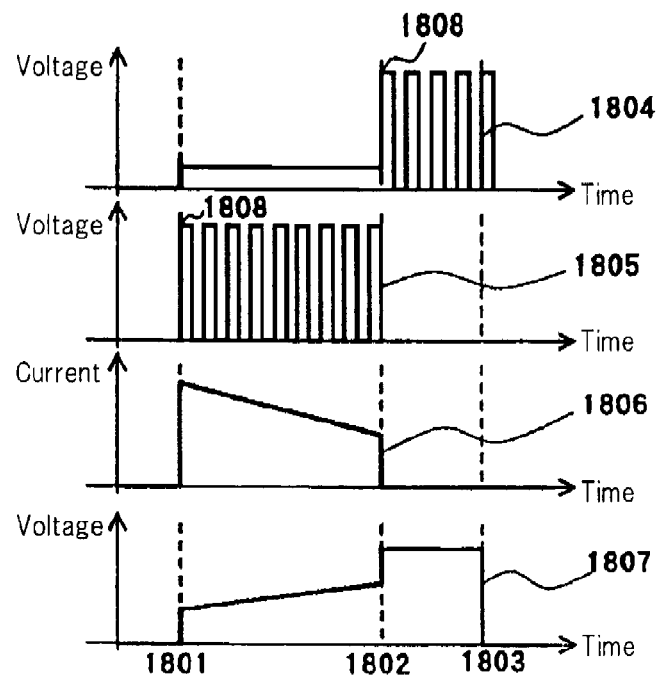
FIG. 19A is a timing chart for explaining another example of the operation of a program circuit for disconnecting a three-terminal switching element.

FIG. 19A is a timing chart showing the change over time of the first power-supply voltage value, the second power-supply voltage value, the switch current value, and the switch voltage value when control circuit 104 causes voltage source 106 to intermittently generate voltage of an eighth voltage value to disconnect three-terminal switching element 1100.

Start time 1801 is the time at which control circuit 104 causes voltage source 106 to start application of voltage. Disconnection time 1802 is the time that three-terminal switching element 1100 enters an unstable isolated state. Stabilization time 1803 is the time that three-terminal switching element 1100 attains a stable isolated state.

Power-supply voltage 1804 shows the change over time of the first power-supply voltage value. Power-supply voltage 1805 shows the change over time of the second power-supply voltage value. Switch current 1806 shows the change over time of the switch current value. Switch voltage 1807 shows the change over time of the switch voltage value. Voltage value 1808 is the second power-supply voltage value at start time 1801 and shows the eighth voltage value.

At start time 1801, control circuit 104 causes second voltage source 1102 to apply a voltage of voltage value 1808. Control circuit 104 further causes first voltage source 1101 to apply the measurement voltage.

Control circuit 104 then continues to cause second voltage source 1102 to intermittently apply voltage of voltage value 1808 as shown by power-supply voltage 1805.

When voltage is applied to program circuit 101, measurement circuit 107 measures a parameter and supplies this parameter as output to control circuit 104.

Upon receiving the parameter, control circuit 104 determines whether three-terminal switching element 1100 is in an unstable isolated state or not based on the parameter.

If three-terminal switching element 1100 is not in an unstable isolated state, control circuit 104 causes second voltage source 1102 to intermittently apply voltage of voltage value 1808.

At disconnection time 1802, control circuit 104 determines that three-terminal switching element 1100 has entered an unstable isolated state. When three-terminal switching element 1100 has entered an unstable isolated state, control circuit 104 checks the reference time stored in reference time memory unit 124. Control circuit 104, having checked the reference time, both causes second voltage source 1102 to halt application of voltage and causes first voltage source 1101 to apply voltage of voltage value 1808 such that the first disconnection voltage is applied to electrodes 1001 and 1002 of three-terminal switching element 1100.

Control circuit 104 then continues to cause first voltage source 1101 to intermittently apply voltage of voltage value 1808 to program circuit 101.

Upon passage of the reference time, or in other words, upon reaching stabilization time 1803, control circuit 104 causes first voltage source 1101 to halt the application of voltage.

Figure 19B:
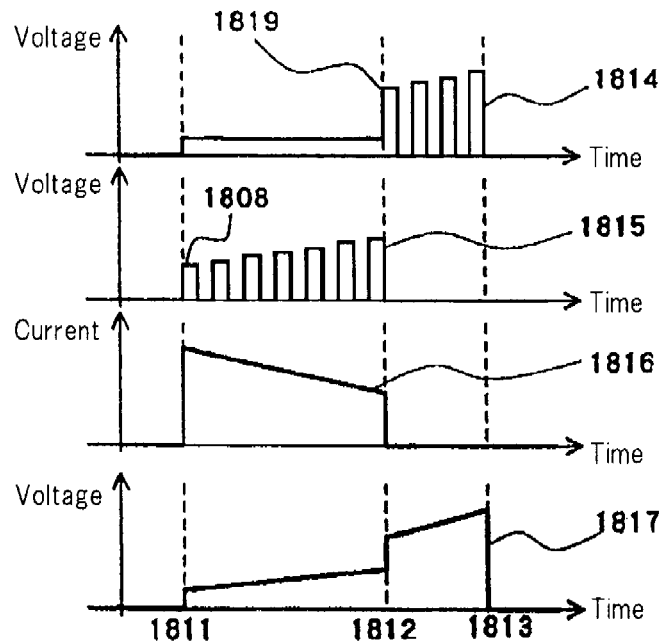
FIG. 19B is a timing chart for explaining another example of the operation of a program circuit for disconnecting a three-terminal switching element.

FIG. 19B is a timing chart showing the change over time of the first power-supply voltage value, the second power-supply voltage value, the switch current value, and the switch voltage value when control circuit 104 causes voltage source 106 to intermittently apply voltage while increasing the voltage to disconnect three-terminal switching element 1100.

Start time 1811 is the time that control circuit 104 causes voltage source 106 to start applying voltage. Disconnection time 1812 is the time that three-terminal switching element 1100 enters an unstable isolated state. Stabilization time 1813 is the time that three-terminal switching element 1100 attains a stable isolated state.

Power-supply voltage 1814 shows the change over time of the first power-supply voltage value. Power-supply voltage 1815 shows the change over time of the second power-supply voltage value. Switch current 1816 shows the change over time of the switch current value. Switch voltage 1817 shows the change over time of the switch voltage value. Voltage value 1818 is the second power-supply voltage value at start time 1811. Voltage value 1819 is the second power-supply voltage value at disconnection time 1812.

At start time 1811, control circuit 104 causes second voltage source 1102 to apply voltage of voltage value 1818. Control circuit 104 further causes first voltage source 1101 to apply the measurement voltage.

Control circuit 104 then causes second voltage source 1102 to intermittently apply voltage while increasing the voltage as shown by power-supply voltage 1815.

When voltage is applied to program circuit 101, measurement circuit 107 measures a parameter and supplies this parameter as output to control circuit 104.

Upon receiving the parameter, control circuit 104 determines whether three-terminal switching element 1100 has entered an unstable isolated state or not based on the parameter.

If three-terminal switching element 1100 is not in an unstable isolated state, control circuit 104 causes second voltage source 1102 to intermittently apply voltage while increasing the voltage.

At disconnection time 1812, control circuit 104 determines that three-terminal switching element 1100 has entered an unstable isolated state. When three-terminal switching element 1100 has entered unstable isolated state, control circuit 104 checks the reference time stored in reference time memory unit 124. Having checked the reference time, control circuit 104 both causes second voltage source 1102 to halt application of voltage and causes first voltage source 1101 to apply voltage of voltage value 1818 such that the first disconnection voltage is applied across electrodes 1001 and 1002 of three-terminal switching element 1100.

Control circuit 104 then causes first voltage source 1101 to intermittently apply voltage while increasing the voltage.

When the reference time interval has elapsed, or in other words, when stabilization time 1813 has arrived, control circuit 104 causes first voltage source 1101 to halt the application of voltage.

In the present embodiment, control circuit 104 causes the application of voltage across gate electrode 1003 and electrode 1001 or 1002 such that the potential of gate electrode 1003 of three-terminal switching element 1100 is lower than the potential of electrodes 1001 and 1002. Then, after the passage of the reference time that is stored in the reference time memory unit from the isolation of three-terminal switching element 1100, control circuit 104 causes voltage source 106 to halt the application of voltage.

In this case, voltage is applied across gate electrode 1003 and electrode 1001 or 1002 and three-terminal switching element 1100 is isolated, whereby the current that flows in three-terminal switching element 1100 can be reduced. As a result, exhaustion of three-terminal switching element 1100 can be mitigated. Explanation next regards a program circuit for applying current to a switching element to control the resistance value of the switching element. The following explanation chiefly regards construction and operations that differ from the program circuit for applying voltage to a switching element to control the resistance value of the switching element.

The program circuit for applying current to a switching element to control the resistance value of the switching element is a circuit that includes a current source in place of voltage source 106 of program circuit 101 shown in FIG. 2 or FIG. 12.

In this case, control circuit 104 causes the current source to apply current to a switching element (switching element 100 or three-terminal switching element 1100) to control the resistance value of the switching element.

Upon receiving a parameter from measurement circuit 107, control circuit 104 determines whether the parameter has attained a prescribed value.

For example, upon receiving a switch voltage value from voltage measurement circuit 110, control circuit 104 determines whether the switch voltage value is the reference voltage value or not.

If the received parameter has attained the prescribed value, control circuit 104 causes the current source to halt application of current to program circuit 101. The current connection methods by which control circuit 104 causes the current source to apply current to connect the switching element include: a method of causing the application of current of a first current value, a method of causing the application of current while increasing the current, a method of causing the intermittent application of current of a second current value, and a method of causing the intermittent application of current while increasing the current.

In addition, current disconnection methods by which control circuit 104 causes a current source to apply current to disconnect switching element 100 include: a method of causing application of a current of a third current value, a method of causing application of a current while increasing the current, a method of causing intermittent application of a current of a fourth current value, and a method of causing intermittent application of a current while increasing the current.

In addition, three-terminal current connection methods by which control circuit 104 causes a current source to apply a current to connect three-terminal switching element 1100 include: a method of causing application of a current of a fifth current value, a method of causing application of a current while increasing the current, a method of causing intermittent application of a current of a sixth current value, and a method of causing intermittent application of a current while increasing the current.

Still further, three-terminal current disconnection methods by which control circuit 104 causes a current source to apply a current to disconnect three-terminal switching element 1100 include: a method of causing application of a current of a seventh current value, a method of causing application of a current while increasing the current, a method of causing intermittent application of a current of an eighth current value, and a method of causing intermittent application of a current while increasing the current.

According to the present embodiment, a current source applies a current to electrodes 1 and 2 of switching element 100. Measurement circuit 107 measures a parameter of switching element 100. Control circuit 104 causes the current source to progressively increase the current applied across electrodes 1 and 2 of switching element 100 until the parameter measured by measurement circuit 107 reaches a prescribed value. Control circuit 104 further causes the current source to halt application of current when the parameter measured by measurement circuit 107 reaches a prescribed value.

Controlling the resistance value of a switching element by the application of voltage raises the possibility of the flow of an extremely high current (for example, a current high enough to damage the switching element).

According to the above-described invention, current is applied across electrodes 1 and 2 of switching element 100 while increasing the current. When a parameter reaches a prescribed value, application of the voltage is halted.

As a result, the possibility of the flow of an extremely high current in switching element 100 can be reduced. In addition, when switching element 100 is not exhausted, the resistance value of switching element 100 can be controlled by a low current. On the other hand, when switching element 100 is exhausted, the resistance value of switching element 100 can be controlled by a high current. Accordingly, the exhaustion of switching element 100 can be mitigated. In the present embodiment, a current source applies current to electrodes 1 and 2 of switching element 100. Measurement circuit 107 measures a parameter of switching element 100. Control circuit 104 causes the current source to intermittently apply current across electrodes 1 and 2 of switching element 100 until the parameter measured by measurement circuit 107 reaches a prescribed value. In addition, control circuit 104 causes current source to halt the application of current when the parameter measured by measurement circuit 107 reaches a prescribed value.

In this case, current is intermittently applied across electrodes 1 and 2 of switching element 100. As a result, the potential for the flow of an extremely high current to switching element 100 can be reduced. In addition, the heat of switching element 100 resulting from Joule heat can be reduced. Accordingly, the exhaustion of switching element 100 can be mitigated.

Explanation next regards a programmable logic circuit that uses a switching element.

Figure 20A:
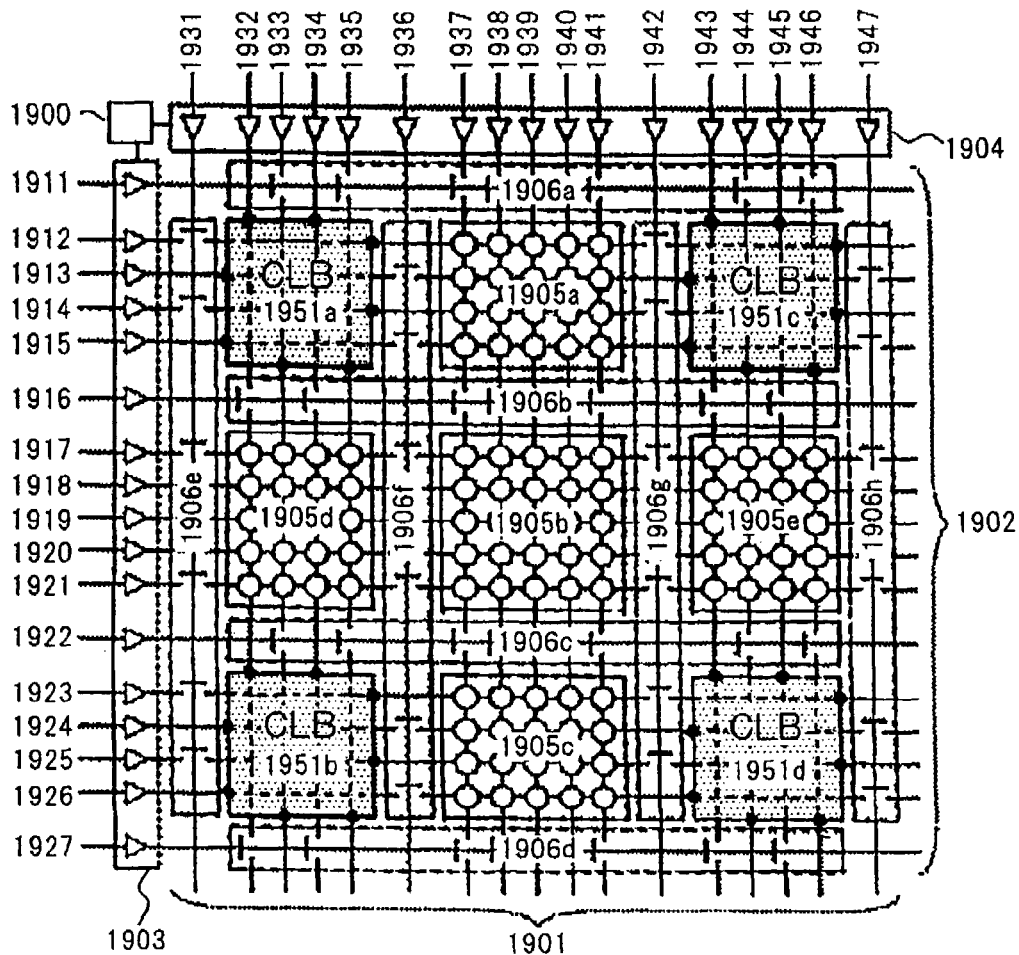
FIG. 20A is a circuit diagram showing an example of a logic circuit that can be programmed using a switching element.

FIG. 20A is a circuit diagram showing an example of programmable logic circuit that uses switching elements.

In FIG. 20A, a semiconductor integrated circuit includes control circuit 1900, interconnect group 1901 and interconnect group 1902, drive circuits 1903 and 1904, cross-bus switches 1905a to 1905e, segment-separation switches 1906a to 1906h, and CLBs 1951a to 1951d.

Control circuit 1900 has functions equivalent to control circuit 104 shown in FIG. 2A or FIG. 12.

Interconnect groups 1901 and 1902 each include a plurality of interconnects.

Interconnect group 1901 includes interconnects 1911 to 1927.

Interconnect group 1902 includes interconnects 1931 to 1947.

Interconnects 1911 to 1927 are arranged in a horizontal direction; and interconnects 1931 to 1947 are arranged in a vertical direction.

Switching elements are arranged at the intersections of interconnect groups 1911 and 1902.

Figure 20B:
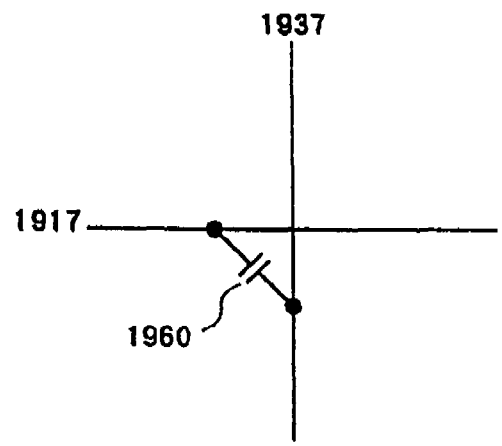
FIG. 20B is a circuit diagram showing a two-terminal switching element arranged at the intersection of interconnects.
Figure 20C:
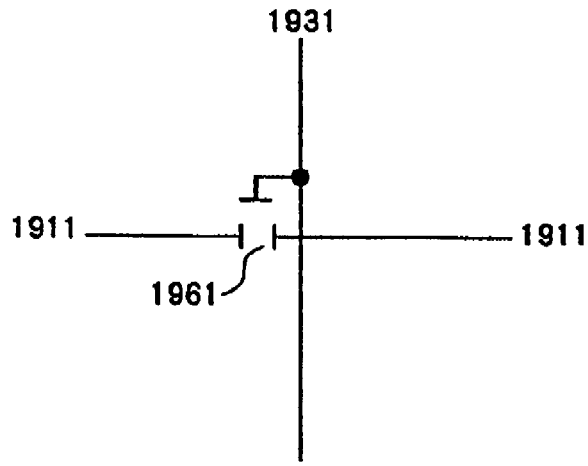
FIG. 20C is a circuit diagram showing a three-terminal switching element arranged at the intersection of interconnects.

FIGS. 20B and 20C show a switching element arranged at an intersection.

FIG. 20B is a circuit diagram showing a two-terminal switching element arranged at an intersection. In FIG. 20B, a semiconductor integrated circuit includes interconnects 1917 and 1937 and two-terminal switching element 1960.

Interconnects 1917 and 1937 are connected when two-terminal switching element 1960 is conductive, and interconnects 1917 and 1937 are disconnected when two-terminal switching element 1960 is isolated.

FIG. 20C is a circuit diagram showing a three-terminal switching element arranged at an intersection. In FIG. 20C, a semiconductor integrated circuit includes interconnects 1911 and 1931 and three-terminal switching element 1961.

Interconnect 1911 is connected to gate electrode 1003 of three-terminal switching element 1961, and interconnect 1931 is connected to electrodes 1001 and 1002 of three-terminal switching element 1961.

When three-terminal switching element 1961 is conductive, interconnect 1911 is connected, and when three-terminal switching element 1961 is isolated, interconnect 1911 is disconnected.

Drive circuits 1903 and 1904 have functions equivalent to drive circuit 102 of program circuit 101 shown in FIG. 2A or FIG. 12.

Drive circuits 1903 and 1904 are controlled by control circuit 1900 and apply voltage to each interconnect included in interconnect groups 1901 and 1902. In addition, drive circuits 1903 and 1904 measure parameters of the switching elements arranged at the intersections of interconnects.

Cross-bus switches 1905a to 1905e are formed of switching elements arranged at the intersections of interconnect groups 1901 and 1902.

More specifically, cross-bus switches 1905a to 1905e are each formed by switching elements arranged at the intersections of interconnects 1912 to 1915 and interconnects 1937 to 1941, the intersections of interconnects 1917 to 1921 and interconnects 1937 to 1941, the intersections of interconnects 1923 to 1926 and interconnects 1937 to 1941, the intersections of interconnects 1917 to 1921 and interconnects 1932 to 1935, and the intersections of interconnects 1917 to 1921 and interconnects 1943 to 1946.

The switching elements that form cross-bus switches 1905a to 1905e may be either of two-terminal switching elements and three-terminal switching elements. In the following explanation, the switching elements that form cross-bus switches 1905a to 1905e are assumed to be two-terminal switching elements. Electrodes 1 of the switching elements that form cross-bus switches 1905a to 1905e are connected to each interconnect of interconnect group 1901, and electrodes 2 of the switching elements are connected to each interconnect of interconnect group 1902. Electrodes 1 of switching elements that make up cross-bus switches 1905a to 1905e may be connected to each interconnect of interconnect group 1902, and electrodes 2 of the switching elements may be connected to each interconnect of interconnect group 1901.

Segment-separation switches 1906a to 1906h are formed by switching elements arranged at the intersections of interconnects arranged horizontally and vertically.

More specifically, segment-separation switches 1906a to 1906h are formed by switching elements arranged at the intersections of interconnect 1911 and interconnects 1932 to 1946, the intersections of interconnect 1916 and interconnects 1932 to 1946, the intersections of interconnect 1922 and interconnects 1932 to 1946, the intersections of interconnect 1927 and interconnects 1932 to 1946, the intersections of interconnect 1912 to 1926 and interconnect 1931, the intersections of interconnect 1912 to 1926 and interconnect 1936, the intersections of interconnect 1912 to 1926 and interconnect 1942, and the intersections of interconnects 1912 to 1926 and interconnect 1947.

The switching elements that form segment-separation switches 1906a to 1906h are preferably three-terminal switching elements. In the following explanation, segment-separation switches 1906a to 1906h are assumed to be formed by three-terminal switching elements.

In segment-separation switches 1906a to 1906h, the interconnects connected to gate electrode 1003 are interconnects 1911, 1916, 1922, 1927, 1931, 1936, 1942, and 1947.

For example, in segment-separation switch 1906e, interconnect 1912 is connected to electrodes 1001 and 1002, and interconnect 1931 is connected to gate electrode 1003. When electrodes 1001 and 1002 of segment-separation switch 1906e are connected, interconnect 1912 is connected, and when electrodes 1001 and 1002 are conductive, interconnect 1912 is disconnected. CLB 1951a to 1951d are Configurable Logic Blocks.

Control circuit 1900 controls drive circuits 1903 and 1904, and CLB 1951a to 1951d are programmed by connecting or disconnecting the switching elements that form cross-bus switches 1905a to 1905e and segment-separation switches 1906a to 1906h.

Explanation next regards the operations by which control circuit 1900 controls drive circuits 1903 and 1904 to program CLB 1951a to 1951d.

For example, control circuit 1900 first causes drive circuits 1903 and 1904 to apply voltage to segment-separation switches 1906a to 1906 to place all of segment-separation switches 1906a to 1906h in a stable conductive state. Control circuit 1900 next causes drive circuits 1903 and 1904 to apply voltage to cross-bus switches 1905a to 1905e to place all of cross-bus switches 1905a to 1905e in a stable isolated state.

Control circuit 1900 further causes drive circuits 1903 and 1904 to apply voltage to cross-bus switches 1905*a* to 1905*e* to place prescribed switching elements contained in cross-bus switches 1905*a* to 1905*e* in a stable conductive state.

Finally, control circuit 1900 causes drive circuits 1903 and 1904 to apply voltage to segment-separation switches 1906*a* to 1906*h* to place specific switching elements contained in segment-separation switches 1906*a* to 1906*h* in a stable isolated state.

Figure 21:
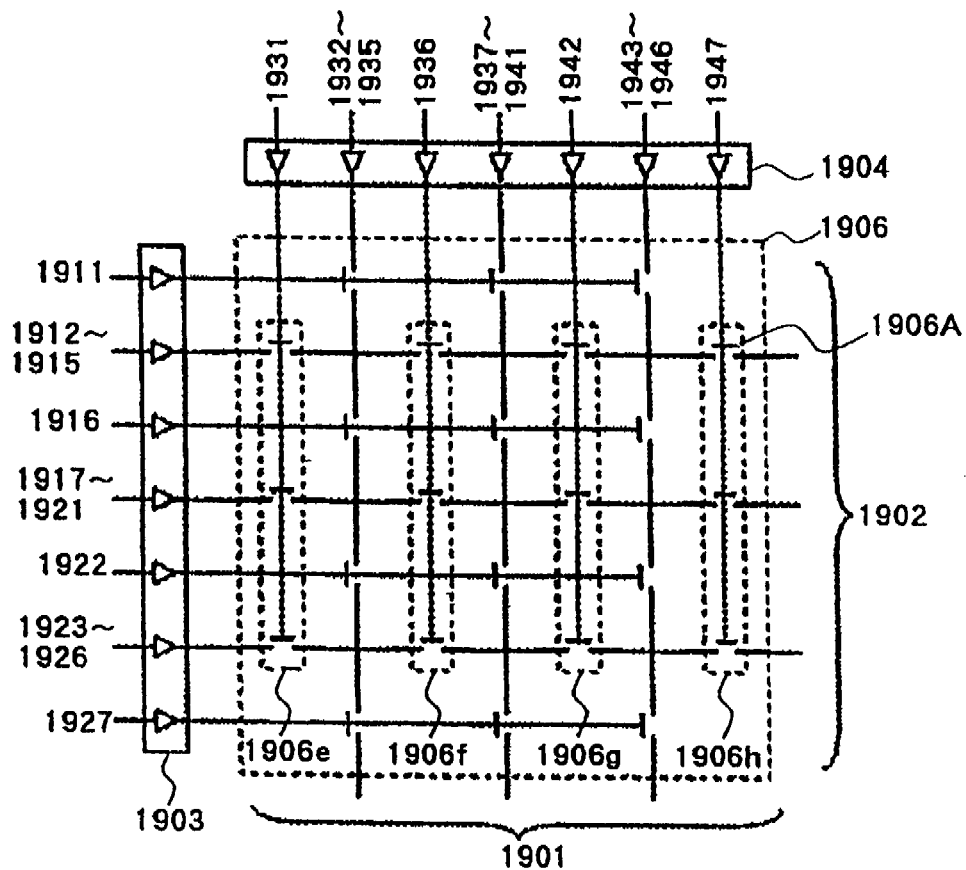
FIG. 21 is a circuit diagram for explaining an example of the operation of a logic circuit that can be programmed.

Explanation first regards the operations by which control circuit 1900 places all of segment-separation switches 1906*a* to 1906*h* in a stable conductive state. FIG. 21 is a view for explaining the program of segment-separation switches 1906*a* to 1906*h*. In FIG. 21, components that are identical to FIG. 20 are given the same reference numbers.

In FIG. 21, a semiconductor integrated circuit includes interconnect groups 1901 and 1902, drive circuits 1903 and 1904, and segment-separation switches 1906*e* to 1906*h*.

When segment-separation switches 1906*e* to 1906*h* are all placed in a stable conductive state, control circuit 1900 causes drive circuits 1903 and 1904 to ground interconnects 1912 to 1915, 1917 to 1921, and 1923 to 1926 and to apply voltage to interconnect 1931. The potential applied to interconnect 1931 is assumed to be higher than the potential of grounded interconnects.

When voltage is applied to interconnect 1931, metal dendrite is deposited at electrode 1001 of each three-terminal switching element of segment-separation switch 1906*e*, following which each three-terminal switching element of segment-separation switch 1906*e* enters a stable conductive state.

Control circuit 1900 then carries out the same process in order from segment-separation switch 1906*f* to 1906*h*, and places each three-terminal switching element of segment-separation switches 1906*f* to 1906*h* in a stable conductive state. Control circuit 1900 further carries out a process similar to the process of placing segment-separation switches 1906*e* to 1906*h* in a stable conductive state to place segment-separation switches 1906*a* to 1906*d* in a stable conductive state.

Explanation next regards the programming method for placing all of cross-bus switches 1905*a* to 1905*e* in a stable isolated state. In the following explanation, it is assumed that in the switching elements that form cross-bus switches 1905*a* to 1905*e*, electrodes 1 having a low ionization tendency are connected to interconnect group 1901 and electrodes 2 having a high ionization tendency are connected to interconnect group 1902.

In this case, control circuit 1900 causes drive circuits 1903 and 1904 to apply voltage to interconnect groups 1901 and 1902 such that the connection voltage is applied to each switching element of cross-bus switches 1905*a* to 1905*e*. When the connection voltage is applied to the switching elements, all of the switching elements of cross-bus switches 1905*a* to 1905*e* enter the stable isolated state.

Figure 22:
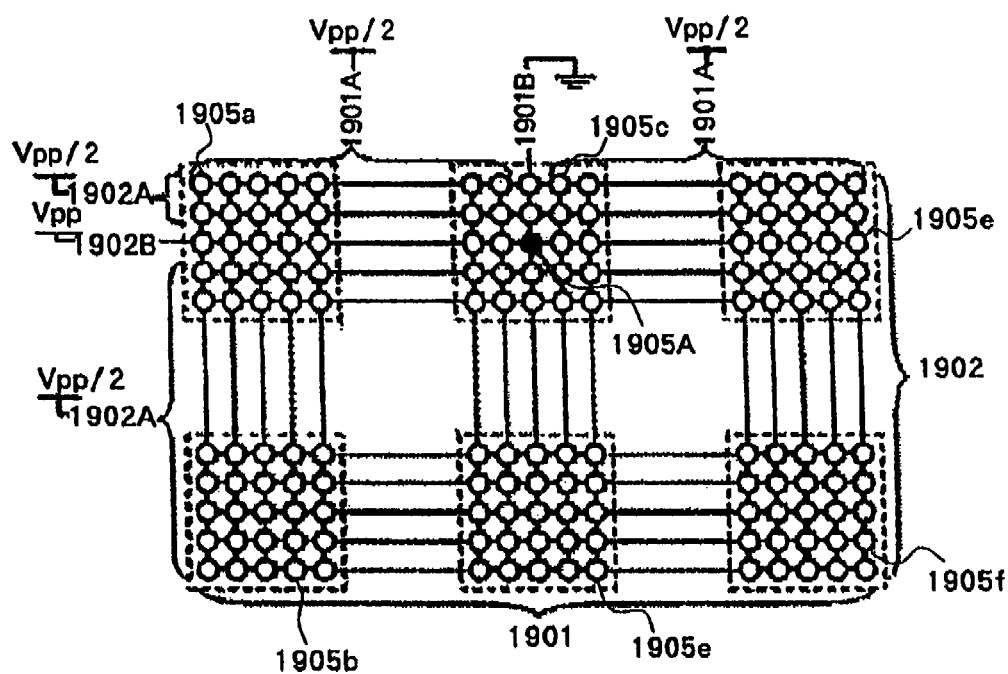
FIG. 22 is a circuit diagram for explaining another example of the operation of a logic circuit that can be programmed.

FIG. 22 is a view for explaining programming of cross-bus switches 1905*a* to 1905*e*. In FIG. 21, parts that are identical to FIG. 20 are given the same reference numbers.

In FIG. 22, a semiconductor integrated circuit includes interconnect groups 1901 and 1902 and cross-bus switches 1905*a* to 1905*f*. In addition, interconnect group 1901 is connected to drive circuit 1903, and interconnect group 1902 is connected to drive circuit 1904.

Cross-bus switch 1905*c* includes switching element 1905A.

Switching element 1905A is connected to interconnect 1901B and interconnect 1902B.

The following explanation regards the programming method for placing switching element 1905A in a stable conductive state.

In this case, control circuit 1900 causes drive circuits 1903 and 1904 to apply a voltage to interconnects 1901A and 1901B such that the potential applied to interconnect 1902B is higher than the potential applied to interconnect 1901B. For example, interconnect 1901B is grounded, and a potential higher than the potential applied to interconnect 1901B is applied to interconnect 1902B.

When voltage is applied to interconnect 1902B, a metal dendrite is deposited on electrode 1 of switching element 1905A. Continued application of voltage to interconnect 1902B, switching element 1905 enters a stable conductive state. When switching element 1905 enters a stable conductive state, control circuit 1900 causes drive circuits 1903 and 1904 to halt the application of voltage. Interconnects 1901B and 1902B are thus connected.

However, when each interconnect of interconnect group 1901A is grounded similar to interconnect 1901B, the application of voltage to interconnect 19028 results in connection up to the switching element arranged at the intersection of interconnect 1902B and interconnect 1901A.

To prevent this, the values of voltage applied across interconnect groups 1901A and 1902B must be smaller than the value of the threshold voltage.

For example, if the threshold voltage value is 1.5V, interconnect 1901A is grounded, and voltage of 2V is applied to interconnect 1902B, control circuit 1900 must cause drive circuits 1903 and 1904 to apply a voltage greater than 0.5V to interconnect 1901A to prevent connection of the switching element arranged at the intersection of interconnect 1902B and 1901A.

In the following explanation, a value that is half the value of the programming voltage for programming a switching element (for example, the connection voltage) is assumed to be lower than the threshold voltage value.

In this case, control circuit 1900 causes drive circuits 1903 and 1904 to apply a voltage of a value that is half the value of the programming voltage to interconnect 1901A and 1902A to prevent connection of the switching element arranged at the intersection of interconnect 1901A and 1902B.

In addition, control circuit 1900 may cause drive circuits 1903 and 1904 to pre-charge interconnects 1901A and 1902A with a voltage on the order of half the programming voltage and then isolate the voltage source and interconnects 1901A and 1902A. In this case, the current flowing in interconnects 1901A and 1902A can be reduced.

Explanation next regards the programming method for placing specific switching elements of segment-separation switches 1906*a* to 1906*h* in a stable isolated state using FIG. 21.

In FIG. 21, segment-separation switch 1906*h* includes switching element 1906A. The following explanation regards the programming method for placing switching element 1906A in a stable isolated state.

In this case, control circuit 1900 causes drive circuit 1904 to ground interconnect 1947 and causes drive circuit 1903 to apply a programming voltage to interconnects 1912 to 1915.

In addition, control circuit 1900 preferably causes drive circuit 1903 to apply a voltage on the order of one-half the programming voltage to interconnects 1912 to 1915, 1917 to 1921, and 1923 to 1926 and causes drive circuit 1904 to apply a voltage on the order of one-half the programming voltage to interconnects 1931, 1936 and 1942.

When control circuit 1900 causes the application of voltage, electrons are discharged from gate electrode 1003 of switching element 1906A to interconnect 1947, and the metal dendrite dissolves in solid electrolytic material 1004, whereupon switching element 1906A enters an isolated state.

When switching element 1906A enters an isolated state, control circuit 1900 checks the reference time stored in reference time memory unit 124. Then, after the passage of the reference time, control circuit 1900 causes drive circuits 1903 and 1904 to halt the application of voltage.

When measuring a parameter of switching element (cross-bus switches 1905a to 1905e or segment-separation switches 1906a to 1906h) in the semiconductor integrated circuit shown in FIGS. 20 to 22, the parameter of the switching elements must be measured by way of the other switching elements (segment-separation switches 1906a to 1906h).

For example, when measuring the parameter of the switching element of cross-bus switch 1905b, drive circuit 1903 measures the parameter of the switching element of cross-bus switch 1905b by way of segment-separation switches 1906e and 1906f, or drive circuit 1904 measures the parameter of the switching element by way of segment-separation switches 1906a and 1906b.

As a result, individual detection of the parameter of a switching element is problematic.

Figure 23:
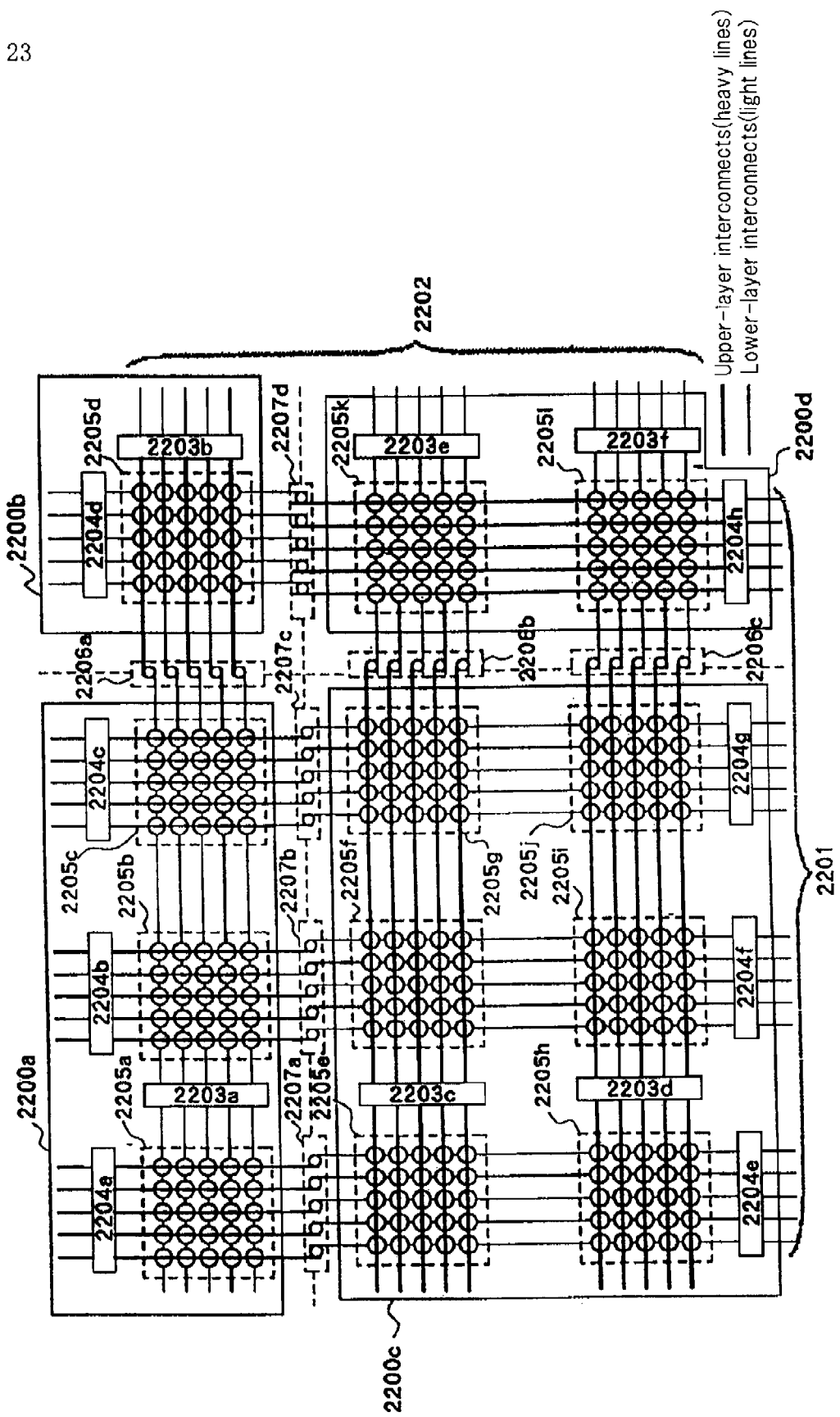
FIG. 23 is a circuit diagram showing another example of a logic circuit that can be programmed.

FIG. 23 shows a semiconductor integrated circuit in which the parameters of switching elements can be sensed individually.

In FIG. 23, the semiconductor integrated circuit includes sub-networks 2200a to 2200d, interconnect groups 2201 and 2202, and segment-separation switches 2206a to 2206c and 2207a to 2207d.

Interconnect group 2201 includes a plurality of interconnects arranged in the vertical direction.

Interconnect group 2202 includes a plurality of interconnects arranged in the horizontal direction.

Segment-separation switches 2206a to 2206c and 2207a to 2207d are formed by switching elements.

In addition, the semiconductor integrated circuit is divided into sub-networks 2200a to 2200d by segment-separation switches 2206a to 2206c and segment-separation switches 2207a to 2207d.

Sub-network 2200a includes cross-bus switches 2205a to 2205c, and drive circuits 2203a and 2204a to 2204c. Sub-network 2200b includes cross-bus switch 2205d and drive circuits 2203b and 2204d. Sub-network 2200c includes cross-bus switches 2205e to 2205j and drive circuits 2203c, 2203d, and 2204e to 2204g. Sub-network 2200d includes cross-bus switches 2205k and 2205l and drive circuits 2203e, 2203f, and 2204h.

Electrodes 1 of the switching elements of cross-bus switches 2205a to 2205l are connected to interconnect group 2201, and electrodes 2 of these switching elements are connected to interconnect group 2202. In addition, electrodes 2 of the switching elements of cross-bus switches 2205a to 2205l may be connected to interconnect group 2201, and electrodes 1 of these switching elements may be connected to interconnect group 2202.

Drive circuits 2203a to 2203f and 2204a to 2204h have the same functions as drive circuit 102 shown in FIG. 2A or FIG. 12, and are connected to a control circuit (not shown). The control circuit controls the operations of drive circuits 2203a to 2203f and 2204a to 2204h.

The interconnects contained in interconnect groups 2201 and 2202 include upper-layer interconnects arranged on an upper layer and lower-layer interconnects arranged on a lower layer. In FIG. 23, the heavy lines show the upper-layer interconnects and the light lines show the lower-layer interconnects. The first electrodes of the switching elements that make up segment-separation switches 2206a to 2206c and 2207a to 2207d are connected to one interconnect of the upper-layer interconnects and lower-layer interconnects, and the second electrodes of these switching elements are connected to the other interconnect of the upper-layer interconnects and lower-layer interconnects.

In addition, the upper-layer interconnects and lower-layer interconnects are connected to one of drive circuits 2203a to 2203f and 2204a to 2204h.

Drive circuits 2203a to 2203f and 2204a to 2204h measure the parameters of switching elements that make up cross-bus switches 2205a to 2205k and the parameters of switching elements that form segment-separation switches 2206a to 2206c and 2207a to 2207d by way of interconnect group 2201 or 2202.

In addition, the switching elements of cross-bus switches 2205a to 2205j and segment-separation switches 2206a to 2206c and 2207a to 2207d are connected to any one of drive circuits 2203a to 2203f and 2204a to 2204h with other switching elements interposed.

Explanation next regards the operations of the semiconductor integrated circuit shown in FIG. 23.

For example, when programming segment-separation switch 2206a, the control circuit causes drive circuits 2203a and 2203b to apply voltage to segment-separation switch 2206a.

The control circuit preferably causes drive circuits 2203a and 2203b to apply voltage while increasing the voltage, to intermittently apply voltage, or to intermittently apply voltage while increasing the voltage to segment-separation switch 2206a.

In addition, control circuit preferably causes drive circuits 2203c to 2203f and 2204a to 2204h to apply voltage that does not attain the threshold voltage value to switching elements that differ from segment-separation switch 2206a.

For example, the control circuit causes drive circuits 2204b to 2204d to apply voltage on the order of one-half the voltage applied to segment-separation switch 2206a to cross-bus switches 2205b to 2205d.

In this case, drive circuit 2203a or 2203b supplies to the control circuit a determination signal indicating whether or not the voltage applied to segment-separation switch 2206a is greater than the voltage that should be applied to segment-separation switch 2206a of a prescribed state.

Upon receiving the determination signal from drive circuit 2203a or 2203b, the control circuit determines based on the determination signal whether or not segment-separation switch 2206a is in a prescribed state.

When segment-separation switch 2206a attains the prescribed state, the control circuit causes drive circuit 2203a or 2203b to halt application of voltage. Alternatively, when programming segment-separation switch 2207a, the control circuit causes drive circuits 2204a and 2204e to apply voltage to segment-separation switch 2207a.

The control circuit preferably causes drive circuits 2204a and 2204e to apply voltage while increasing the voltage, intermittently apply voltage, or intermittently apply voltage while increasing the voltage to segment-separation switch 2207a. In addition, the control circuit preferably causes drive circuits 2203a to 2203f, 2204a to 2204d, and 2204f to 2204h to apply voltage less than the threshold voltage value to switching elements that differ from segment-separation switch 2207a.

When programming cross-bus switch 2205a, the control circuit causes drive circuits 2203a and 2204a to apply voltage to cross-bus switch 2205a.

The control circuit preferably causes drive circuit 2203a and 2204a to apply voltage while increasing the voltage, to intermittently apply voltage, or to intermittently apply voltage while increasing the voltage to cross-bus switch 2205a. In addition, the control circuit preferably causes drive circuits 2203b to 2204f and 2204b to 2204h to apply voltage less than the threshold voltage value to switching elements that differ from cross-bus switch 2205a.

Figure 24:
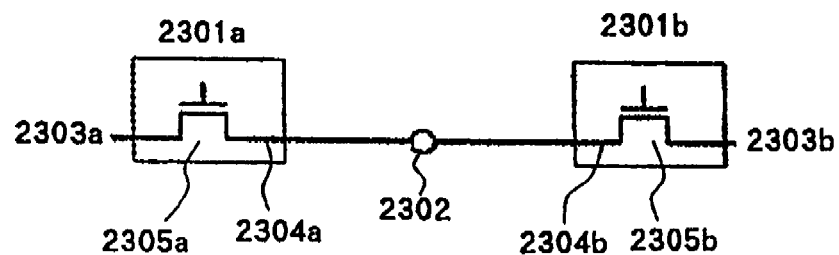
FIG. 24 is a circuit diagram showing an example of drive circuits.

FIG. 24 is a view for explaining the drive circuit of the semiconductor integrated circuit shown in FIG. 23.

In FIG. 24, the semiconductor integrated circuit includes drive circuits 2301a and 2301b and switching element 2302. In addition, drive circuits 2301a and 2301b are connected to the control circuit.

Drive circuit 2301a includes terminals 2303a and 2304a and transistor 2305a. Drive circuit 2301b includes terminals 2303b and 2304b and transistor 2305b. Switching element 2302 is a two-terminal switching element or a three-terminal switching element. In the following explanation, switching element 2302 is assumed to be a two-terminal switching element. In addition, electrode 2 of switching element 2302 is connected to terminal 2304a, and electrode 1 of switching element 2302 is connected to terminal 2304b. Switching element 2302 before the application of voltage is assumed to be in an isolated state. Terminals 2303a and 2303b are connected to the power supply.

The resistance values of transistors 2305a and 2305b are controlled by the control circuit (not shown).

As an example, when the control circuit controls transistors 2305a and 2305b to apply voltage in the direction of the flow of current in the direction from terminal 2304a to 2304b, switching element 2302 enters a conductive state. The resistance value of switching element 2302 decreases when switching element 2302 enters a conductive state, whereby the voltage across terminals 2304a 2304b decreases. The current to flow between terminals 2304a and 2304b increases.

When the voltage across terminals 2304a and 2304b decreases, the voltage applied across terminals 2303a and 2304a and the voltage applied across terminals 2303b and 2304b increase.

Drive circuit 2301a supplies the control circuit with a determination signal indicating whether the voltage applied across terminals 2303a and 2304a is greater than the voltage across terminals 2304a and 2304b. The control circuit, based on the parameter supplied from drive circuit 2301a, determines whether switching element 2302 is in a stable conductive state or not.

Figure 25:
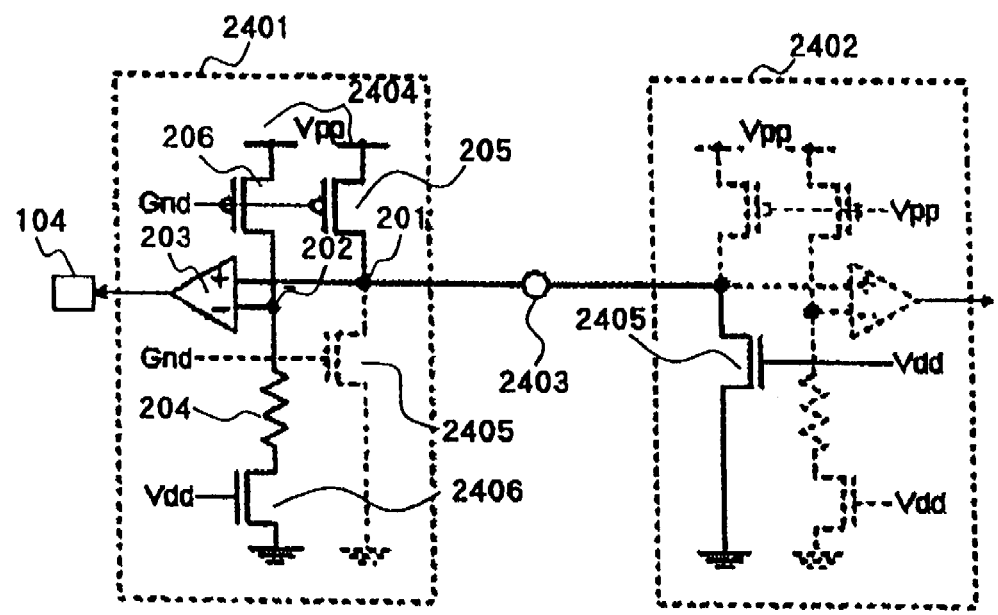
FIG. 25 is a circuit diagram showing an example of drive circuits.

FIG. 25 is a circuit diagram showing a more detailed example of the drive circuit shown in FIG. 24. In FIG. 25, parts identical to FIG. 3A are given the same reference numbers. The following explanation chiefly regards configuration and operations that differ from the program circuit shown in FIG. 3A.

In FIG. 25, the semiconductor integrated circuit includes control circuit 104, drive circuits 2401 and 2402, and switching element 2403. Switching element 2403 is assumed to be a two-terminal switching element.

Drive circuits 2401 and 2402 have identical configuration, each including output terminals 201 and 202, comparator 203, resistance element 204, transistors 205 and 206, power-supply terminal 207, and transistors 2405 and 2406. Power-supply terminal 207 is connected to the power supply (not shown).

When control circuit 104 supplies current in the direction from drive circuit 2401 to drive circuit 2402, transistor 205 of drive circuit 2401 and transistor 2405 of drive circuit 2402 are placed in a conductive state, and transistor 2405 of drive circuit 2402 and transistor 205 of drive circuit 2401 are placed in an isolated state.

When control circuit 104 supplies current in the direction from drive circuit 2402 to drive circuit 2401, transistor 205 of drive circuit 2402 and transistor 2405 of drive circuit 2402 are placed in a conductive state, and transistor 2405 of drive circuit 2401 and transistor 205 of drive circuit 2402 are placed in an isolated state.

The following explanation regards a case in which current flows from drive circuit 2401 to drive circuit 2402. Control circuit 104 can control the resistance value of transistor 215 to apply voltage while increasing the voltage to switching element 2403, to intermittently apply voltage to switching element 2403, or to intermittently apply voltage while increasing the voltage to switching element 2403.

Resistance element 204 and transistor 2406 make up a replica circuit of switching element 2403 and drive circuit 2402. More specifically, resistance element 204 is a replica of switching element 2403 and transistor 2406 is a replica of transistor 2405 of drive circuit 2402.

The voltage (comparison voltage) of output terminal 201 is prescribed by the resistance value of transistor 205, the resistance value of switching element 100, and the resistance value of transistor 2405. The voltage (reference voltage) of output terminal 202 is prescribed by the resistance values of transistors 206 and 2406 and the resistance value of resistance element 204. Comparator 203 compares the comparison voltage and the reference voltage and supplies a determination signal indicating whether the comparison voltage is greater than the reference voltage to control circuit 104 by way of the control output terminal.

Control circuit 104 sets the resistance of resistance element 204 to the resistance value (for example, the reference resistance value) of a prescribed state of the switching element (for example, a stable conductive state).

Upon receiving the determination signal from comparator 203, control circuit 104 determines whether switching element 2403 is in the prescribed state based on the determination signal.

For example, when determining whether switching element 100 is in a stable conductive state or not, control circuit 104 sets the resistance value of resistance element 204 to the reference resistance value.

In this case, upon receiving an L-level signal from comparator 203, control circuit 104 determines that switching element 100 is in a stable conductive state. In contrast, upon receiving an H-level signal from comparator 203, control circuit 104 determines that switching element 100 is not in a stable conductive state.

Figure 26:
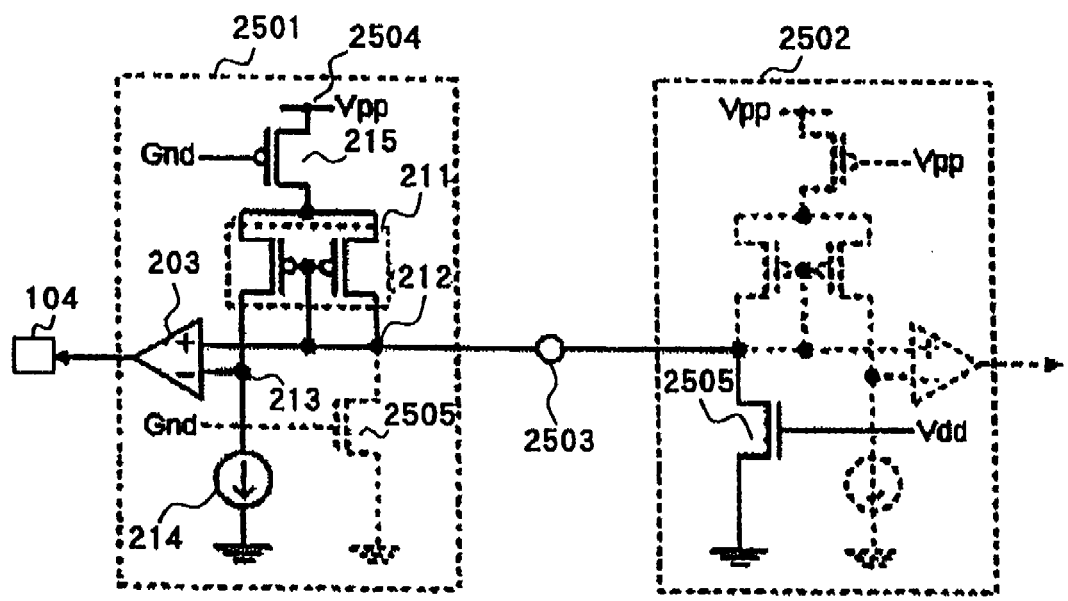
FIG. 26 is a circuit diagram showing an example of a drive circuits.

FIG. 26 shows another example of a drive circuit. In FIG. 26, parts identical to FIG. 3B are given the same reference numbers. The following explanation chiefly regards configuration and operations that differ from the program circuit shown in FIG. 3B.

In FIG. 26, the semiconductor integrated circuit includes control circuit 104, drive circuits 2501 and 2502, and switching element 2503.

Drive circuits 2501 and 2502 have the same configuration, each including current-mirror circuit 211, output terminals 212 and 213, comparator 203, current source 214, transistor 215, power-supply terminal 216, and transistor 2505.

Power-supply terminal 216 is connected to a power supply (not shown).

When control circuit 104 causes current to flow in the direction from drive circuit 2501 to drive circuit 2502, transistor 215 of drive circuit 2501 and transistor 206 of drive circuit 2502 are placed in a conductive state, and transistor 215 of drive circuit 2502 and transistor 2505 of drive circuit 2401 are placed in an isolated state.

When control circuit 104 causes current to flow in the direction from drive circuit 2502 to drive circuit 2501, transistor 215 of drive circuit 2502 and transistor 2505 of drive circuit 2502 are placed in a conductive state and transistor 215 of drive circuit 2501 and transistor 2505 of drive circuit 2501 are placed in an isolated state.

The following explanation regards a case in which current flows from drive circuit 2501 to drive circuit 2502. Control circuit 104 can control the resistance value of transistor 215 to apply voltage while increasing the voltage to switching element 2503, to intermittently apply voltage to switching element 2503, or to intermittently apply voltage while increasing the voltage to switching element 2503.

The voltage of output terminal 212 (the comparison voltage) is prescribed by the current that flows in transistors 215 and 2505 and the current that flows in switching element 100. The voltage of output terminal 213 (the reference voltage) is prescribed by the current that flows in transistor 215 and current source 214.

Comparator 203 compares the comparison voltage and reference voltage and supplies a determination signal indicating whether the comparison voltage is greater than the reference voltage to control circuit 104 by way of the control output terminal.

Control circuit 104 sets the current that flows in current source 214 to the current (for example, the reference voltage value) that flows in switching element of a prescribed state.

Upon receiving the determination signal from comparator 203, control circuit 104 determines whether switching element 2503 is in a prescribed state or not based on the determination signal.

For example, when determining whether switching element 100 is in a stable conductive state, control circuit 104 sets the value of the current flowing in current source 214 to the reference current value.

In this case, control circuit 104 determines that switching element 2503 is in a stable conductive state upon receiving an L-level signal from comparator 203 and determines that switching element 100 is not in a stable conductive state upon receiving an H-level signal from comparator 203.

Figure 27:
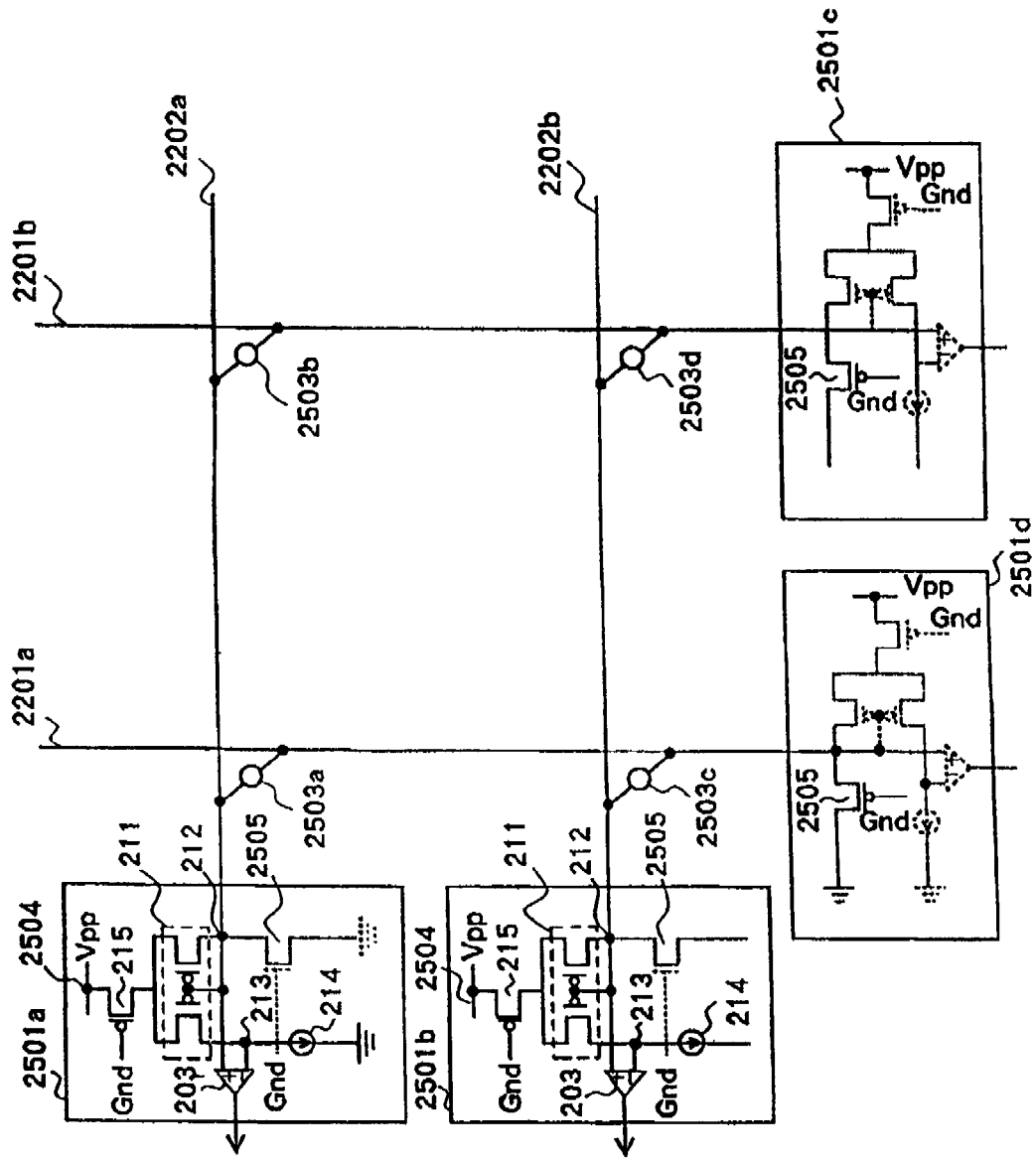
FIG. 27 is a circuit diagram for explaining drive circuits for controlling a plurality of switching elements.

FIG. 27 is a circuit diagram for explaining a drive circuit for controlling a plurality of switching elements. In FIG. 27, parts identical to FIG. 26 are given the same reference numbers.

In FIG. 27, the semiconductor integrated circuit includes drive circuits 2501a to 2501d, switching elements 2503a to 2503d, and interconnects.

Drive circuits 2501a to 2501d have the same configuration as drive circuit 2501 shown in FIG. 26. In addition, drive circuit 2501a to drive circuit 2501d are connected to a control circuit (not shown) and are controlled by the control circuit.

More specifically, the control circuit is connected to the output terminals of comparators 203 of drive circuit 2501a to drive circuit 2501d. In addition, the control circuit controls transistors 215 and 2505 of drive circuit 2501a to drive circuit 2501d to control the application of voltage to each interconnect.

For example, when programming switching element 2503b, the control circuit places transistor 215 of drive circuit 2501a in a conductive state, and further, places transistor 2505 of drive circuit 2501d in a conductive state and grounds interconnect 2201b. Control circuit 104 further controls drive circuits 2501b and 2501c to pre-charge the voltage applied to interconnects 2201a and 2202b to approximately half the voltage applied to interconnect 2202a.

In this case, current flows from drive circuit 2501a to drive circuit 2501d by way of interconnect 2202a, switching element 2503b, and interconnect 2201b.

When current flows from drive circuit 2501a to drive circuit 2051d, comparator 203 of drive circuit 2501a supplies a determination signal to the control circuit. Upon receiving the determination signal from comparator 203, the control circuit controls the resistance value of switching element 2503b based on the determination signal.

Figure 28:
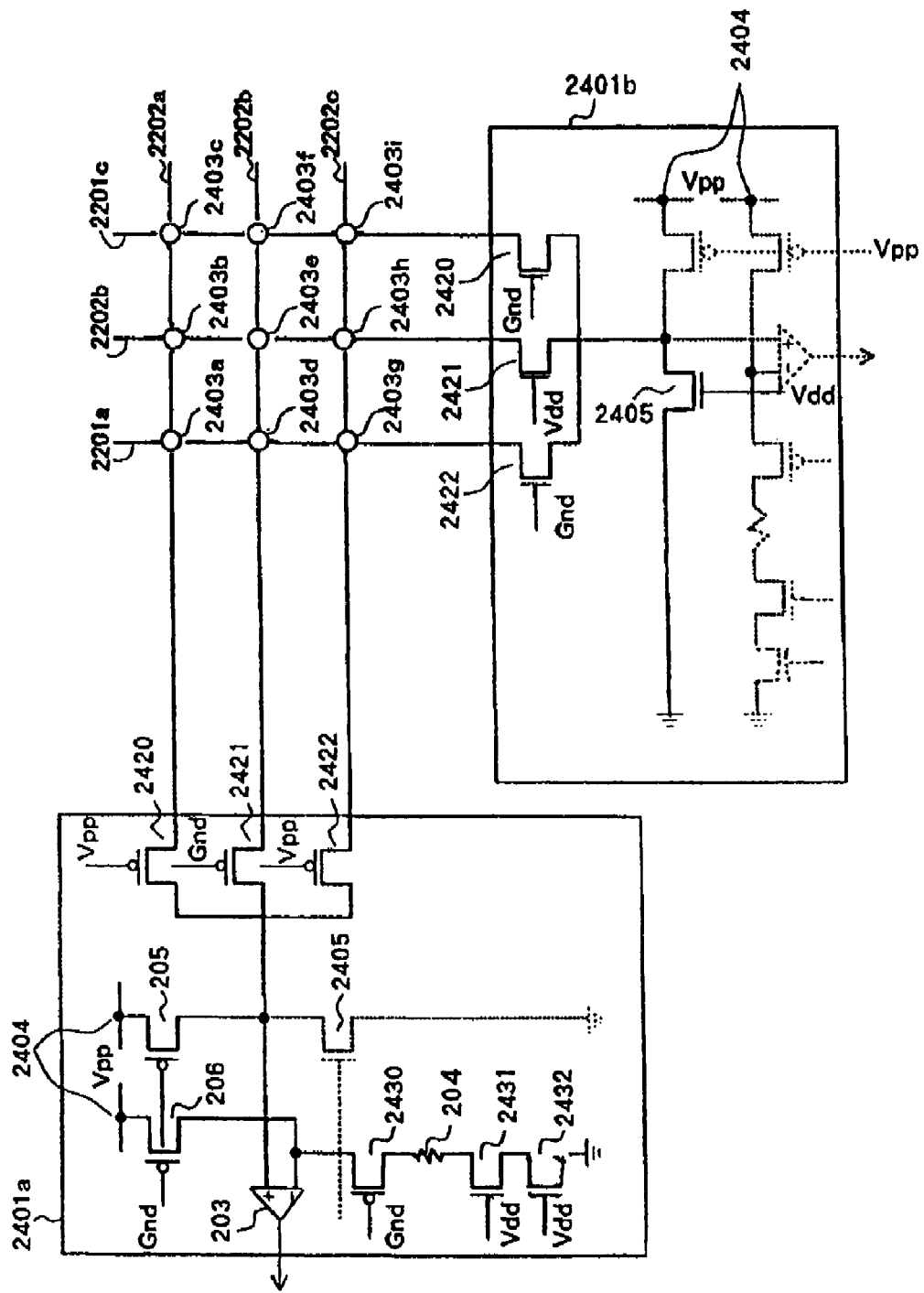
FIG. 28 is a circuit diagram for explaining drive circuits for controlling a plurality of switching elements.

FIG. 28 is a circuit diagram for explaining a drive circuit for controlling a plurality of switching elements. In FIG. 28, parts identical to FIG. 25 are given the same reference numbers.

In FIG. 28, the semiconductor integrated circuit includes drive circuits 2401a and 2401b, switching elements 2403a to 2503i, interconnects 2201a to 2201c, and interconnects 2202a to 2202c.

Drive circuits 2401a and 2401b each include: output terminals 201 and 202, comparator 203, resistance element 204, power-supply terminal 207, and transistors 205, 206, 2420 to 2422, and 2430 to 2432.

Drive circuit 2401a and drive circuit 2401b are connected to a control circuit (not shown).

More specifically, the control circuit is connected to the output terminals of comparators 203 of drive circuit 2401a and drive circuit 2401b. In addition, the control circuit controls transistors 215 and 2505 of drive circuit 2501a to drive circuit 2501d to apply voltage to interconnects 2201a to 2201c and interconnects 2202a to 2202c.

For example, when programming switching element 2403e, the control circuit places transistor 2421 of drive circuit 2401a in a conductive state to supply current to interconnect 2202b. The control circuit also places transistors 2410 and 2421 of drive circuit 2401b in a conductive state to ground interconnect 2201b. The control circuit further controls drive circuits 2401a and 2401b to pre-charge interconnects 2201a, 2201c, 2202a and 2202c to approximately half the voltage applied to interconnect 2202b.

In this case, current flows from drive circuit 2401a to drive circuit 2401b by way of interconnect 2202b, switching element 2403e, and interconnect 2201b.

When current flows from drive circuit 2401a to drive circuit 2401b, comparator 203 of drive circuit 2401a supplies a determination signal to the control circuit. Upon receiving the determination signal from comparator 203, the control circuit controls the voltage that is applied to switching element 2403e or the current that flows to switching element 2403e based on the determination signal to control the resistance value of switching element 2503b.

According to the present embodiment, interconnect groups 2201 and 2202 intersect with each other. The switching elements that form cross-bus switches 2205a to 2205l are arranged at the intersections of interconnect groups 2201 and 2202. The voltage source is formed from power-supply terminal 207 and transistors 205 and 2405 and applies voltage to interconnect groups 2201 and 2202. Comparator 203 compares the comparison voltage applied to interconnect groups 2201 and 2202 with the reference voltage that should be applied to switching elements of a prescribed state and supplies a determination signal indicating whether the comparison voltage is greater than the reference voltage or not. The voltage source may be formed from power-supply terminal 216 and transistors 215 and 2505.

In this case, interconnects 2201 and 2202 intersect with each other. The switching elements that form cross-bus switches 2205a to 2205l are arranged at the intersections of interconnect groups 2201 and 2202. In addition, comparator 203 supplies a determination signal indicating whether the voltage applied to switching elements is greater than the reference voltage.

As a result, the resistance values of switching elements arranged at intersections can be controlled based on the supplied determination signals, whereby application of voltage that is greater than necessary to switching elements can be reduced. Accordingly, exhaustion of switching elements can be mitigated.

In the present embodiment, a voltage source applies voltage to interconnects 2201b and 2202a that are connected to switching element 2503b for which resistance value is to be controlled. A control circuit causes progressive increase of the voltage applied by the voltage source, following which the control circuit causes the voltage source to halt the application of voltage when switching element 2503b attains a prescribed state.

In this case, the exhaustion of switching element 2503b for which resistance value is to be controlled can be mitigated.

In the present embodiment, a voltage source applies voltage to interconnects 2201b and 2202a that are connected to switching element 2503b for which resistance value is to be controlled. The control circuit causes the voltage source to intermittently apply voltage, following which control circuit 104 causes the voltage source to halt the application of voltage when the resistance value of switching element 2503b reaches a prescribed resistance value.

In this case, exhaustion resulting from the Joule heat of switching element 2503b for which resistance value is to be controlled can be mitigated.

In the present embodiment, interconnect groups 2201 and 2202 include upper-layer interconnects and lower-layer interconnects that are connected to any one of drive circuits 2203a to 2203f and 2204a to 2204h. In addition, the first electrodes of switching elements that form segment-separation switches 2206a to 2206c and 2207a to 2207d are connected to one of upper-layer interconnects and lower-layer interconnects, and the second electrodes of the switching elements are connected to the other of upper-layer interconnects and lower-layer interconnects. The voltage source applies voltage to segment-separation switches 2206a to 2206c and 2207a to 2207d. In addition, comparator 203 supplies a determination signal indicating whether the voltage applied to segment-separation switches 2206a to 2206c and 2207a to 2207d is greater than the reference voltage or not.

In this case, interconnect groups 2201 and 2202 are connected or disconnected by segment-separation switches 2206a to 2206c and 2207a to 2207d. In addition, determination signals are supplied indicating whether the voltage applied to segment-separation switches 2206a to 2206c and 2207a to 2207d is greater than a reference voltage or not.

As a result, exhaustion of switching elements that connect or disconnect each of the interconnects of interconnect groups 2201 and 2202 can be mitigated. In the present embodiment, the voltage sources of drive circuits 2203a and 2203b apply voltage to interconnects connected to segment-separation switch 2206a for which resistance value is to be controlled. The control circuit then brings about progressive increase of the voltage that the voltage sources apply, and when segment-separation switch 2206a attains the prescribed state, the control circuit causes the voltage sources of drive circuits 2203a and 2203b to halt the application of voltage.

In this case, exhaustion of segment-separation switch 2206a for which resistance value is to be controlled can be mitigated.

In the present embodiment, moreover, the voltage sources of drive circuits 2203a and 2203b apply voltage to interconnects connected to segment-separation switch 2206a for which resistance value is to be controlled. The control circuit causes the voltage sources of drive circuits 2203a and 2203b to intermittently apply voltage, following which the control circuit causes the voltage sources of drive circuits 2203a and 2203b to halt the application of voltage when segment-separation switch 2206a attains the prescribed state. In this case, exhaustion resulting from Joule heat of switching element 2503b for which resistance is to be controlled can be mitigated.

Explanation next regards the processing method when switching elements that form cross-bus switches are damaged.

Figure 29:
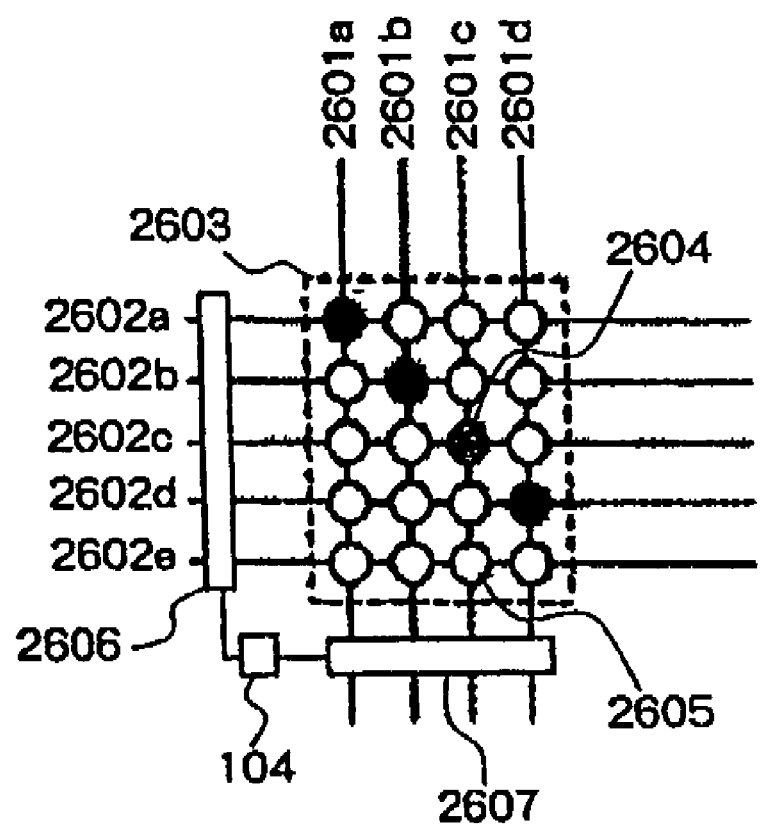
FIG. 29 is a view for explaining the method of dealing with a damaged switching element that forms a cross-bus switch.

FIG. 29 is a view for explaining the method of dealing with damage to a switching element that forms a cross-bus switch.

In FIG. 29, the semiconductor integrated circuit includes interconnects 2601a to 2601d and 2602a to 2602e, cross-bus switch 2603, and drive circuits 2606 and 2607.

Interconnects 2601a to 2601d are arranged in a vertical direction, and interconnects 2602a to 2602e are arranged in a horizontal direction.

Cross-bus switches 2603 include switching element 2604 and switching element 2605.

Switching element 2604 is arranged at the intersection of interconnect 2601c and interconnect 2602c. Switching element 2605 is arranged at the intersection of interconnect 2061c and interconnect 2602e.

Drive circuits 2606 and 2607 are, for example, drive circuits 2401 or 2402 shown in FIG. 27 or FIG. 28, and are connected to control circuit 104.

Control circuit 104 determines that switching element 2604 is damaged if the switching element does not attain the desired state despite the passage of the completion time from the start of application of voltage.

If switching element 2604 is damaged, control circuit 104 halts the application of voltage.

Upon halting the application of voltage, control circuit 104 applies voltage to the other switching element to program cross-bus switch 263.

For example, when switching element 2604 is damaged, control circuit 104 applies voltage to interconnect 2601c and interconnect 2602e to place interconnect 2601c and interconnect 2602e in a desired state.

In this way, when a switching element is damaged and the switching element cannot be programmed, another switching element can be programmed in place of the damaged switching element to connect or disconnect an interconnect.

In the above-described embodiments, the configurations shown in the figures are shown only by way of example, and the present invention is not limited to these configurations.

What is claimed is:

1. A program circuit for applying voltage to a switching element formed of a first electrode and a second electrode formed of metals having mutually different ionization tendencies and an electrolyte interposed between said first electrode and the second electrode to thereby control a resistance value of said switching element, said program circuit comprising:

a power-supply unit that applies voltage across said first electrode and second electrode;

a measurement unit that measures a parameter that changes in accordance with the resistance value of said switching element; and a control unit that progressives increasing voltage applied by said power-supply unit across said first electrode and second electrode until a parameter measured by said measurement unit reaches a prescribed value and halts application of voltage by said power-supply unit when the parameter reaches the prescribed value.

2. A program circuit according to claim 1, wherein said control unit causes said power-supply unit to intermittently apply voltage across said first electrode and second electrode while increasing the voltage.

3. A program circuit according to claims 1, wherein:
the metal that forms said first electrode has a lower ionization tendency than the metal that forms said second electrode;
said prescribed value is a value indicating that said switching element has entered a prescribed conductive state; and
said control unit causes said power-supply unit to apply voltage across said first electrode and second electrode such that the potential of said first electrode is lower than the potential of said second electrode.

4. A program circuit according to claims 1, further comprising a reference time memory unit for storing a reference time, wherein:
the metal that forms said first electrode has a lower ionization tendency than the metal that forms said second electrode;
said prescribed value is a value indicating that said switching element has entered an isolated state; and
said control unit causes said power-supply unit to apply voltage across said first electrode and second electrode such that the potential of said first electrode is higher than the potential of said second electrode and causes halting of the application of voltage by said power-supply unit upon passage of a reference time stored in said reference time memory unit from the time said parameter becomes said prescribed value.

5. A program circuit according to claims 1, wherein said switching element further comprises a third electrode formed of a metal having a higher ionization tendency than the metal that forms said first electrode, wherein:
the metal that forms said first electrode has a lower ionization tendency than the metal that forms said second electrode;
said prescribed value includes a first prescribed value indicating that said switching element has entered a first conductive state and a second prescribed value indicating that said switching element has entered a second conductive state in which the resistance value is lower than in said first conductive state; and
said control unit causes said power-supply unit to apply voltage across said first electrode and second electrode such that the potential of said first electrode is lower than the potential of said second electrode, causes said power-supply unit to lower the voltage applied across said first electrode and second electrode, and moreover, causes said power-supply unit to apply voltage across said third electrode and said first electrode or second electrode such that the potential of said third electrode is higher than the potential of said first electrode or said second electrode when said parameter achieves said first prescribed value and then causes halting of application of voltage by said power-supply unit when said parameter achieves said second prescribed value.

6. A program circuit according to claims 1, further comprising a reference time memory unit that stores reference time, wherein:
said switching element further comprises a third electrode formed of a metal having a higher ionization tendency than the metal that forms said first electrode;
the metal that forms said first electrode has a lower ionization tendency than the metal that forms said second electrode;
said prescribed value is a value indicating that said switching element has entered an isolated state; and
said control unit causes said power-supply unit to apply a voltage across said third electrode and said first electrode or said second electrode such that the potential of said third electrode is lower than the potential of said first electrode and said second electrode, and then causes halting of application of voltage by said power-supply unit upon passage of a reference time stored in said reference time memory unit from the time said parameter attains said prescribed value.

7. A program circuit according to claims 1, further comprising a limiting unit that limits the current value of current that flows in said switching element to a prescribed current value or less.

8. A program circuit according to claims 1; further comprising a completion memory that to stores a completion time, wherein:
said control unit causes halting of application of voltage by said power-supply unit upon passage of the completion time stored in said completion memory unit from the start of application of voltage by said voltage source.

9. A program circuit for applying voltage to a switching element formed of a first electrode and second electrode formed of metals having mutually different ionization tendencies and an electrolyte interposed between said first electrode and second electrode to thereby control a resistance value of said switching element; the program circuit comprising:
a power-supply unit that applies voltage across said first electrode and second electrode;
a measurement unit that measures a parameter that changes in accordance with the resistance value of said switching element; and
a control unit that cause said power-supply unit to intermittently apply voltage across said first electrode and second electrode until the parameter measured by said measurement unit reaches a prescribed value and halts application of voltage by said power-supply unit when the parameter reaches the prescribed value.

10. A program circuit for applying current to a switching element formed from a first electrode and second electrode formed from metals having mutually different ionization tendencies and an electrolyte interposed between said first electrode and second electrode to thereby control a resistance value of said switching element; said program circuit comprising:
a power-supply unit that applies current across said first electrode and second electrode;
a measurement unit that measures a parameter that changes in accordance with the resistance value of said switching element; and
a control unit that causes current applied across said first electrode and second electrode by said power-supply unit to progressively increase until said parameter measured by said measurement unit reaches a prescribed value and causes halting of current from said power-supply unit when the parameter reaches the prescribed value.

11. A program circuit for applying current to a switching element formed of a first electrode and second electrode formed of metals having mutually different ionization tendencies and an electrolyte interposed between said first electrode and second electrode to thereby control a resistance value of said switching element; said program circuit comprising:
- a power-supply unit that applies current across said first electrode and second electrode;
- a measurement unit that measures a parameter that changes in accordance with the resistance value of said switching element; and
- a control unit that causes said power-supply unit to intermittently apply current across said first electrode and second electrode until the parameter measured by said measurement unit reaches a prescribed value and halts the current from said power-supply unit when the parameter reaches the prescribed value.

12. A semiconductor integrated circuit comprising:
a plurality of first interconnects;
a plurality of second interconnects that intersect with each of said first interconnects;
switching elements each arranged at the intersection of each first interconnect and each second interconnect, formed of a first electrode connected to said first interconnect, a second electrode formed of a metal having a different ionization tendency than the metal that forms said first interconnect and connected to said second interconnect, and an electrolyte interposed between said first electrode and the second electrode; and
a program circuit for controlling a resistance value of said switching elements;
wherein said program circuit comprises:
- a power-supply unit for applying voltage to each first interconnect and each second interconnect; and
- a measurement unit for comparing voltage applied to said switching elements with a reference voltage that is to be applied to a switching element of a prescribed state to supply a determination signal indicating whether the voltage is equal to or greater than the reference voltage or not.

13. A semiconductor integrated circuit according to claim 12, wherein:
said power-supply unit applies voltage to a first interconnect and a second interconnect connected to a switching element for which the resistance value is to be controlled; and
said program circuit further includes a control unit for causing progressive increase of voltage applied by said power-supply unit until a determination signal supplied by said measurement unit indicates that the switching element has attained a prescribed state and then causing halting of application of voltage by said power-supply unit when the switching element attains a prescribed state.

14. A semiconductor integrated circuit according to claim 12, wherein:
said power-supply unit applies voltage to a first interconnect and a second interconnect connected to a switching element for which the resistance value is to be controlled; and
said program circuit further includes a control unit for causing intermittent application of voltage by said power-supply unit until a determination signal supplied by said measurement unit indicates that the switching element has attained a prescribed state and causing halting of application of voltage by said power-supply unit when the switching element attains a prescribed state.

15. A semiconductor integrated circuit according to claim 12, wherein:
each of said first interconnects includes a first electrode interconnect and a second electrode interconnect connected to said program circuit;
each of said second interconnects includes a third electrode interconnect and a fourth electrode interconnect connected to said program circuit; and
said semiconductor integrated circuit further includes:
- interconnect-separation switching elements each formed by a third electrode connected to said first electrode interconnect, a fourth electrode connected to said second electrode interconnect and formed of a metal having a different ionization tendency than the metal that forms said third electrode, and an electrolyte interposed between said third electrode and said fourth electrode; and
- interconnect-separation switching elements each formed by a fifth electrode connected to said third electrode interconnect, a sixth electrode connected to said fourth electrode interconnect and formed of a metal having a different ionization tendency than the metal that forms said fifth electrode, and an electrolyte interposed between said fifth electrode and said sixth electrode;

wherein said power-supply unit applies voltage to said interconnect-separation switching element; and
said measurement unit compares voltage applied to said interconnect-separation switching elements and a reference voltage that is to be applied to interconnect-separation switching elements of a prescribed state to supply a determination signal indicating whether the voltage is equal to or greater than the reference voltage.

16. A semiconductor integrated circuit according to claim 15, wherein:
said power-supply unit applies voltage to an interconnect-separation switching element for which resistance value is to be controlled;
said program circuit further includes a control unit that causes progressive increase of voltage applied by said power-supply unit until a determination signal supplied by said measurement unit indicates that the interconnect-separation switching element has attained a prescribed state and causes halting of application of voltage by said power-supply unit when the interconnect-separation switching element attains said prescribed state.

17. A semiconductor integrated circuit according to claim 15, wherein:
said power-supply unit is caused to apply voltage to an interconnect-separation switching element for which a resistance value is to be controlled; and
said program circuit further includes a control unit that causes said power-supply unit to intermittently apply voltage until a determination signal supplied by said measurement unit indicates that the interconnect-separation switching element has attained said prescribed state and causing halting of application of voltage by said power-supply unit when the interconnect-separation switching element attains a prescribed state.

18. A voltage application method carried out by a program circuit for applying voltage to a switching element formed of a first electrode and a second electrode formed of metals having mutually different ionization tendencies and an electrolyte interposed between the first electrode and the second electrode to thereby control a resistance value of the switching element; said voltage application method comprising:

applying voltage across said first electrode and second electrode;

measuring a parameter that changes in accordance with the resistance value of said switching element;

increasing voltage that is applied across said first electrode and second electrode until said measured parameter reaches a prescribed value; and halting application of voltage when the parameter reaches the prescribed value.

19. A voltage application method according to claim 18, further comprising applying intermittently voltage across said first electrode and second electrode while increasing the voltage.

20. A voltage application method according to claims 18, wherein:

the metal that forms said first electrode has a lower ionization tendency than the metal that forms said second electrode; and said prescribed value is a value indicating that said switching element has attained a prescribed conductive state; and said voltage application method further comprising applying voltage across said first electrode and second electrode such that the potential of said first electrode is lower than the potential of said second electrode.

21. A voltage application method according to claims 18, wherein:

said program circuit includes a reference time memory unit for storing a reference time;

the metal that forms said first electrode has a lower ionization tendency than the metal that forms said second electrode; and said prescribed value is a value indicating that said switching element has entered an isolated state;

said voltage application method further comprising:

applying across said first electrode and second electrode a voltage such that the potential of said first electrode is higher than the potential of said second electrode; and halting application of voltage upon the passage of a reference time stored in said reference time memory unit after said parameter has attained said prescribed value.

22. A voltage application method according to claims 18, wherein:

said switching element further includes a third electrode formed of a metal having higher ionization tendency than the metal that forms said first electrode;

the metal that forms said first electrode has a lower ionization tendency than the metal that forms said second electrode; and said prescribed value includes a first prescribed value indicating that said switching element has entered a first conductive state and a second prescribed value indicating that said switching element has entered a second conductive state having a lower resistance value than said first conductive state;

said voltage application method further comprising:

applying voltage across said first electrode and second electrode such that the potential of said first electrode is lower than the potential of said second electrode;

lowering voltage applied across said first electrode and second electrode when said parameter attains said first prescribed value, and then applying a voltage across said third electrode and said first electrode or second electrode such that the potential of said third electrode is higher than the potential of said first electrode and said second electrode; and halting application of voltage when said parameter attains said second prescribed value.

23. A voltage application method according to claims 18, wherein:

said program circuit includes a reference time memory unit for storing a reference time;

said switching element further includes a third electrode formed of a metal having a higher ionization tendency than the metal that forms said first electrode; and said prescribed value is a value indicating that said switching element has entered an isolated state;

said voltage application method further comprising:

applying a voltage across said third electrode and said first electrode or second electrode such that the potential of said third electrode is lower than the potential of said first electrode and second electrode; and halting application of voltage upon passage of a reference time stored in said reference time memory unit after said parameter attains said prescribed value.

24. A voltage application method according to claims 18, limiting the current value of current that flows in said switching element to no greater than a prescribed current value.

25. A voltage application method according to claims 18, wherein said program circuit includes a completion memory unit for storing a completion time;

said voltage application method further comprising halting application of voltage upon passage of a completion time stored in said completion memory unit after starting application of voltage.

26. A voltage application method carried out by a program circuit for applying a voltage to a switching element formed of a first electrode and a second electrode formed of metals having mutually different ionization tendencies and an electrolyte interposed between said first electrode and second electrode to thereby control a resistance value of the switching element; the voltage application method comprising:

applying voltage across said first electrode and second electrode;

measuring a parameter that changes in accordance with the resistance value of said switching element;

applying intermittently voltage across said first electrode and second electrode until said measured parameter reaches a prescribed value; and halting application of voltage when the parameter reaches the prescribed value.

27. A current application method carried out in a program circuit for applying current to a switching element formed of a first electrode and a second electrode formed of metals having mutually different ionization tendencies and an electrolyte interposed between said first electrode and second electrode to thereby control a resistance value of the switching element, said current application method comprising:

applying current across said first electrode and second electrode;

measuring a parameter that changes in accordance with the resistance value of said switching element;

increasing progressively current applied across said first electrode and second electrode until said measured parameter attains a prescribed value; and halting application of current when the parameter attains the prescribed value.

28. A current application method carried out by a program circuit for applying current to a switching element formed of a first electrode and a second electrode formed of metals having mutually different ionization tendencies and an electrolyte interposed between said first electrode and second electrode to thereby control a resistance value of the switching element, said current application method comprising:

applying current across said first electrode and second electrode;

measuring a parameter that changes in accordance with the resistance value of said switching element;

applying intermittently current across said first electrode and second electrode until the parameter measured by said measurement unit attains a prescribed value; and halting application of current when the parameter attains the prescribed value.

29. A comparison method carried out by a semiconductor integrated circuit that includes:

a plurality of first interconnects;

a plurality of second interconnects that intersect with each of said first interconnects;

switching elements each arranged at an intersection of each first interconnect and each second interconnect and formed of a first electrode connected to said first interconnect and a second electrode connected to said second interconnect and formed of a metal having a different ionization tendency than the metal that forms said first interconnect and an electrolyte interposed between said first electrode and said second electrode; and a program circuit for controlling the resistance value of said switching element;

said comparison method comprising:

applying voltage to each said first interconnect and each said second electrode;

comparing voltage applied to said switching element with a reference voltage that is to be applied to the switching element when said switching element has entered a prescribed state; and supplying a determination signal indicating whether the voltage is equal to or greater than the reference voltage.

30. A comparison method according to claim 29, further comprising:

applying voltage while increasing the voltage until said supplied determination signal indicates that said switching element has attained a prescribed state; and halting application of voltage when said switching element has attained the prescribed state.

31. A comparison method according to claim 29, further comprising:

applying intermittently voltage until said supplied determination signal indicates that said switching element has attained a prescribed state; and halting application of voltage when said switching element has attained a prescribed state.

32. A comparison method according to claim 29, wherein:

each first interconnect includes a first electrode interconnect and a second electrode interconnect connected to said program circuit;

each second interconnect includes a third electrode interconnect and a fourth electrode interconnect connected to said program circuit; and said semiconductor integrated circuit further includes:

an interconnect-separation switching element formed of a third electrode connected to said first electrode interconnect, a fourth electrode connected to said second electrode interconnect and formed of a metal having a different ionization tendency than the metal that forms said third electrode, and an electrolyte interposed between said third electrode and said fourth electrode; and an interconnect-separation switching element formed of a fifth electrode connected to said third electrode interconnect, a sixth electrode connected to said fourth electrode interconnect and formed of a metal having a different ionization tendency than the metal that forming said fifth electrode, and an electrolyte interposed between said fifth electrode and said sixth electrode;

said comparison method further comprising:

applying voltage to said interconnect-separation switching element;

comparing voltage applied to said interconnect-separation switching element and a reference voltage that should be applied to an interconnect-separation switching element of a prescribed state; and supplying a determination signal indicating whether the voltage is equal to or greater than the reference voltage.

33. A comparison method according to claim 32, further comprising:

applying a voltage to an interconnect-separation switching element for which a resistance value is to be controlled;

applying voltage while progressively increasing the voltage until said supplied determination signal indicates that the interconnect-separation switching element has attained a prescribed state; and halting application of voltage when the interconnect-separation switching element attains said prescribed state.

34. A comparison method according to claim 32, further comprising:

applying voltage to an interconnect-separation switching element for which resistance is to be controlled;

applying intermittently voltage until said supplied determination signal indicates that the interconnect-separation switching element has attained a prescribed state; and halting application of voltage when the interconnect-separation switching element attains said prescribed state.

* * * * *